(12) United States Patent
Shirai et al.

(10) Patent No.: US 11,942,421 B2
(45) Date of Patent: Mar. 26, 2024

(54) SEMICONDUCTOR MEMORY DEVICE

(71) Applicant: Kioxia Corporation, Tokyo (JP)

(72) Inventors: Kaito Shirai, Nagoya (JP); Hanae Ishihara, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/880,375

(22) Filed: Aug. 3, 2022

(65) Prior Publication Data

US 2022/0375855 A1 Nov. 24, 2022

Related U.S. Application Data

(62) Division of application No. 17/007,230, filed on Aug. 31, 2020, now Pat. No. 11,444,022.

(30) Foreign Application Priority Data

Mar. 16, 2020 (JP) .................. 2020-045861

(51) Int. Cl.
| | |
|---|---|
| *H01L 23/528* | (2006.01) |
| *H01L 23/522* | (2006.01) |
| *H10B 43/27* | (2023.01) |
| *H10B 43/40* | (2023.01) |
| *H10B 43/35* | (2023.01) |

(52) U.S. Cl.
CPC ........ *H01L 23/5226* (2013.01); *H01L 23/528* (2013.01); *H10B 43/27* (2023.02); *H10B 43/35* (2023.02); *H10B 43/40* (2023.02)

(58) Field of Classification Search
CPC ............ H01L 23/5226; H01L 23/528; H01L 25/0657; H01L 25/18; H01L 43/35; H01L 2224/04042; H01L 2224/32145; H01L 2224/32225; H01L 2224/48145; H01L 2224/48227; H01L 2224/49175; H01L 2224/73265; H01L 2225/06506; H01L 2225/0651; H10B 43/27; H10B 43/40
See application file for complete search history.

(56) References Cited

U.S. PATENT DOCUMENTS

| | | | |
|---|---|---|---|
| 10,381,373 B2 | 8/2019 | Okizumi et al. | |
| 2013/0130495 A1* | 5/2013 | Higashitani | ............ H01L 28/88 |
| | | | 438/630 |
| 2017/0179026 A1* | 6/2017 | Toyama | ................. H10B 41/41 |

(Continued)

*Primary Examiner* — Galina G Yushina
(74) *Attorney, Agent, or Firm* — Oblon, McClelland, Maier & Neustadt, L.L.P.

(57) ABSTRACT

A semiconductor memory device includes a semiconductor substrate, a memory cell array, and first and second wirings. The semiconductor substrate includes first region to third region and fourth region to sixth region. The memory cell array includes first conducting layers extending in a second direction from the first region to the third region and laminated in a first direction, first and second semiconductor layers disposed in the first and third regions, extending in the first direction, and opposed to the first conducting layers, first and second contacts disposed in the fourth and sixth regions and extending in the first direction, and a third semiconductor layer disposed in the fifth region and extending in the first direction. The first wiring is connected to the first semiconductor layer and the second contact. The second wiring is connected to the second semiconductor layer and the third contact.

3 Claims, 60 Drawing Sheets

(56) References Cited

U.S. PATENT DOCUMENTS

| | | |
|---|---|---|
| 2019/0057974 A1* | 2/2019 | Lu ..................... H01L 23/5226 |
| 2019/0067314 A1 | 2/2019 | Lu |
| 2019/0081053 A1 | 3/2019 | Nojima |
| 2019/0198524 A1 | 6/2019 | Fujiki et al. |
| 2019/0371812 A1* | 12/2019 | Oike ................... H01L 29/4234 |
| 2019/0371813 A1 | 12/2019 | Oike |

* cited by examiner

SEMICONDUCTOR MEMORY DEVICE

CROSS-REFERENCE TO RELATED APPLICATIONS

This application is a divisional of and claims benefit under 35 U.S.C. § 120 to U.S. application Ser. No. 17/007,230, filed Aug. 31, 2020, which is based upon and claims the benefit of priority under 35 U.S.C. § 119 to Japanese Patent Application No. 2020-045861, filed on Mar. 16, 2020, the entire contents of each of which are incorporated herein by reference.

BACKGROUND

Field

Embodiments described herein relate generally to a semiconductor memory device.

Description of the Related Art

There has been known a semiconductor memory device that includes a semiconductor substrate, a memory cell array layer disposed separately from the semiconductor substrate in a first direction intersecting with a surface of the semiconductor substrate, and a first wiring layer disposed separately from the memory cell array layer in the first direction and having a distance from the semiconductor substrate larger than that of the memory cell array layer.

DETAILED DESCRIPTION

Figure 1:
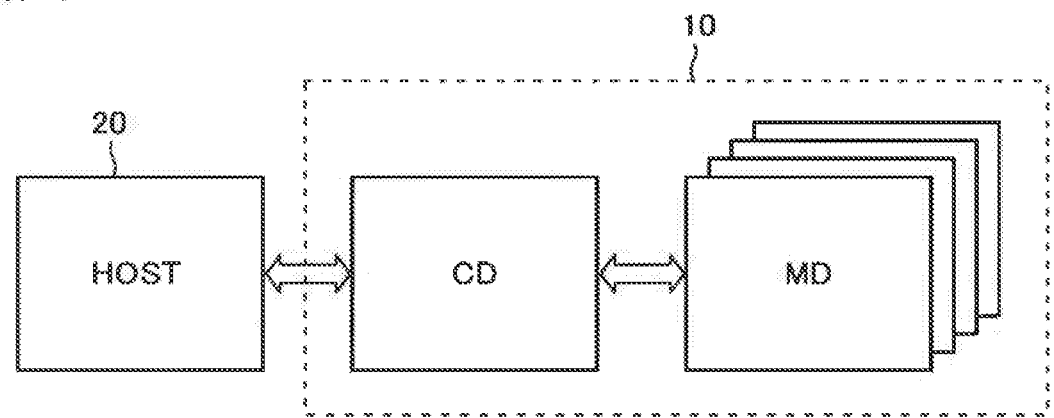
FIG. 1 is a schematic block diagram illustrating a configuration of a memory system 10 according to a first embodiment.

A semiconductor memory device according to one embodiment includes: a semiconductor substrate; a memory cell array disposed separately from the semiconductor substrate in a first direction intersecting with a surface of the semiconductor substrate; and first and second wirings disposed in the first direction of the memory cell array, the first and second wirings having a distance from the semiconductor substrate larger than a distance of the memory cell array from the semiconductor substrate. The semiconductor substrate includes a first region to a third region arranged in order in a second direction intersecting with the first direction and a fourth region to a sixth region arranged in order in the second direction. In a third direction intersecting with the first direction and the second direction: the fourth region is adjacent to the first region; the fifth region is adjacent to the second region; and the sixth region is adjacent to the third region. The memory cell array includes: a plurality of first conducting layers extending in the second direction from the first region to the third region via the second region, the plurality of first conducting layers being laminated in the first direction together with a plurality of first insulating layers in alternation; a plurality of second insulating layers extending in the second direction from the fourth region to the sixth region via the fifth region, the plurality of second insulating layers being laminated in the first direction together with the plurality of first insulating layers in alternation; a first semiconductor layer disposed in the first region, the first semiconductor layer extending in the first direction and being opposed to the plurality of first conducting layers; a second semiconductor layer disposed in the third region, the second semiconductor layer extending in the first direction and being opposed to the plurality of first conducting layers; a first contact disposed in the fourth region, the first contact extending in the first direction and being opposed to the plurality of second insulating layers; a third semiconductor layer disposed in the fifth region, the third semiconductor layer extending in the first direction and being opposed to the plurality of second insulating layers; and a second contact disposed in the sixth region, the second contact extending in the first direction and being opposed to the plurality of second insulating layers. The first wiring extends in the third direction in the first region and the fourth region. The first wiring is electrically connected to the first semiconductor layer and connected to the first contact. The second wiring extends in the third direction in the third region and the sixth region. The second wiring is electrically connected to the second semiconductor layer and connected to the second contact.

A semiconductor memory device according to one embodiment includes: a semiconductor substrate; a memory cell array disposed separately from the semiconductor substrate in a first direction intersecting with a surface of the semiconductor substrate; and first and second wirings disposed in the first direction of the memory cell array, the first and second wirings having a distance from the semiconductor substrate larger than a distance of the memory cell array from the semiconductor substrate. The semiconductor substrate includes a first region to a third region arranged in order in a second direction intersecting with the first direction and a fourth region to a sixth region arranged in order in the second direction. In a third direction intersecting with the first direction and the second direction: the fourth region is adjacent to the first region; the fifth region is adjacent to the second region; and the sixth region is adjacent to the third region. The memory cell array includes: a plurality of first conducting layers extending in the second direction from the first region to the third region via the second region, the plurality of first conducting layers being laminated in the first direction together with a plurality of first insulating layers in alternation; a plurality of second insulating layers disposed in the fourth region and the sixth region, the plurality of second insulating layers being laminated in the first direction together with the plurality of first insulating layers in alternation; a plurality of third conducting layers disposed in the fifth region, the plurality of third conducting layers being laminated in the first direction together with the plurality of first insulating layers in alternation; a first semiconductor layer disposed in the first region, the first semiconductor layer extending in the first direction and being opposed to the plurality of first conducting layers; a second semiconductor layer disposed in the third region, the second semiconductor layer extending in the first direction and being opposed to the plurality of first conducting layers; a first contact disposed in the fourth region, the first contact extending in the first direction and being opposed to the plurality of second insulating layers; a third semiconductor layer disposed in the fifth region, the third semiconductor layer extending in the first direction and being opposed to the plurality of third conducting layers; and a second contact disposed in the sixth region, the second contact extending in the first direction and being opposed to the plurality of second insulating layers. The first wiring extends in the third direction in the first region and the fourth region. The first wiring is electrically connected to the first semiconductor layer and connected to the first contact. The second wiring extends in the third direction in the third region and the sixth region. The second wiring is electrically connected to the second semiconductor layer and connected to the second contact.

A semiconductor memory device according to one embodiment includes: a semiconductor substrate; a memory cell array disposed separately from the semiconductor substrate in a first direction intersecting with a surface of the semiconductor substrate; first and second wirings disposed in the first direction of the memory cell array, the first and second wirings having a distance from the semiconductor substrate larger than a distance of the memory cell array from the semiconductor substrate; and a fifth wiring disposed separately from the memory cell array in the first direction, the fifth wiring having a distance from the semiconductor substrate smaller than a distance of the memory cell array from the semiconductor substrate. The semiconductor substrate includes a first region to a third region arranged in order in a second direction intersecting with the first direction and a fourth region to a sixth region arranged in order in the second direction. In a third direction intersecting with the first direction and the second direction: the fourth region is adjacent to the first region; the fifth region is adjacent to the second region; and the sixth region is adjacent to the third region. The memory cell array includes: a plurality of first conducting layers extending in the second direction from the first region to the third region via the second region, the plurality of first conducting layers being laminated in the first direction together with a plurality of first insulating layers in alternation; a plurality of second insulating layers extending in the second direction from the fourth region to the sixth region via the fifth region, the plurality of second insulating layers being laminated in the first direction together with the plurality of first insulating layers in alternation; a first semiconductor layer disposed in the first region, the first semiconductor layer extending in the first direction and being opposed to the plurality of first conducting layers; a second semiconductor layer disposed in the third region, the second semiconductor layer extending in the first direction and being opposed to the plurality of first conducting layers; a first contact disposed in the fourth region, the first contact extending in the first direction and being opposed to the plurality of second insulating layers; a second contact disposed in the sixth region, the second contact extending in the first direction and being opposed to the plurality of second insulating layers; and a second conducting layer disposed between the plurality of first conducting layers and the semiconductor substrate, the second conducting layer including a first part and a second part. The first part of the second conducting layer extends in the second direction from the first region to the third region via the second region. The first part is connected to the first semiconductor layer in the first region and connected to the second semiconductor layer in the third region. The second part of the second conducting layer extends from the second region to the fifth region. The first wiring extends in the third direction in the first region and the fourth region. The first wiring is electrically connected to the first semiconductor layer and connected to the first contact. The second wiring extends in the third direction in the third region and the sixth region. The second wiring is electrically connected to the second semiconductor layer and connected to the second contact. The fifth wiring electrically connects the second part of the second conducting layer to the semiconductor substrate.

Next, the semiconductor memory device according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to "semiconductor memory device," it may mean a memory die and may mean a memory system including a control die, such as a memory chip, a memory card, and an SSD. Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

In this specification, a predetermined direction parallel to an upper surface of the substrate is referred to as an X direction, a direction parallel to the upper surface of the substrate and perpendicular to the X direction is referred to as a Y direction, and a direction perpendicular to the upper surface of the substrate is referred to as a Z direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may correspond to any of the X direction, the Y direction, and the Z direction and need not to correspond to these directions.

Expressions, such as "above" and "below," in this specification are based on the substrate. For example, a direction away from the substrate along the Z direction is referred to as above and a direction approaching the substrate along the Z direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X direction or the Y direction is referred to as a side surface and the like.

In this specification, when referring to a "width" or a "thickness" in a predetermined direction of a configuration, a member, or the like, this may mean a width or a thickness in a cross-sectional surface or the like observed with a Scanning electron microscopy (SEM), a Transmission electron microscopy (TEM), or the like.

First Embodiment

[Memory System 10]

FIG. 1 is a schematic block diagram illustrating a configuration of the memory system 10 according to the first embodiment.

The memory system 10, for example, reads, writes, and erases user data in response to a signal transmitted from a host computer 20. The memory system 10 is, for example, any system that can store the user data including a memory chip, a memory card, and an SSD. The memory system 10 includes a plurality of memory dies MD that store the user data and a control die CD connected to the plurality of memory dies MD and to the host computer 20. The control die CD includes, for example, a processor, a RAM, and the like, and performs conversion between a logical address and a physical address, bit error detection/correction, a garbage collection (compaction), a wear leveling, and the like.

Figure 2:
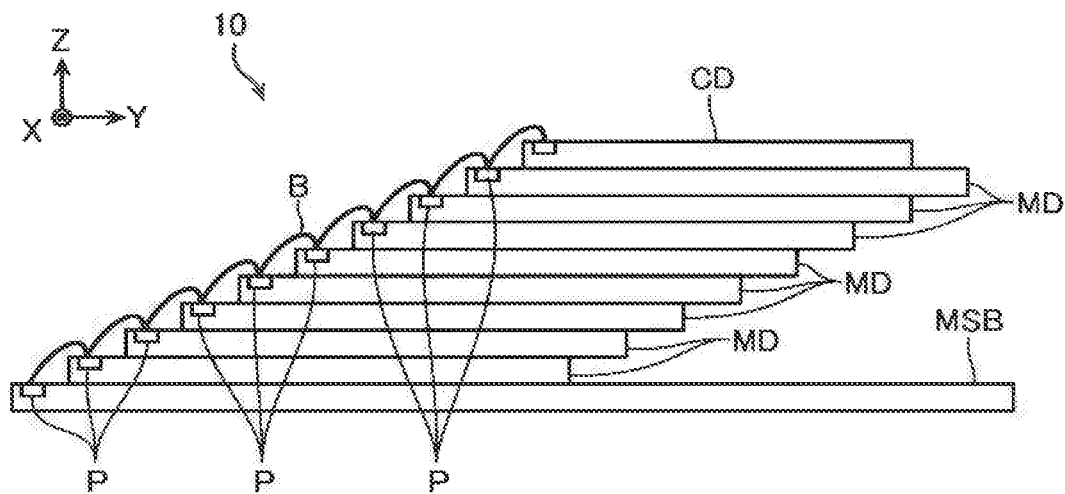
FIG. 2 is a schematic side view illustrating an exemplary configuration of the memory system 10.
Figure 3:
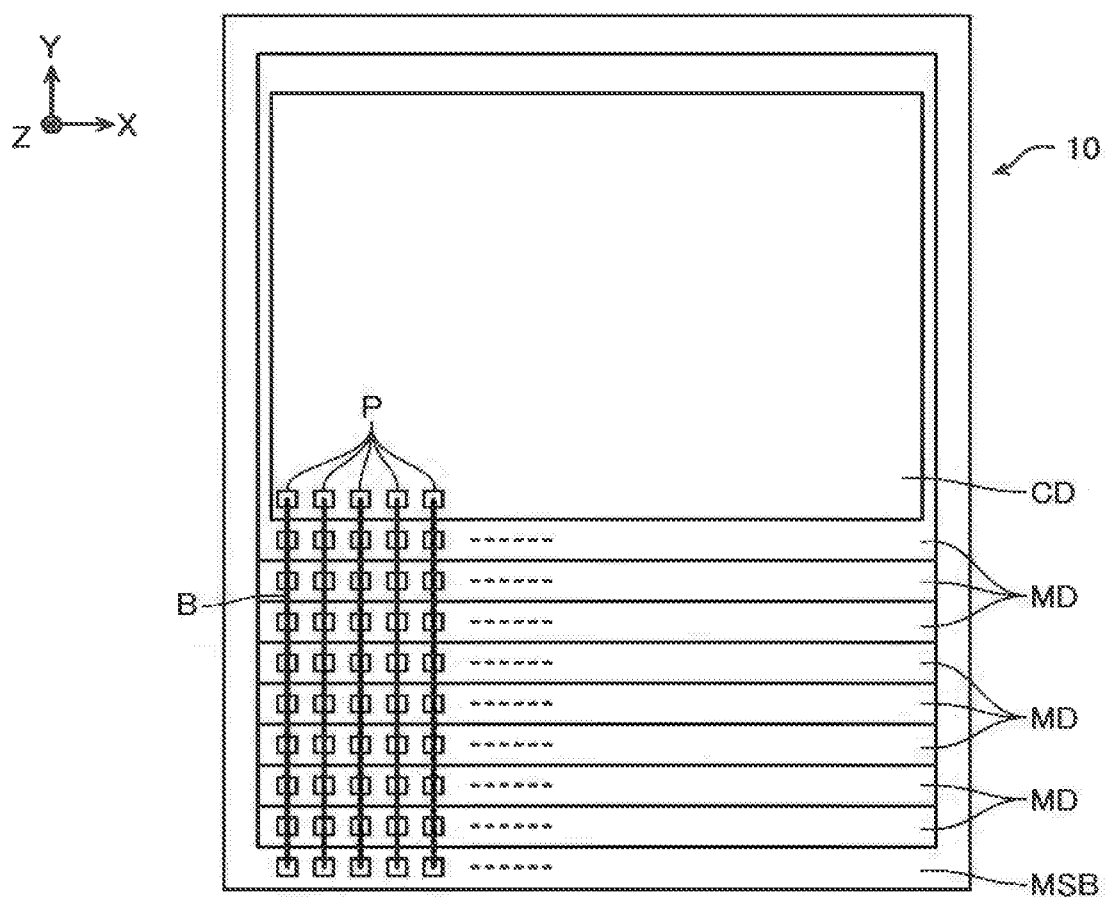
FIG. 3 is a schematic plan view illustrating the exemplary configuration.

FIG. 2 is a schematic side view illustrating an exemplary configuration of the memory system 10 according to the embodiment. FIG. 3 is a schematic plan view illustrating the exemplary configuration. For convenience of description, FIG. 2 and FIG. 3 omit a part of a configuration.

As illustrated in FIG. 2, the memory system 10 according to the embodiment includes a mounting substrate MSB, the plurality of memory dies MD laminated on the mounting substrate MSB, and the control die CD laminated on the memory die MD. On an upper surface of the mounting substrate MSB, a pad electrode P is disposed in a region at an end portion in the Y direction, and a part of the other region is bonded to a lower surface of the memory die MD via an adhesive and the like. On an upper surface of the memory die MD, the pad electrode P is disposed in a region at an end portion in the Y direction, and the other region is bonded to a lower surface of another memory die MD or the control die CD via the adhesive and the like. On an upper surface of the control die CD, the pad electrode P is disposed in a region at an end portion in the Y direction.

As illustrated in FIG. 3, the mounting substrate MSB, the plurality of memory dies MD, and the control die CD each include a plurality of the pad electrodes P arranged in an X direction. The plurality of pad electrodes P disposed to each of the mounting substrate MSB, the plurality of memory dies MD, and the control die CD are mutually connected via bonding wires B.

Note that the configurations illustrated in FIG. 2 and FIG. 3 are merely examples, and specific configurations are appropriately adjustable. For example, in the example illustrated in FIG. 2 and FIG. 3, the control die CD is laminated on the plurality of memory dies MD, and these configurations are connected with the bonding wires B. In such a configuration, the plurality of memory dies MD and the control die CD are included in one package. However, the control die CD may be included in a package different from the memory die MD. Additionally, the plurality of memory dies MD and the control die CD may be connected to one another via through electrodes or the like, not the bonding wires B.

[Circuit Configuration of Memory Die MD]

Figure 4:
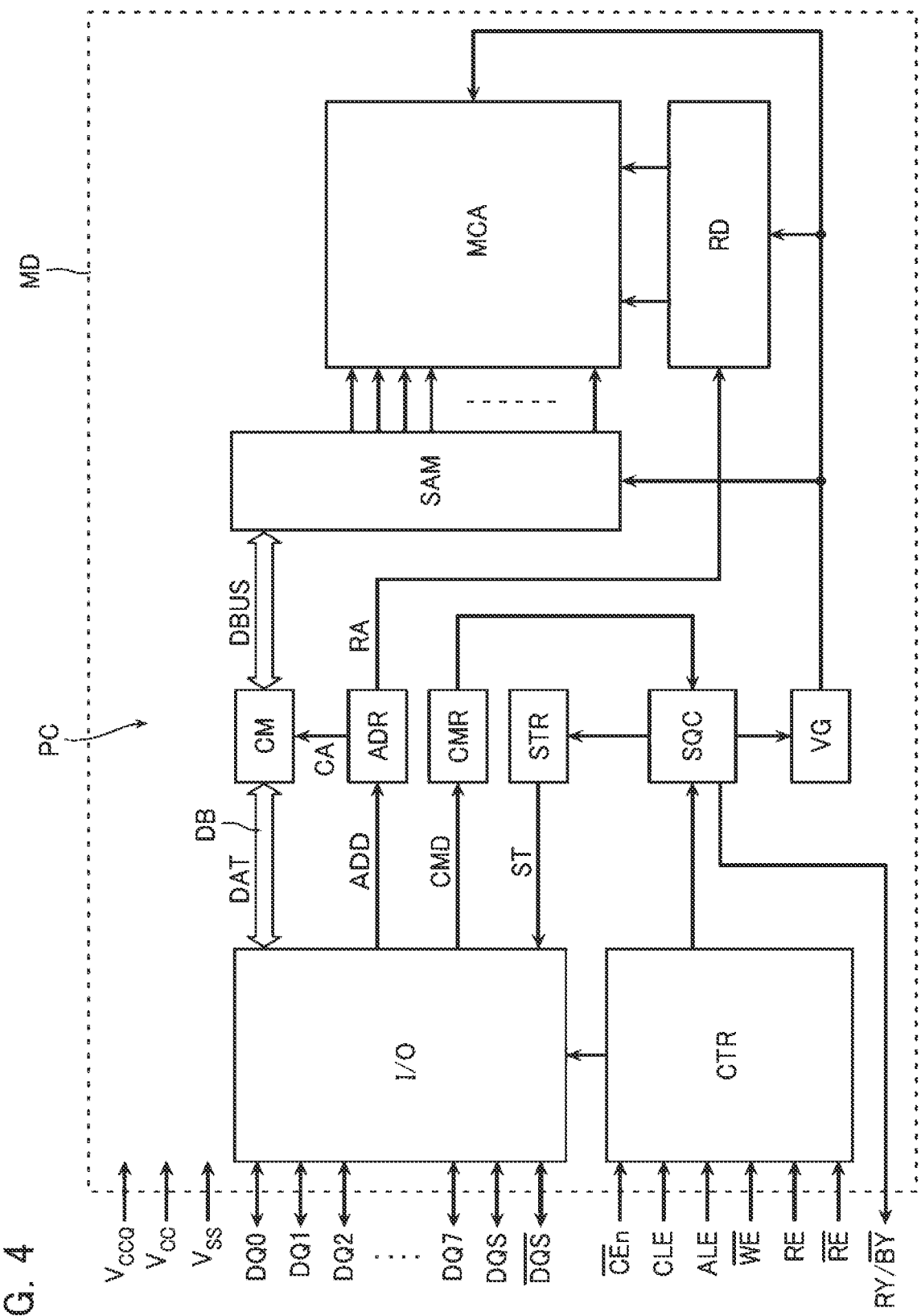
FIG. 4 is a schematic block diagram illustrating a configuration of a memory die MD according to a first embodiment.
Figure 5:
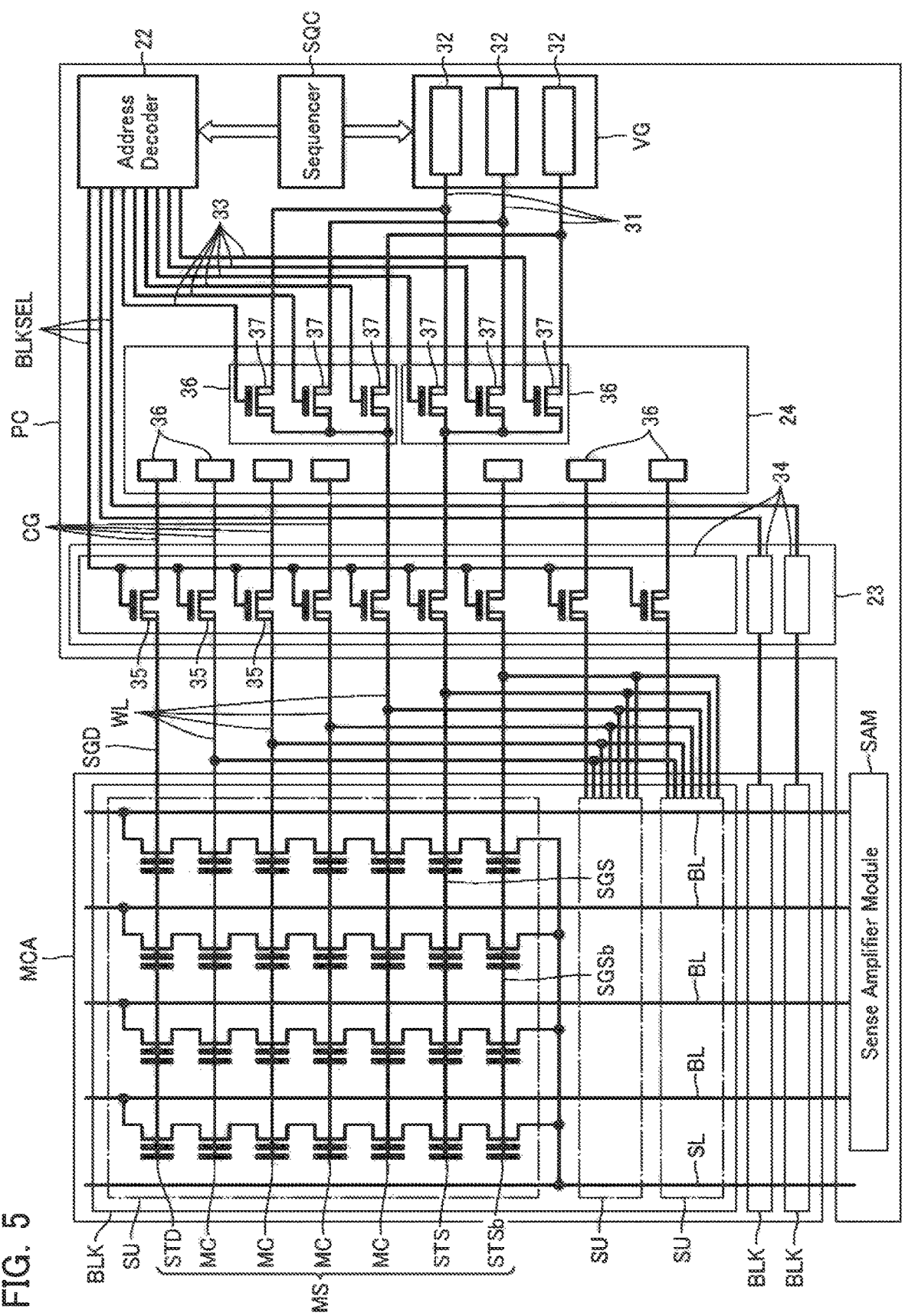
FIG. 5 is a schematic circuit diagram illustrating a configuration of a part of the memory die MD.

FIG. 4 is a schematic block diagram illustrating a configuration of the memory die MD according to the first embodiment. FIG. 5 is a schematic circuit diagram illustrating a configuration of a part of the memory die MD.

As illustrated in FIG. 4, the memory die MD includes a memory cell array MCA that stores data and a peripheral circuit PC connected to the memory cell array MCA. The peripheral circuit PC includes a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

[Memory Cell Array MCA]

The memory cell array MCA includes a plurality of memory blocks BLK as illustrated in FIG. 5. The plurality of memory blocks BLK each include a plurality of string units SU. The plurality of string units SU each include a plurality of memory strings MS. The plurality of memory strings MS have one ends each connected to the peripheral circuit PC via a bit line BL. The plurality of memory strings MS have other ends each connected to the peripheral circuit PC via a common source line SL.

The memory string MS includes a drain-side select transistor STD, a plurality of memory cells MC (memory transistors), a source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, STSb).

The memory cell MC is a field-effect type transistor including a semiconductor layer that functions as a channel region, a gate insulating film including an electric charge accumulating film, and a gate electrode. The memory cell MC has a threshold voltage that changes according to an electric charge amount in the electric charge accumulating film. The memory cell MC stores one bit or a plurality of bits of data. Word lines WL are connected to respective gate electrodes of the plurality of memory cells MC corresponding to one memory string MS. These respective word lines WL are connected to all of the memory strings MS in one memory block BLK in common.

The select transistor (STD, STS, STSb) is a field-effect type transistor including a semiconductor layer that functions as a channel region, a gate insulating film, and a gate electrode. Select gate lines (SGD, SGS, SGSb) are connected to the respective gate electrodes of the select transistors (STD, STS, STSb). The drain side select gate line SGD is disposed corresponding to the string unit SU and connected to all of the memory strings MS in one string unit SU in common. The source side select gate line SGS is connected to all of the memory strings MS in the plurality of string units SU in common. The source side select gate line SGSb is connected to all of the memory strings MS in the plurality of string units SU in common.

[Voltage Generation Circuit VG]

For example, as illustrated in FIG. 5, the voltage generation circuit VG (FIG. 4) is connected to a plurality of voltage supply lines 31. The voltage generation circuit VG includes, for example, a step down circuit, such as a regulator, and a step up circuit, such as a charge pump circuit 32. These step down circuit and step up circuit are each connected to a voltage supply line to which a power supply voltage $V_{CC}$ and a ground voltage $V_{SS}$ (FIG. 4) are supplied. These voltage supply lines are connected to, for example, the pad electrodes P described with reference to FIG. 2 and FIG. 3. For example, the voltage generation circuit VG generates a plurality of patterns of operating voltages applied to the bit line BL, the source line SL, the word line WL, and the select gate line (SGD, SGS, SGSb) in a read operation, a write operation, and an erase operation on the memory cell array MCA, in accordance with a control signal from the sequencer SQC to simultaneously output the operating voltages to the plurality of voltage supply lines 31. The operating voltage output from the voltage supply line 31 is appropriately adjusted in accordance with the control signal from the sequencer SQC.

[Row Decoder RD]

The row decoder RD (FIG. 4) includes, for example, as illustrated in FIG. 5, an address decoder 22 that decodes address data ADD and a block select circuit 23 and a voltage select circuit 24 that transfer the operating voltage to the memory cell array MCA in response to an output signal from the address decoder 22.

The address decoder 22 includes a plurality of block select lines BLKSEL and a plurality of voltage select lines 33. For example, the address decoder 22 sequentially refers to a row address RA in the address register ADR (FIG. 4) in response to the control signal from the sequencer SQC, decodes this row address RA to cause predetermined block select transistor 35 and voltage select transistor 37 corresponding to the row address RA to be in a state of ON, and cause the block select transistors 35 and the voltage select transistors 37 other than the above to be in a state of OFF. For example, voltages of the predetermined block select line BLKSEL and voltage select line 33 are set to be in a state of "H" and voltages other than those are set to be in a state of "L." When a P channel type transistor is used, not an N channel type transistor, an inverse voltage is applied to these wirings.

In the illustrated example, in the address decoder 22, one block select line BLKSEL is disposed per memory block BLK. However, this configuration is appropriately changeable. For example, one block select line BLKSEL may be included in per two or more memory blocks BLK.

The block select circuit 23 includes a plurality of block selectors 34 corresponding to the memory blocks BLK. The plurality of block selectors 34 each include a plurality of block select transistors 35 corresponding to the word lines WL and the select gate lines (SGD, SGS, SGSb). The block select transistor 35 is, for example, a field-effect type high voltage transistor. The block select transistors 35 have drain electrodes, source electrodes, and gate electrodes. The drain electrodes are each electrically connected to the corresponding word line WL or select gate line (SGD, SGS, SGSb). The source electrodes are each electrically connected to the voltage supply line 31 via a wiring CG and the voltage select circuit 24. The gate electrodes are commonly connected to the corresponding block select line BLKSEL.

Note that the block select circuit 23 further includes a plurality of transistors (not illustrated). The plurality of transistors are field-effect type high voltage transistors connected between the select gate lines (SGD, SGS, SGSb) and the voltage supply lines to which the ground voltage $V_{SS}$ is supplied. The plurality of transistors supply the select gate lines (SGD, SGS, SGSb) included in the non-selected memory blocks BLK with the ground voltage $V_{SS}$. Note that the plurality of word lines WL included in the non-selected memory blocks BLK enter a floating state.

The voltage select circuit 24 includes a plurality of voltage selectors 36 corresponding to the word lines WL and the select gate lines (SGD, SGS, SGSb). The plurality of voltage selectors 36 each include a plurality of voltage select transistors 37. The voltage select transistor 37 is, for example, a field-effect type high voltage transistor. The voltage select transistors 37 have drain electrodes, source electrodes, and gate electrodes. The drain electrodes are each electrically connected to the corresponding word line WL or the select gate line (SGD, SGS, SGSb) via the wiring CG and the block select circuit 23. The source electrodes are each electrically connected to the corresponding voltage supply line 31. The gate electrodes are each connected to the corresponding voltage select line 33.

[Sense Amplifier Module SAM]

The sense amplifier module SAM (FIG. 4) includes a plurality of sense amplifier circuits corresponding to the plurality of bit lines BL, a plurality of voltage adjustment circuits, and a plurality of data latches. The sense amplifier circuit causes the data latch to latch data of "H" or "L" indicative of ON/OFF of the memory cell MC according to a current or a voltage of the bit line BL. The voltage adjustment circuit electrically conducts the bit line BL with the corresponding voltage supply line according to the data latched by the data latch and transfers data DAT corresponding to read data or write data.

[Cache Memory CM]

The cache memory CM (FIG. 4) is interposed between the sense amplifier module SAM and the input/output control circuit I/O. To the cache memory CM, a decode circuit and a switch circuit (not illustrated) are connected. The decode circuit decodes a column address CA held in the address register ADR (FIG. 4). The switch circuit electrically conducts the latch circuit corresponding to the column address CA with a bus DB (FIG. 4) in response to an output signal from the decode circuit.

[Sequencer SQC]

The sequencer SQC (FIG. 4) sequentially decodes command data CMD held in the command register CMR and outputs an internal control signal to the row decoder RD, the sense amplifier module SAM, and the voltage generation circuit VG. The sequencer SQC outputs status data indicating its own state to the status register STR as necessary. The sequencer SQC generates a ready/busy signal and outputs the ready/busy signal to a terminal RY//BY. The terminal RY//BY is achieved by, for example, the pad electrode P described with reference to FIG. 2 and FIG. 3.

[Input/Output Control Circuit I/O]

The input/output control circuit I/O includes data signal input/output terminals DQ0 to DQ7, clock signal input/output terminals DQS, /DQS, an input circuit, such as a comparator, and an output circuit, such as an OCD circuit. The input circuit and the output circuit are connected to the data signal input/output terminals DQ0 to DQ7. The input/output control circuit I/O includes a shift register and a buffer circuit connected to the input circuit and the output circuit. The input circuit, the output circuit, the shift register, and the buffer circuit are each connected to a terminal to which a power supply voltage $V_{CCQ}$ and the ground voltage $V_{SS}$ are supplied. The data signal input/output terminals DQ0 to DQ7, the clock signal input/output terminals DQS, /DQS, and the terminals to which the power supply voltage $V_{CCQ}$ is supplied are achieved by, for example, the pad electrodes P described with reference to FIG. 2 and FIG. 3. Data input via the data signal input/output terminals DQ0 to DQ7 are output from the buffer circuit to the cache memory CM, the address register ADR, or the command register CMR in response to an internal control signal from the logic circuit CTR. Data output via the data signal input/output terminals DQ0 to DQ7 are input to the buffer circuit from the cache memory CM or the status register STR in response to the internal control signal from the logic circuit CTR.

[Logic Circuit CTR]

The logic circuit CTR (FIG. 4) receives an external control signal from the control die CD via external control terminals /CEn, CLE, ALE, /WE, RE, /RE and outputs the internal control signal to the input/output control circuit I/O in response to the external control signal. The external control terminals /CEn, CLE, ALE, /WE, RE, /RE are achieved by, for example, the pad electrodes P described with reference to FIG. 2 and FIG. 3.

[Structure of Memory Die MD]

Figure 6:
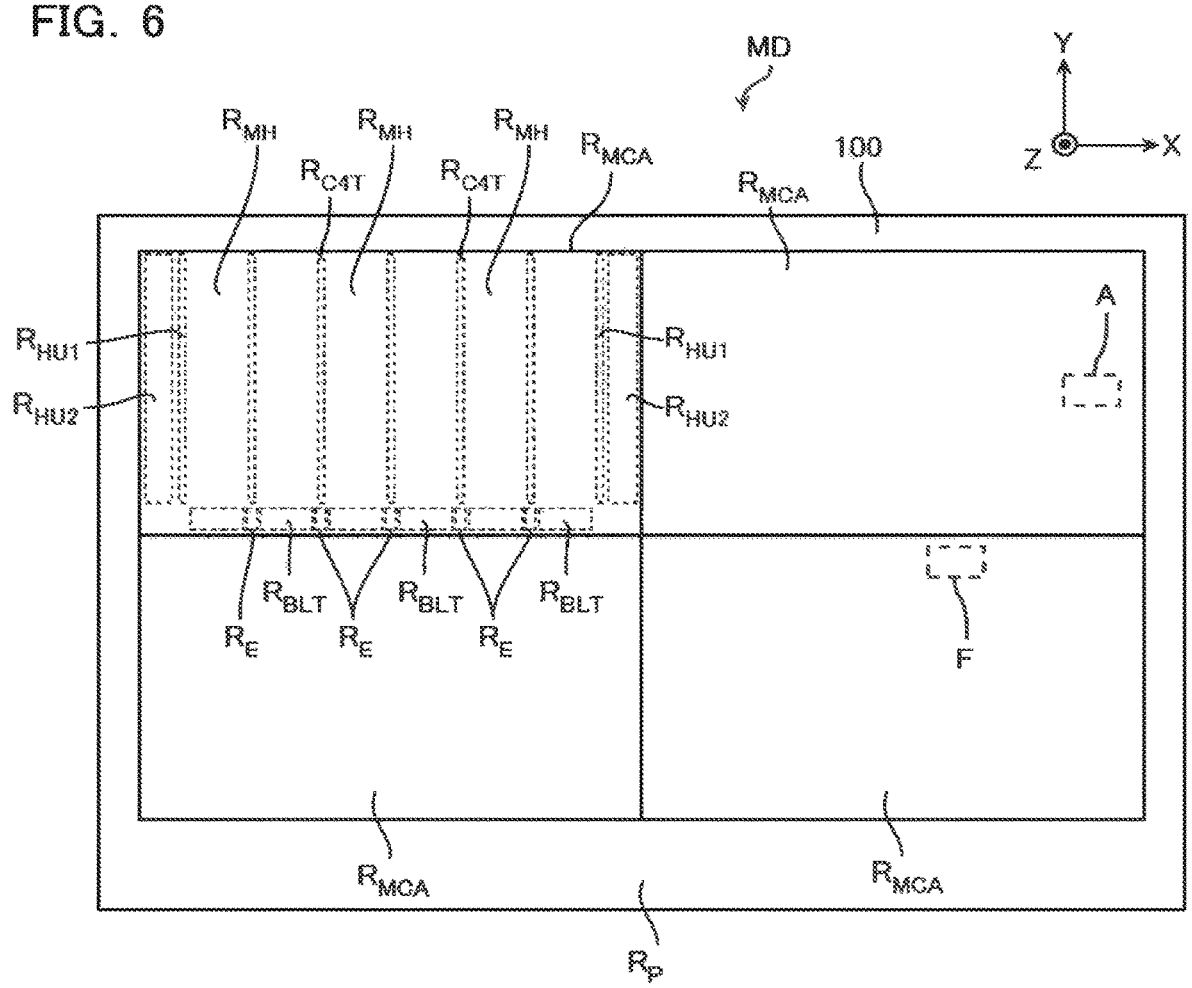
FIG. 6 is a schematic plan view of the memory die MD.
Figure 7:
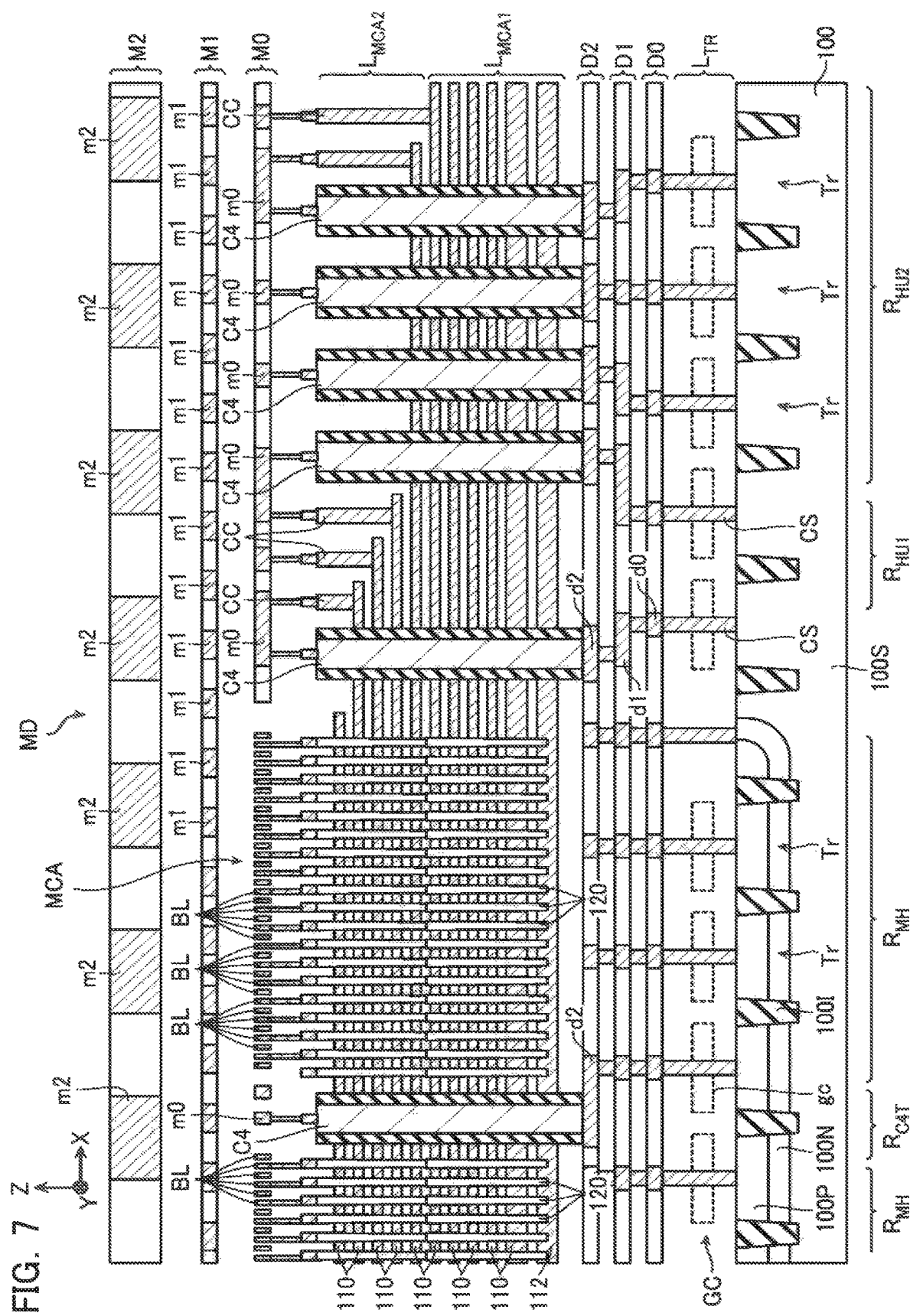
FIG. 7 is a schematic cross-sectional view of the memory die MD.
Figure 8:
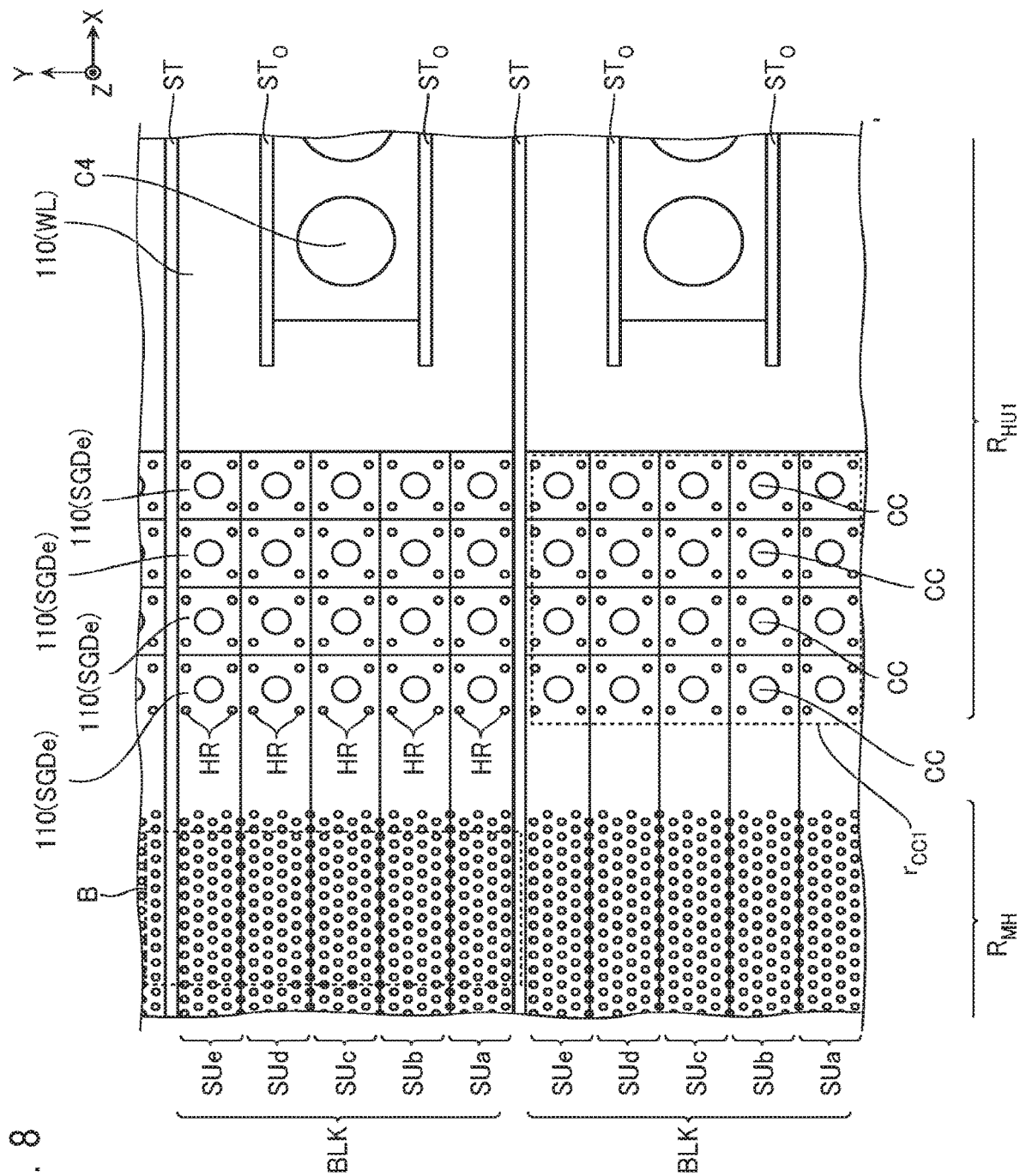
FIG. 8 is a schematic enlarged view of a part indicated by A in FIG. 6.
Figure 9:
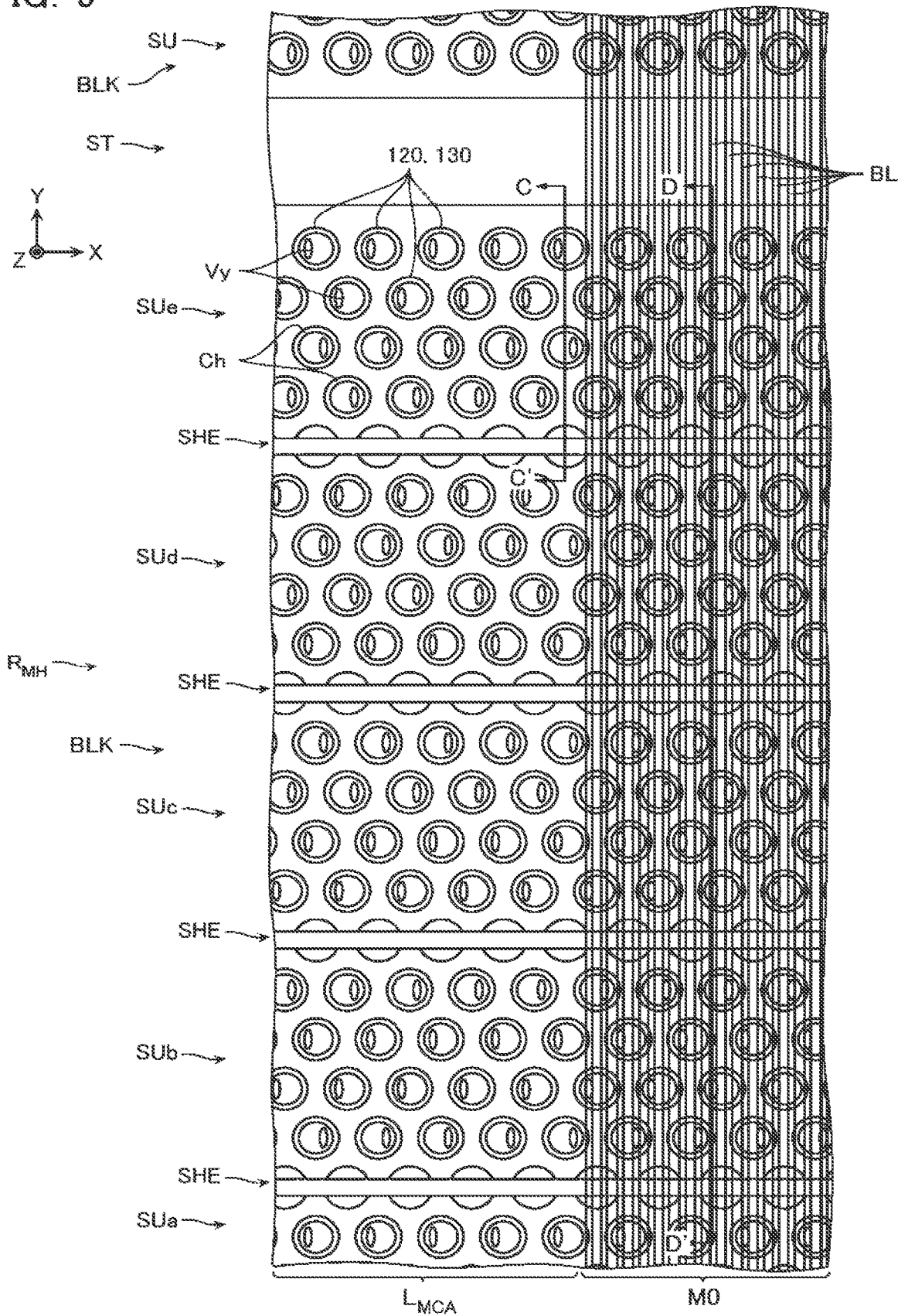
FIG. 9 is a schematic enlarged view of a part indicated by B in FIG. 8.
Figure 10:
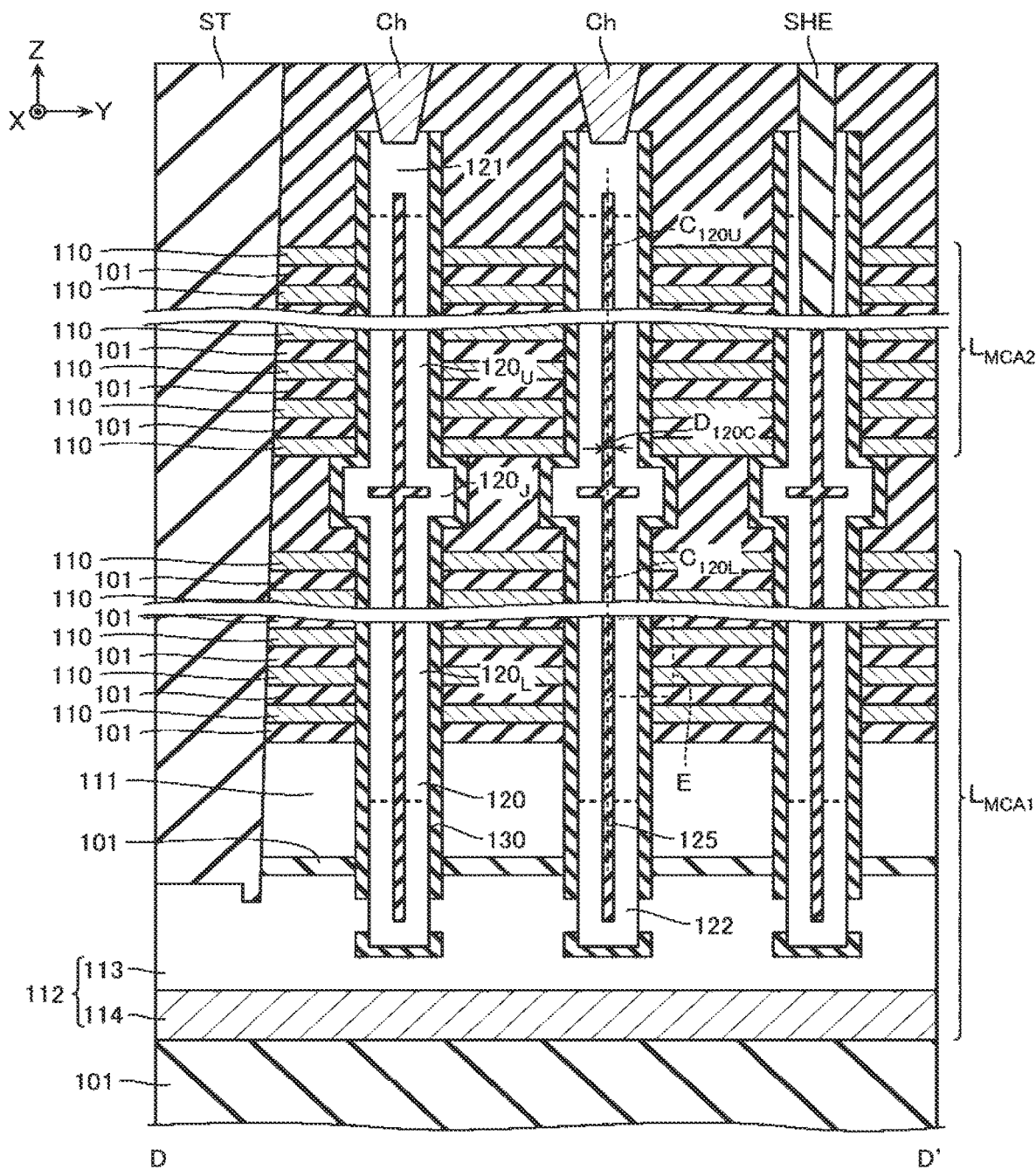
FIG. 10 is a schematic cross-sectional view taking the structure illustrated in FIG. 9 along the line C-C' and viewed along the arrow direction.
Figure 11:
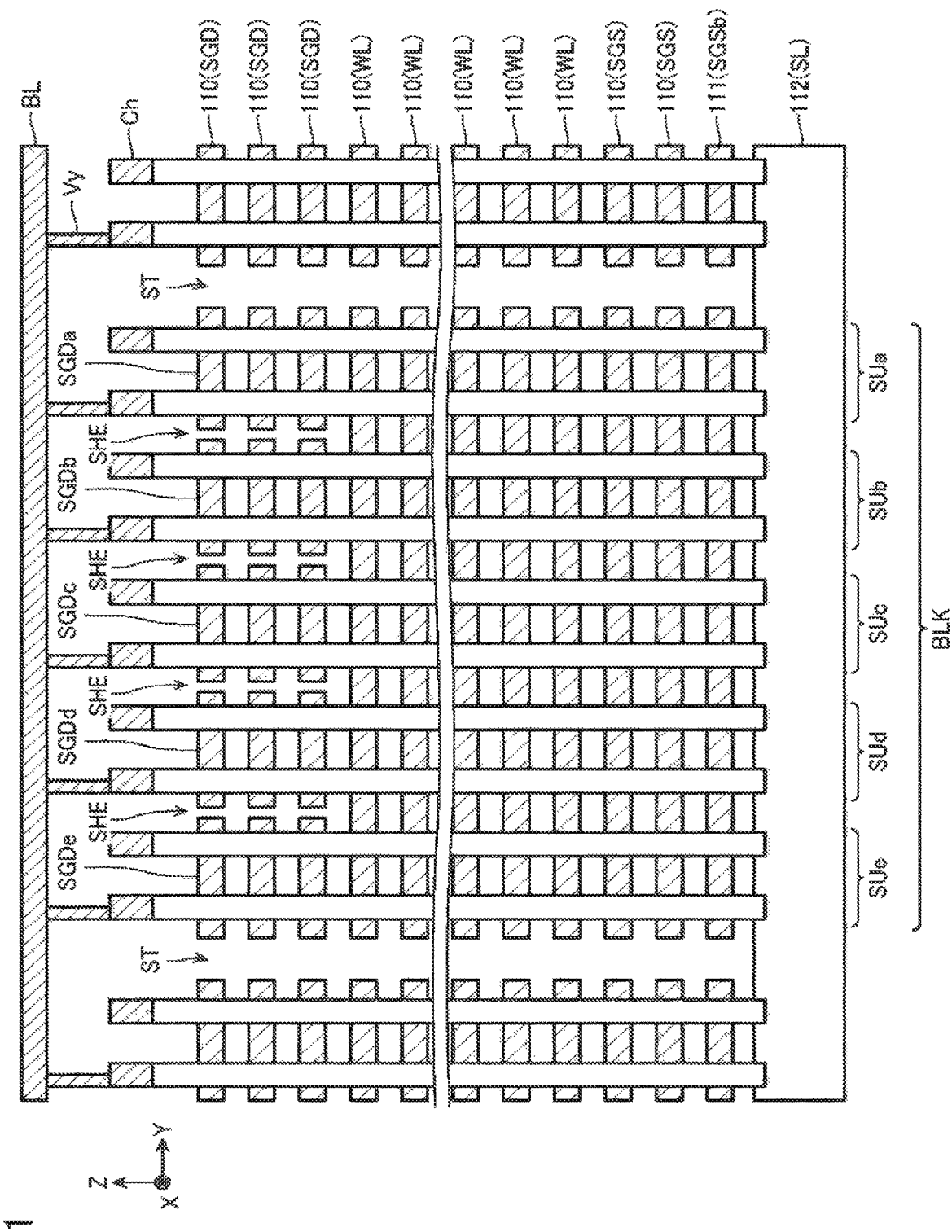
FIG. 11 is a schematic cross-sectional view taking the structure illustrated in FIG. 9 along the line D-D' and viewed along the arrow direction.
Figure 12:
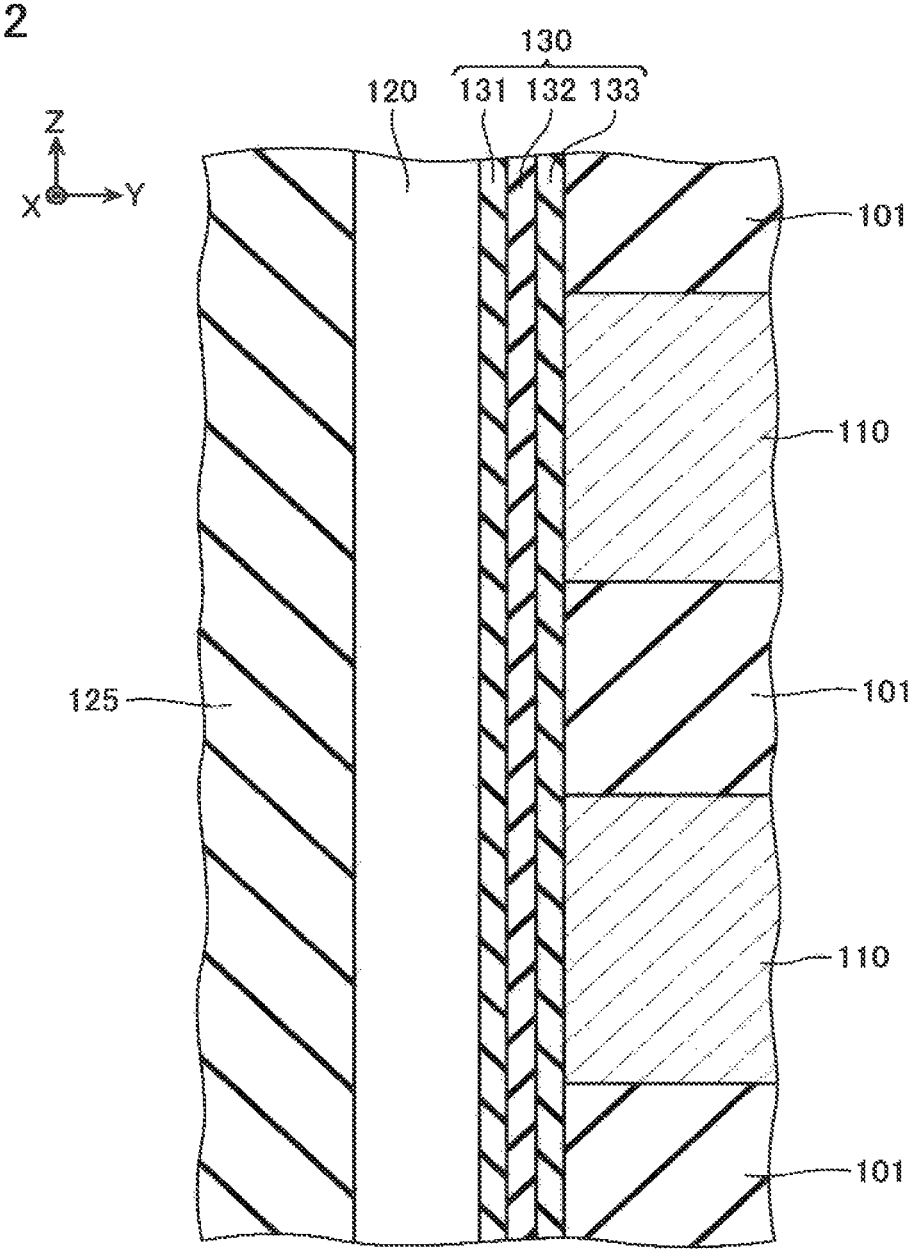
FIG. 12 is a schematic enlarged view of a part indicated by E in FIG. 10.
Figure 13:
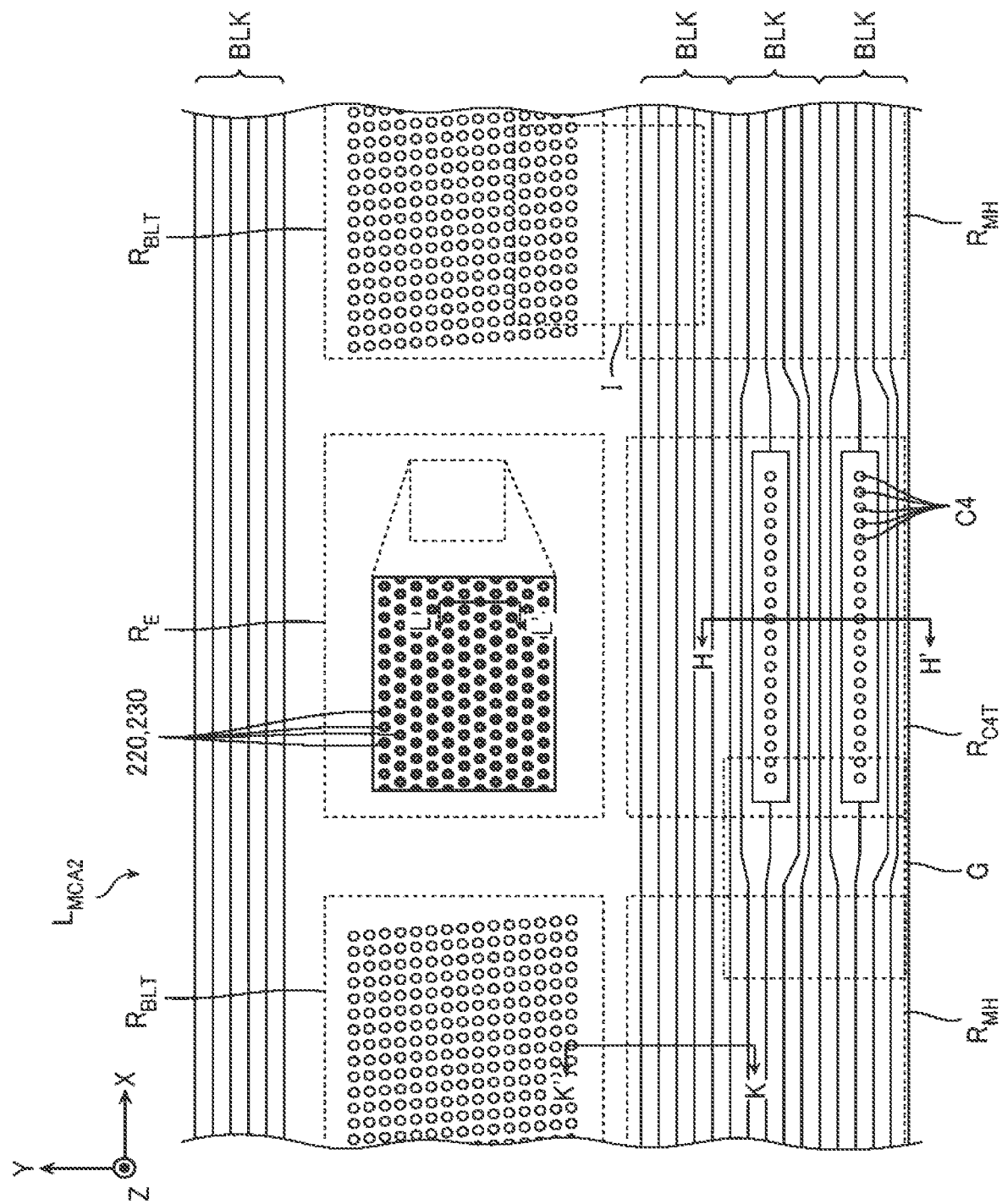
FIG. 13 is a schematic enlarged view of a part indicated by F in FIG. 6.
Figure 14:
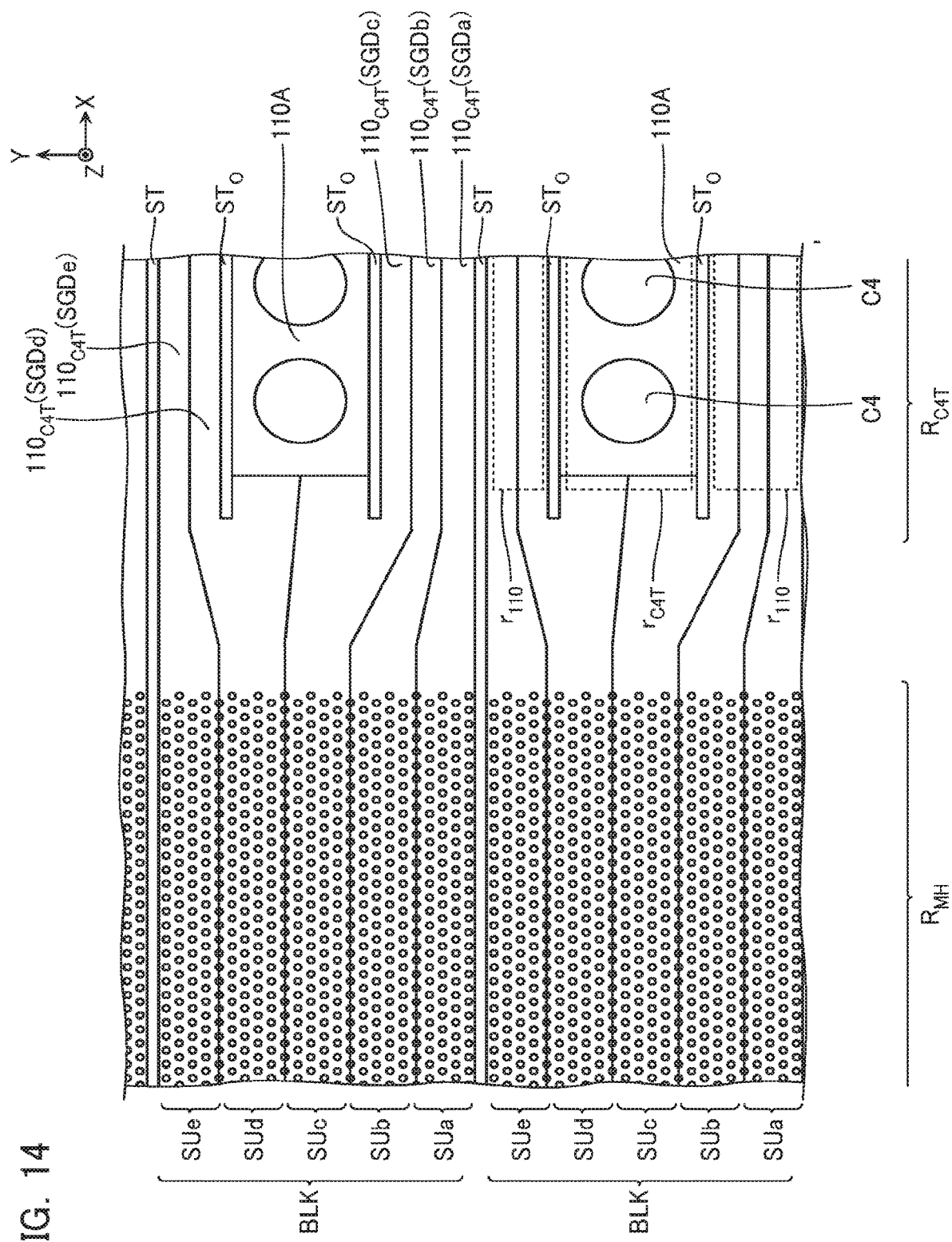
FIG. 14 is a schematic enlarged view of a part indicated by G in FIG. 13.
Figure 15:
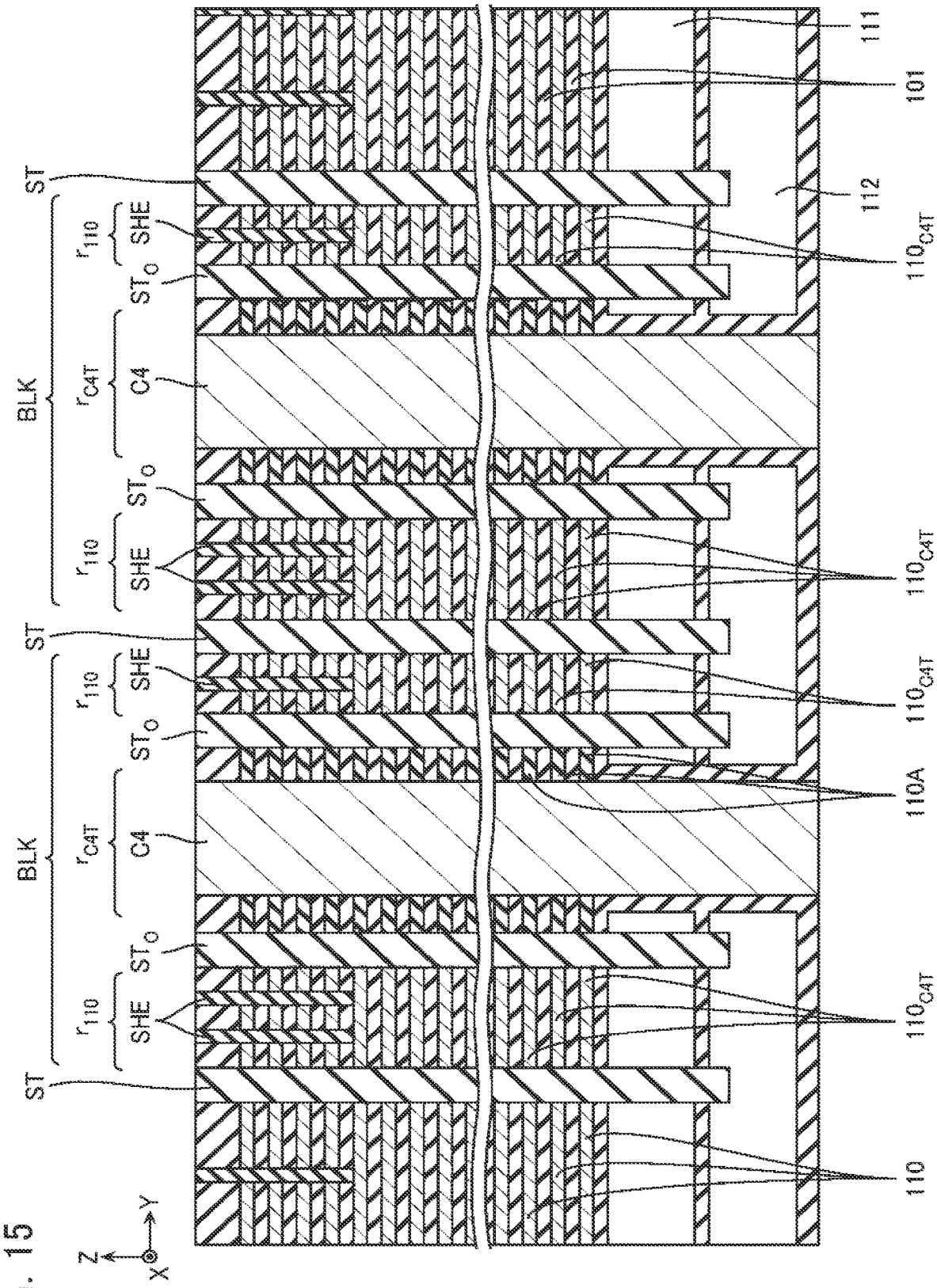
FIG. 15 is a schematic cross-sectional view taking the structure illustrated in FIG. 13 along the line H-H' and viewed along the arrow direction.
Figure 16:
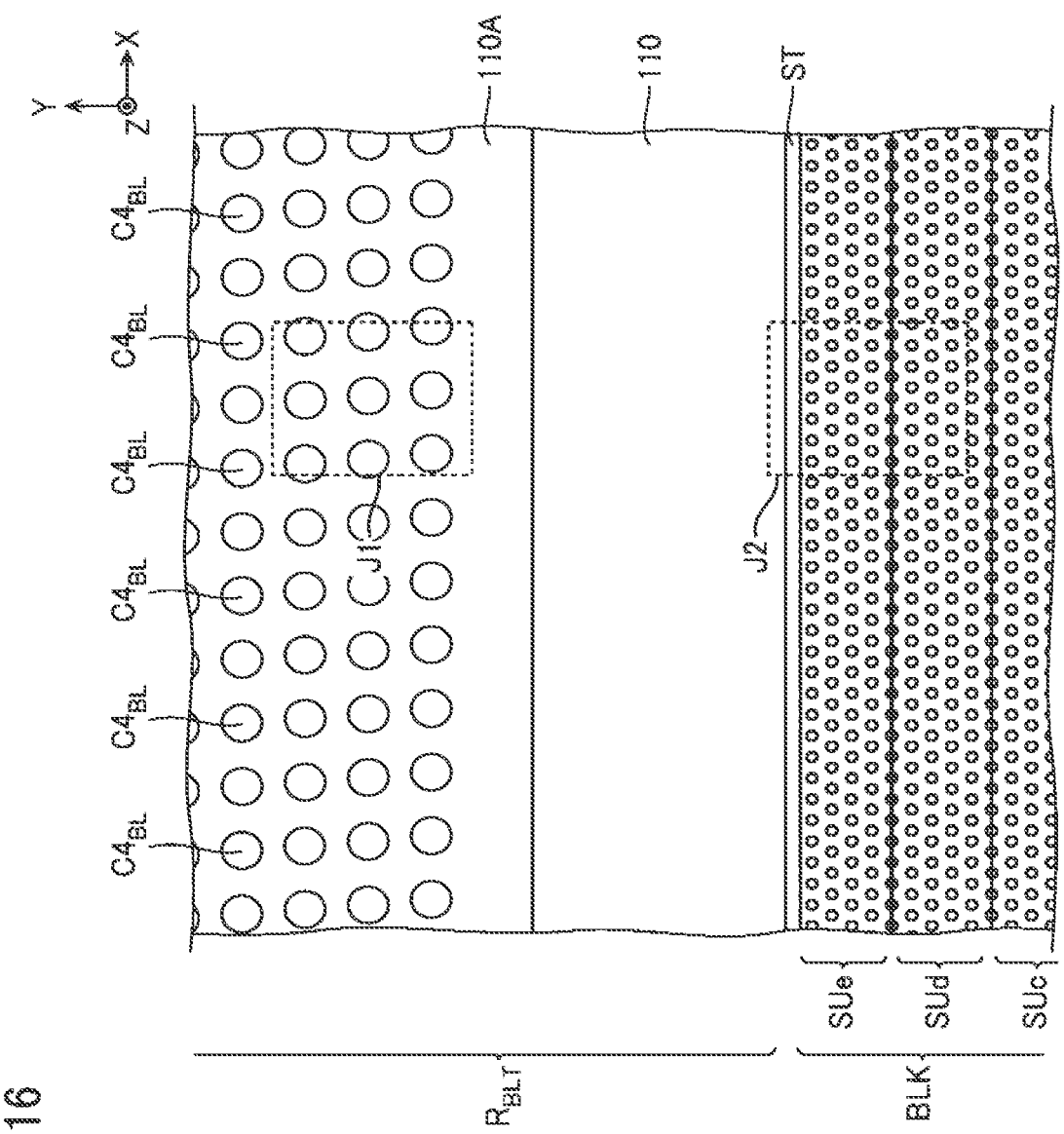
FIG. 16 is a schematic enlarged view of a part indicated by I in FIG. 13.
Figure 17:
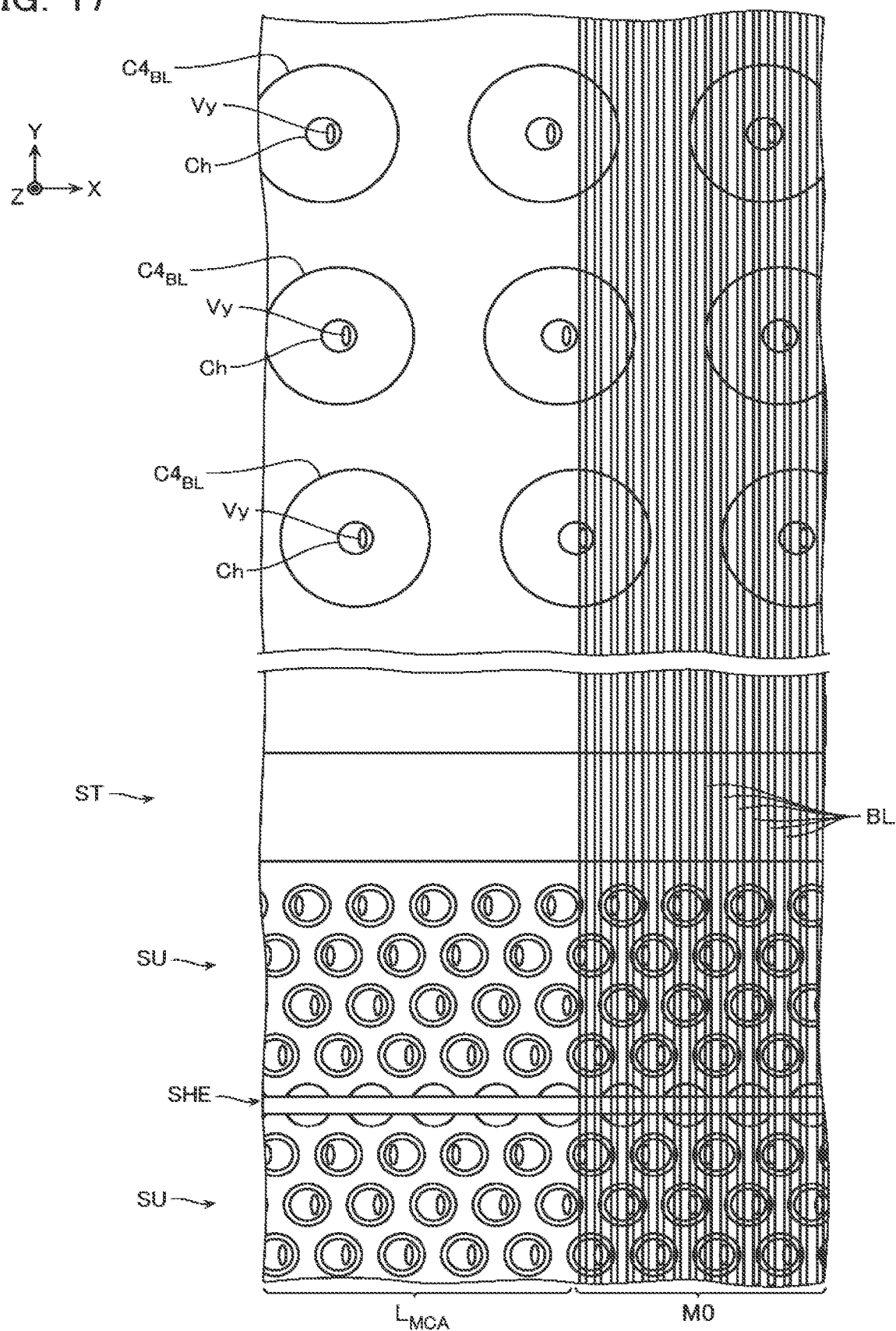
FIG. 17 is a schematic enlarged view of a part indicated by J1 and a part indicated by J2 in FIG. 16.
Figure 18:
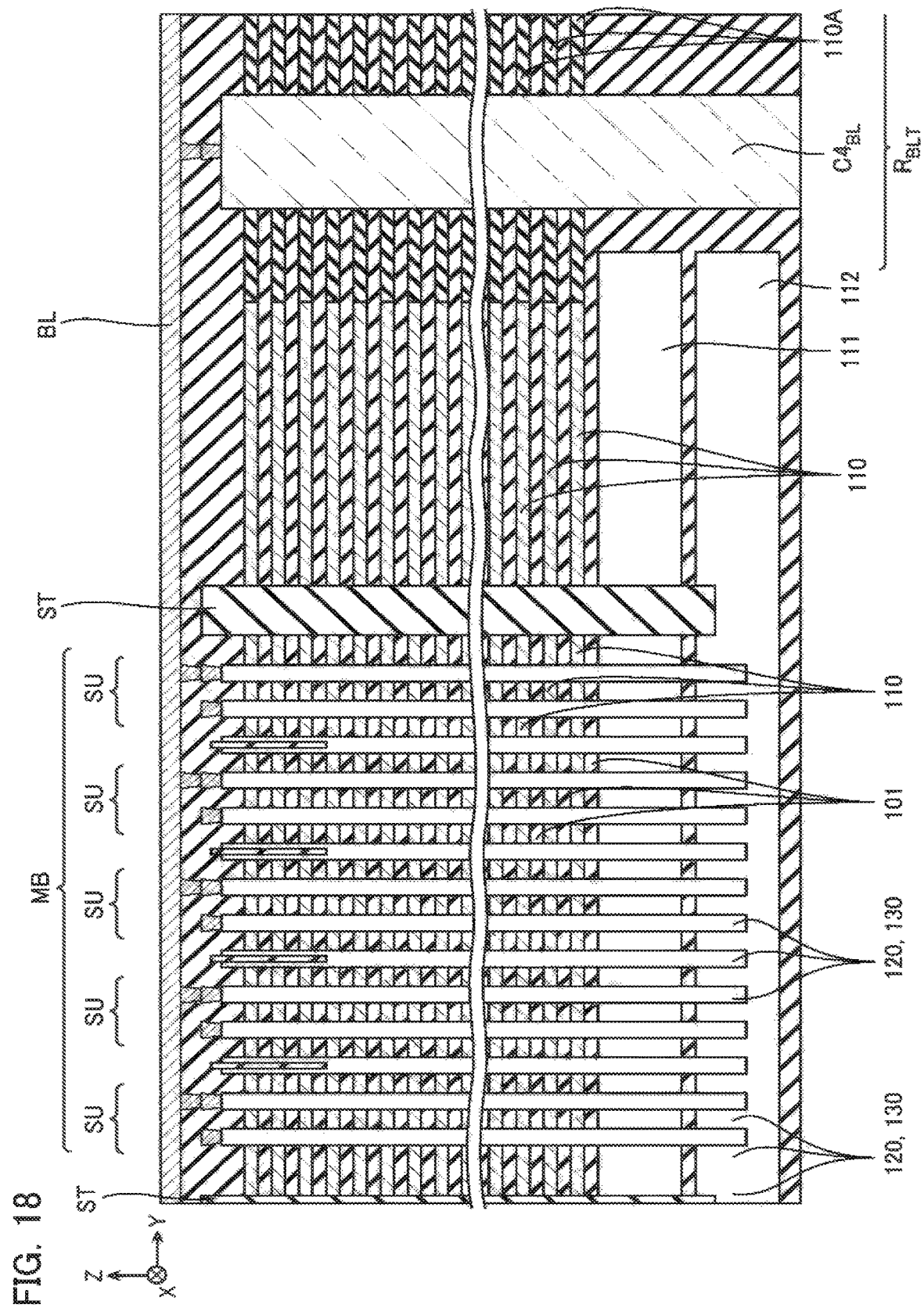
FIG. 18 is a schematic cross-sectional view taking the structure illustrated in FIG. 13 along the line K-K' and viewed along the arrow direction.
Figure 19:
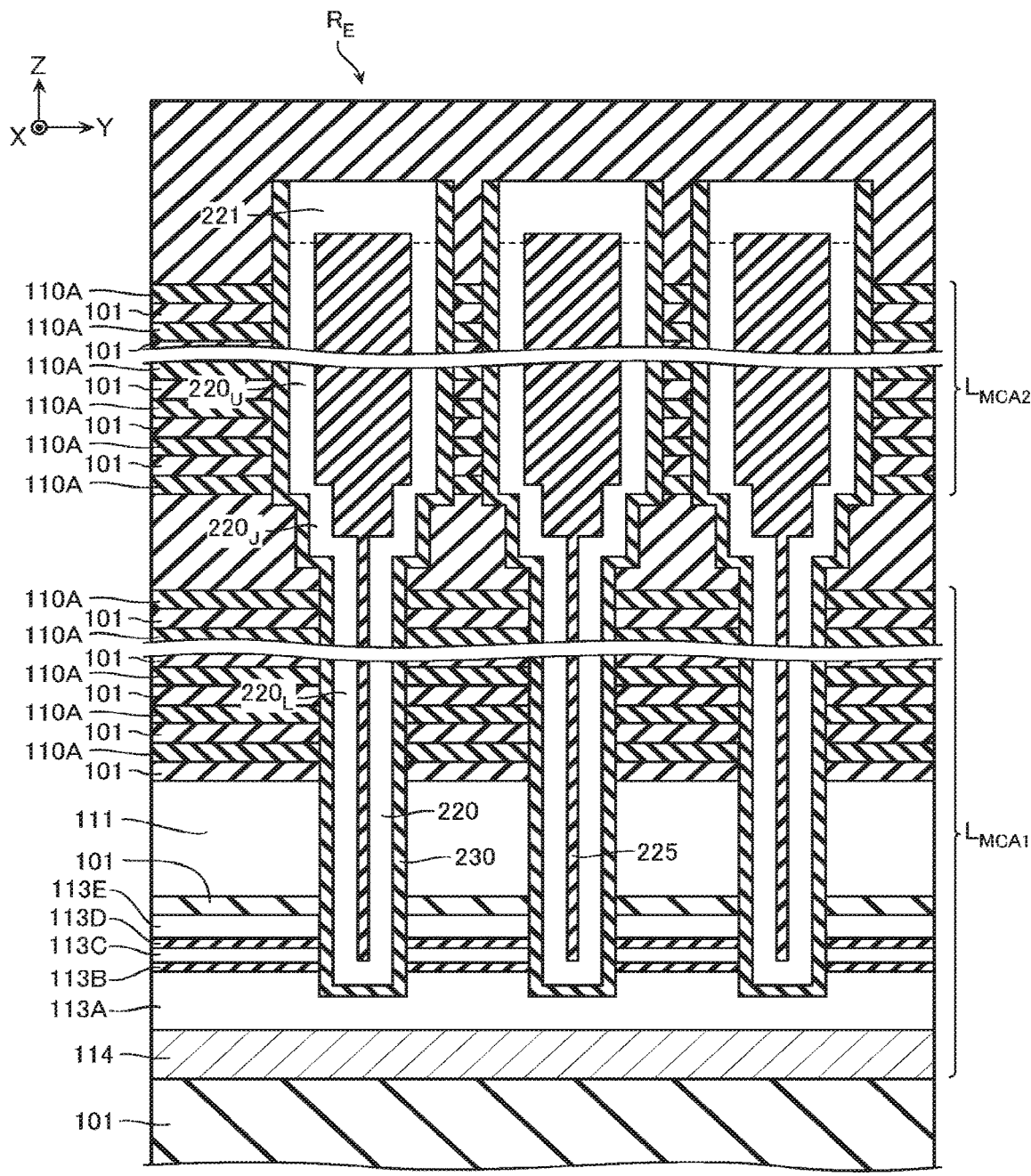
FIG. 19 is a schematic cross-sectional view taking the structure illustrated in FIG. 13 along the line L-L' and viewed along the arrow direction.

FIG. 6 is a schematic plan view of the memory die MD. FIG. 7 is a schematic cross-sectional view of the memory die MD. Note that FIG. 7 is a drawing to describe the schematic configuration of the memory die MD and does not describe the specific number of configurations, shape, arrangement, or the like. FIG. 8 is a schematic enlarged view of a part indicated by A in FIG. 6. FIG. 9 is a schematic enlarged view of a part indicated by B in FIG. 8. FIG. 10 is a schematic cross-sectional view taking the structure illustrated in FIG. 9 along the line C-C' and viewed along the arrow direction. FIG. 11 is a schematic cross-sectional view taking the structure illustrated in FIG. 9 along the line D-D' and viewed along the arrow direction. Note that FIG. 11 is a drawing to describe a schematic configuration of conducting layers 110 and does not illustrate the specific configuration. FIG. 12 is a schematic enlarged view of a part indicated by E in FIG. 10. FIG. 13 is a schematic enlarged view of a part indicated by F in FIG. 6. FIG. 14 is a schematic enlarged view of a part indicated by G in FIG. 13. FIG. 15 is a schematic cross-sectional view taking the structure illustrated in FIG. 13 along the line H-H' and viewed along the arrow direction. FIG. 16 is a schematic enlarged view of a part indicated by I in FIG. 13. FIG. 17 is a schematic enlarged view of a part indicated by J1 and a part indicated by J2 in FIG. 16. FIG. 18 is a schematic cross-sectional view taking the structure illustrated in FIG. 13 along the line K-K' and viewed along the arrow direction. FIG. 19 is a schematic cross-sectional view taking the structure illustrated in FIG. 13 along the line L-L' and viewed along the arrow direction.

For example, as illustrated in FIG. 6, the memory die MD includes a semiconductor substrate 100. In the illustrated example, the semiconductor substrate 100 includes four memory cell array regions $R_{MCA}$ arranged in the X direction and the Y direction. The memory cell array region $R_{MCA}$ includes a plurality of memory hole regions $R_{MH}$ arranged in the X direction and a plurality of contact connection regions $R_{C4T}$ disposed between the memory hole regions $R_{MH}$. First hook-up regions $R_{HU1}$ and second hook-up regions $R_{HU2}$ arranged in the X direction are disposed on both end portions in the X direction of the memory cell array region $R_{MCA}$. These regions extend in the Y direction. Additionally, a plurality of contact connection regions $R_{BLT}$ arranged in the X direction corresponding to the plurality of memory hole regions $R_{MH}$ arranged in the X direction are disposed on one end portion in the Y direction of the memory cell array region $R_{MCA}$. A peripheral region $R_P$ is disposed in an end portion in the Y direction of the semiconductor substrate 100. The peripheral region $R_P$ extends in the X direction along the end portion in the Y direction of the semiconductor substrate 100. Further, between the plurality of contact connection regions $R_{BLT}$ arranged with intervals in the X direction, inspection regions $R_E$ are disposed. The inspection regions $R_E$ are adjacent to the contact connection regions $R_{BLT}$ in the X direction and adjacent to the contact connection regions $R_{C4T}$ in the Y direction.

Although the illustration is omitted, the four memory cell array regions $R_{MCA}$ arranged in the X direction and the Y direction each include the plurality of memory hole regions $R_{MH}$, the plurality of contact connection regions $R_{C4T}$, the first hook-up regions $R_{HU1}$ and the second hook-up regions $R_{HU2}$, the contact connection regions $R_{BLT}$, and the inspection regions $R_E$. For example, the two memory cell array regions $R_{MCA}$ arranged in the X direction may be disposed to be symmetrical in the X direction (to be laterally symmetrical in FIG. 6). The two memory cell array regions $R_{MCA}$ arranged in the Y direction may be disposed to be symmetrical in the Y direction (to be vertically symmetrical in FIG. 6).

For example, as illustrated in FIG. 7, the memory die MD includes the semiconductor substrate 100, a transistor layer $L_{TR}$ disposed on the semiconductor substrate 100, a wiring layer D0 disposed above the transistor layer $L_{TR}$, a wiring layer D1 disposed above the wiring layer D0, a wiring layer D2 disposed above the wiring layer D1, a memory cell array layer $L_{MCA1}$ disposed above the wiring layer D2, a memory cell array layer $L_{MCA2}$ disposed above the memory cell array layer $L_{MCA1}$, a wiring layer M0 disposed above the memory cell array layer $L_{MCA2}$, a wiring layer M1 disposed above the wiring layer M0, and a wiring layer M2 disposed above the wiring layer M1.

[Structure of Semiconductor Substrate 100]

The semiconductor substrate 100 is, for example, a semiconductor substrate of P type silicon (Si) containing P type impurities, such as boron (B). For example, as illustrated in FIG. 7, in the surface of the semiconductor substrate 100, an N type well region 100N containing N type impurities, such as phosphorus (P), a P type well region 100P containing P type impurities, such as boron (B), a semiconductor substrate region 100S where the N type well region 100N or the P type well region 100P is not disposed, and insulating regions 100I are disposed. The N type well region 100N, the P type well region 100P, and the semiconductor substrate region 100S each function as a part of a plurality of the transistors Tr, a plurality of capacitors, and the like constituting the peripheral circuit PC.

[Structure of Transistor Layer $L_{TR}$]

For example, as illustrated in FIG. 7, wiring layer GC are disposed on the upper surface of the semiconductor substrate 100 via an insulating layer (not illustrated). The wiring layer GC includes a plurality of electrodes gc opposed to the surface of the semiconductor substrate 100. Respective regions of the semiconductor substrate 100 and the plurality of electrodes gc included in the wiring layer GC are each connected to a contact CS.

The N type well region 100N, the P type well region 100P, and the semiconductor substrate region 100S of the semiconductor substrate 100 each function as a channel region of the plurality of transistors Tr, one electrode of the plurality of capacitors, and the like constituting the peripheral circuit PC.

The plurality of respective electrodes gc included in the wiring layer GC function as the gate electrodes of the plurality of transistors Tr, the other electrodes of the plurality of capacitors, and the like constituting the peripheral circuit PC.

The contact CS extends in the Z direction and is in contact with the semiconductor substrate 100 at a lower end or in contact with the upper surface of the electrode gc. In a connection part between the contact CS and the semiconductor substrate 100, an impurity region containing N type impurities or P type impurities is disposed. For example, the contact CS may include a laminated film of a barrier conducting film, such as titanium nitride (TiN), and a metal film, such as tungsten (W), or the like.

[Structures of Wiring Layers D0, D1, D2]

For example, as illustrated in FIG. 7, a plurality of wirings included in the wiring layers D0, D1, D2 are electrically connected to at least one of the configurations in the memory cell array MCA and the configurations in the peripheral circuit PC.

The respective wiring layers D0, D1, D2 include a plurality of wirings d0, d1, d2. For example, the plurality of wirings d0, d1, d2 may include a laminated film of a barrier conducting film, such as titanium nitride (TiN), and a metal film, such as tungsten (W), or the like.

[Structures in Memory Hole Region $R_{MH}$ of Memory Cell Array Layers $L_{MCA1}$, $L_{MCA2}$]

For example, as illustrated in FIG. 8, in the memory cell array layers $L_{MCA1}$, $L_{MCA2}$, the plurality of memory blocks BLK arranged in the Y direction are disposed. The memory block BLK includes the plurality of string units SU arranged in the Y direction. Between the two memory blocks BLK adjacent in the Y direction, an inter-block insulating layer ST, such as silicon oxide ($SiO_2$), is disposed. For example, as illustrated in FIG. 9, between the two string units SU adjacent in the Y direction, an inter-string unit insulating layer SHE, such as silicon oxide ($SiO_2$), is disposed.

Note that, in the following description, for example, as exemplified in FIG. 8, the plurality of string units SU in the memory block BLK may be each referred to as a string unit SUa, SUb, SUc, SUd, SUe. Additionally, drain side select gate lines SGD corresponding to the string units SUa, SUb, SUc, SUd, Sue each may be referred to as a drain side select gate line SGDa, SGDb, SGDc, SGDd, SGDe.

For example, as illustrated in FIG. 10, the memory block BLK includes the plurality of conducting layers 110 arranged in the Z direction, a plurality of semiconductor layers 120 extending in the Z direction, and a plurality of respective gate insulating films 130 disposed between the plurality of conducting layers 110 and the plurality of semiconductor layers 120.

The conducting layer 110 is a substantially plate-shaped conducting layer extending in the X direction. The conducting layer 110 may include a laminated film of a barrier conducting film, such as titanium nitride (TiN), and a metal film, such as tungsten (W), or the like. For example, the conducting layer 110 may contain polycrystalline silicon containing impurities, such as phosphorus (P) or boron (B), or the like. Between the plurality of conducting layers 110 arranged in the Z direction, insulating layers 101, such as silicon oxide ($SiO_2$), are disposed.

A conducting layer 111 is disposed below the conducting layer 110. For example, the conducting layer 111 may contain polycrystalline silicon containing impurities, such as phosphorus (P) or boron (B), or the like. Between the conducting layer 111 and the conducting layer 110, the insulating layer 101, such as silicon oxide ($SiO_2$), is disposed.

A conducting layer 112 is disposed below the conducting layers 111. The conducting layer 112 includes a semiconductor layer 113 junctioned on lower ends of the semiconductor layers 120 and a conducting layer 114 in contact with a lower surface of the semiconductor layer 113. For example, the semiconductor layer 113 may contain polycrystalline silicon containing N type impurities, such as phosphorus (P), or containing P type impurities, such as boron (B), or the like. The conducting layer 114 may include, for example, a conducting layer including a metal, such as tungsten (W), or tungsten silicide, or another conducting layer. Between the conducting layer 112 and the conducting layer 111, the insulating layer 101, such as silicon oxide ($SiO_2$), is disposed.

For example, as illustrated in FIG. 11, the conducting layer 112 functions as the source line SL (FIG. 5). The source line SL corresponds to, for example, all of the memory blocks BLK included in the memory cell array region $R_{MCA}$ (FIG. 6).

The conducting layers 111 function as the source side select gate line SGSb (FIG. 5) and gate electrodes of the plurality of source-side select transistors STSb connected to the source side select gate line SGSb. The conducting layers 111 are electrically independent in every memory block BLK.

Among the plurality of conducting layers 110, one or the plurality of conducting layers 110 positioned at the lowermost function as the source side select gate line SGS (FIG. 5) and gate electrodes of the plurality of source-side select transistors STS connected to the source side select gate line SGS. The plurality of conducting layers 110 are electrically independent in every memory block BLK.

The plurality of conducting layers 110 positioned upward of this layer function as the word lines WL (FIG. 5) and gate electrodes of the plurality of memory cells MC (FIG. 5) connected to the word lines WL. The plurality of conducting layers 110 are each electrically independent in every memory blocks BLK.

One or the plurality of conducting layers 110 positioned upward of these conducting layers 110 function as the drain side select gate line SGD and gate electrodes of the plurality of drain-side select transistors STD (FIG. 5) connected the drain side select gate line SGD. The plurality of conducting layers 110 have widths in the Y direction smaller than those of the other conducting layers 110. Between the two conducting layers 110 adjacent in the Y direction, the inter-string unit insulating layer SHE is disposed. The plurality of conducting layers 110 are each electrically independent in every string units SU.

For example, as illustrated in FIG. 9, the semiconductor layers 120 are arranged in the X direction and the Y direction in a predetermined pattern. The semiconductor layers 120 function as the plurality of memory cells MC and the channel regions of the select transistors (STD, STS, STSb) included in one memory string MS (FIG. 5). The semiconductor layer 120 is, for example, a semiconductor layer, such as polycrystalline silicon (Si). For example, as illustrated in FIG. 10, the semiconductor layer 120 has a substantially closed-bottomed cylindrical shape and includes an insulating layer 125, such as silicon oxide, in the center part.

The semiconductor layer 120 includes semiconductor regions $120_L$ included in the memory cell array layer $L_{MCA1}$ and semiconductor regions $120_U$ included in the memory cell array layer $L_{MCA2}$. The semiconductor layer 120 includes a semiconductor region $120_J$ disposed between the semiconductor region $120_L$ and the semiconductor region $120_U$, an impurity region 122 disposed on the lower side of the semiconductor region $120_L$, and an impurity region 121 disposed on the upper side of the semiconductor region $120_U$.

The semiconductor region $120_L$ is a substantially cylindrically-shaped region extending in the Z direction. Outer peripheral surfaces of the semiconductor regions $120_L$ are each surrounded by the plurality of conducting layers 110 and the conducting layer 111 included in the memory cell array layer $L_{MCA1}$ and opposed to the plurality of conducting layers 110 and the conducting layer 111.

The semiconductor region $120_U$ is a substantially cylindrically-shaped region extending in the Z direction. Outer peripheral surfaces of the semiconductor regions $120_U$ are each surrounded by the plurality of conducting layers 110 included in the memory cell array layer $L_{MCA2}$ and opposed to the plurality of conducting layers 110. Note that a width in the X direction and a width in the Y direction of the semiconductor region $120_U$ are same extent as a width in the X direction and a width in the Y direction of the semiconductor region $120_L$.

The respective semiconductor regions $120_J$ are disposed above the plurality of conducting layers 110 included in the memory cell array layer $L_{MCA1}$ and disposed below the plurality of conducting layers 110 included in the memory cell array layer $L_{MCA2}$. A width in the X direction and a width in the Y direction of the semiconductor region $120_J$ are larger than the width in the X direction and the width in the Y direction of the semiconductor region $120_L$ and larger than the width in the X direction and the width in the Y direction of the semiconductor region $120_U$.

The impurity regions 122 are junctioned on the semiconductor layer 113 in the conducting layer 112. The impurity region 122 contains, for example, N type impurities, such as phosphorus (P), or P type impurities, such as boron (B). In the semiconductor layer 120, a part positioned immediately above the impurity region 122 functions as a channel region of the source-side select transistor STSb. An outer peripheral surface of the impurity region 122 is surrounded by the conducting layer 111 and opposed to the conducting layer 111.

The impurity region 121 contains, for example, N type impurities, such as phosphorus (P). The impurity regions 121 are connected to the bit lines BL via the contacts Ch and contacts Vy (FIG. 9).

The gate insulating film 130 has a substantially closed-bottomed cylindrical shape that covers the outer peripheral surface of the semiconductor layer 120. The gate insulating film 130 includes, for example, as illustrated in FIG. 12, a tunnel insulating film 131, an electric charge accumulating film 132, and a block insulating film 133, which are laminated between the semiconductor layer 120 and the conducting layers 110. The tunnel insulating film 131 and the block insulating film 133 are, for example, insulating films of silicon oxide ($SiO_2$) or the like. The electric charge accumulating film 132 is, for example, a film that can accumulate an electric charge of silicon nitride ($Si_3N_4$) or the like. The tunnel insulating film 131, the electric charge accumulating film 132, and the block insulating film 133, which have substantially cylindrical shapes, extend in the Z direction along the outer peripheral surface of the semiconductor layer 120.

FIG. 12 illustrates an example in which the gate insulating film 130 includes the electric charge accumulating film 132 of silicon nitride or the like. However, the gate insulating film 130 may include, for example, a floating gate of polycrystalline silicon containing N type or P type impurities or the like.

[Structure in Contact Connection Region $R_{C4T}$ of Memory Cell Array Layers $L_{MCA1}$, $L_{MCA2}$]

For example, as illustrated in FIG. 14, the contact connection region $R_{C4T}$ includes two insulating layers $ST_O$ arranged in the Y direction between the two inter-block insulating layers ST arranged in the Y direction. Between these two insulating layers $ST_O$, a contact connection sub-region $r_{C4T}$ is disposed. Between the inter-block insulating layer ST and the insulating layer $ST_O$, a conducting layer connection sub-region $r_{110}$ is disposed. These regions extend in the X direction along the inter-block insulating layer ST.

For example, as illustrated in FIG. 15, the insulating layer $ST_O$ extends in the Z direction and has a lower end in contact with the conducting layer 112. The insulating layer $ST_O$ contains, for example, silicon oxide ($SiO_2$)

The contact connection sub-region $r_{C4T}$ includes a plurality of insulating layers 110A arranged in the Z direction and a plurality of contacts C4 extending in the Z direction.

The insulating layer 110A is a substantially plate-shaped insulating layer extending in the X direction. The insulating layer 110A may include an insulating layer, such as silicon nitride (SiN). Between the plurality of insulating layers 110A arranged in the Z direction, the insulating layers 101, such as silicon oxide ($SiO_2$), are disposed.

For example, as illustrated in FIG. 13, the plurality of contacts C4 are aligned in the X direction. The contact C4 may include a laminated film of a barrier conducting film, such as titanium nitride (TiN), and a metal film, such as tungsten (W), or the like. For example, as illustrated in FIG. 15, outer peripheral surfaces of the contacts C4 are each surrounded by the insulating layers 110A and the insulating layers 101 and are in contact with these insulating layers 110A and insulating layers 101. Note that, for example, as illustrated in FIG. 7, the contact C4 extends in the Z direction and functions as one contact together with another contact disposed on the upper side. This contact including the contact C4 has an upper end connected to a wiring m0 in the wiring layer M0. This contact including the contact C4 has a lower end connected to the wiring d2 in the wiring layer D2.

For example, as illustrated in FIG. 15, the conducting layer connection sub-region $r_{110}$ includes narrow-width portions $110_{C4T}$ of the plurality of conducting layers 110 arranged in the Z direction. For example, as illustrated in FIG. 13 and FIG. 14, the plurality of conducting layers 110 included in the two memory hole regions $R_{MH}$ adjacent in the X direction are electrically conducted with one another via the narrow-width portions $110_{C4T}$. In the example of FIG. 14, one of the two conducting layer connection sub-regions $r_{110}$ corresponding to one memory block BLK includes the narrow-width portions $110_{C4T}$ of the plurality of conducting layers 110 that function as the drain side select gate lines SGDa to SGDc. The other one of these two conducting layer connection sub-region $r_{110}$ includes the narrow-width portions $110_{C4T}$ of the plurality of conducting layers 110 that function as the drain side select gate lines SGDd, SGDe.

[Structure in First Hook-Up Region $R_{HU1}$ of Memory Cell Array Layers $L_{MCA1}$, $L_{MCA2}$]

As illustrated in FIG. 7, the first hook-up region $R_{HU1}$ includes end portions in the X direction of the plurality of conducting layers 110 that function as the drain side select gate lines SGD. The first hook-up region $R_{HU1}$ includes the plurality of contacts CC. The plurality of contacts CC extend in the Z direction and have lower ends in contact with the conducting layers 110. For example, the contact CC may include a laminated film of a barrier conducting film, such as titanium nitride (TiN), and a metal film, such as tungsten (W), or the like. The plurality of contacts CC are connected to the drain electrodes of the transistors Tr via the wirings m0, m1, m2 in the wiring layers M0, M1, M2, the contacts C4, the wirings d0, d1, d2 in the wiring layers D0, D1, D2, and the contacts CS. For example, as illustrated in FIG. 8, the first hook-up region $R_{HU1}$ includes supporting structures HR disposed at the proximity of the contacts CC.

[Structure in Second Hook-Up Region $R_{HU2}$ of Memory Cell Array Layers $L_{MCA1}$, $L_{MCA2}$]

As illustrated in FIG. 7, the second hook-up region $R_{HU2}$ includes a part of the plurality of conducting layers 110 that function as the word lines WL or the source side select gate lines SGS. The second hook-up region $R_{HU2}$ includes the plurality of contacts CC. The plurality of contacts CC are connected to the drain electrodes of the transistors Tr via the wirings m0, m1, m2 in the wiring layers M0, M1, M2, the contacts C4, the wirings d0, d1, d2 in the wiring layers D0, D1, D2, and the contacts CS.

[Structure in Contact Connection Region $R_{BLT}$ in Memory Cell Array Layers $L_{MCA1}$, $L_{MCA2}$]

For example, as illustrated in FIG. 18, the contact connection region $R_{BLT}$ includes the plurality of insulating layers 110A arranged in the Z direction and a plurality of contacts $C4_{BL}$ extending in the Z direction.

For example, as illustrated in FIG. 16, the plurality of contacts $C4_{BL}$ are aligned in the X direction and the Y direction. The contact $C4_{BL}$ may include a laminated film of a barrier conducting film, such as titanium nitride (TiN), and a metal film, such as tungsten (W), or the like. For example, as illustrated in FIG. 18, outer peripheral surfaces of the contacts $C4_{BL}$ are each surrounded by the insulating layers 110A and the insulating layers 101 and in contact with these insulating layers 110A and insulating layers 101. Note that, for example, as illustrated in FIG. 17 and FIG. 18, the contact $C4_{BL}$ extends in the Z direction and functions as one contact together with the contact Ch and the contact Vy. This contact including the contacts $C4_{BL}$, Ch, Vy has an upper end connected to the bit lines BL. Although illustration is omitted, this contact including the contacts $C4_{BL}$, Ch, Vy has a lower end connected to the wiring d2 (FIG. 7) in the wiring layer D2.

[Structure in Inspection Region $R_E$ of Memory Cell Array Layers $L_{MCA1}$, $L_{MCA2}$]

For example, as illustrated in FIG. 19, the inspection region $R_E$ includes the plurality of insulating layers 110A arranged in the Z direction, a plurality of semiconductor layers 220 extending in the Z direction, and a plurality of respective insulating films 230 disposed between the plurality of insulating layers 110A and the plurality of semiconductor layers 220.

The insulating layer 110A is a substantially plate-shaped insulating layer extending in the X direction. The insulating layer 110A may contain, for example, silicon nitride (SiN) or the like. Between the plurality of insulating layers 110A arranged in the Z direction, the insulating layers 101, such as silicon oxide ($SiO_2$) are disposed.

The above-described conducting layer 111 is disposed below the insulating layer 110A.

The above-described conducting layer 114 is disposed below the conducting layers 111. On an upper surface of the conducting layer 114, a semiconductor layer 113A, such as silicon (Si), an insulating layer 113B, such as silicon oxide ($SiO_2$), a semiconductor layer 113C, such as silicon (Si), an insulating layer 113D, such as silicon oxide ($SiO_2$), and a semiconductor layer 113E, such as silicon (Si), are disposed.

For example, as illustrated in FIG. 13, the semiconductor layers 220 are arranged in a predetermined pattern in the X direction and the Y direction. The semiconductor layer 220 is, for example, a semiconductor layer, such as polycrystalline silicon (Si). For example, as illustrated in FIG. 19, the semiconductor layer 220 has a substantially closed-bottomed cylindrical shape and includes an insulating layer 225, such as silicon oxide, in the center part.

The semiconductor layer 220 includes a semiconductor region $220_L$ included in the memory cell array layer $L_{MCA1}$ and a semiconductor region $220_U$ included in the memory cell array layer $L_{MCA2}$. The semiconductor layer 220 includes a semiconductor region $220_J$ disposed between the semiconductor region $220_L$ and the semiconductor region $220_U$ and an impurity region 221 disposed on the upper side of the semiconductor region $220_U$.

The semiconductor region $220_L$ is a substantially cylindrically-shaped region extending in the Z direction. Outer peripheral surfaces of the semiconductor regions $220_L$ are each surrounded by the plurality of insulating layers 110A, the conducting layer 111, and the semiconductor layers 113A, 113C, 113E included in the memory cell array layer $L_{MCA1}$ and opposed to the plurality of insulating layers 110A, the conducting layer 111, and the semiconductor layers 113A, 113C, 113E. Note that a width in the X direction and a width in the Y direction of the semiconductor region $220_L$ are same extent as the width in the X direction and the width in the Y direction of the semiconductor region $120_L$ of the semiconductor layer 120 described with reference to FIG. 10.

The semiconductor region $220_U$ is a substantially cylindrically-shaped region extending in the Z direction. Outer peripheral surfaces of the semiconductor regions $220_U$ are each surrounded by the plurality of insulating layers 110A included in the memory cell array layer $L_{MCA2}$ and opposed to the plurality of insulating layers 110A. In this embodiment, widths in the X direction and widths in the Y direction of the semiconductor regions $220_U$ corresponding to the plurality of semiconductor layers 220 disposed in the inspection region $R_E$ are larger than the width in the X direction and the width in the Y direction of the semiconductor region $220_L$ corresponding to any of the semiconductor layers 220 disposed in the inspection region $R_E$. Widths in the X direction and widths in the Y direction of the semiconductor regions $220_U$ corresponding to the plurality of semiconductor layers 220 disposed in the inspection region $R_E$ are larger than the width in the X direction and the width in the Y direction of the semiconductor region $120_J$ corresponding to any of the semiconductor layers 120 disposed in the memory hole region $R_{MH}$.

The respective semiconductor regions $220_J$ are disposed above the plurality of insulating layers 110A included in the memory cell array layer $L_{MCA1}$ and disposed below the plurality of insulating layers 110A included in the memory cell array layer $L_{MCA2}$. A width in the X direction and a width in the Y direction of the semiconductor region $220_J$ are same extent as the width in the X direction and the width in the Y direction of the semiconductor region $120_J$ of the semiconductor layer 120 described with reference to FIG. 10.

Note that, different from the semiconductor layers 120 disposed in the memory hole region $R_{MH}$, the semiconductor layers 220 disposed in the inspection region $R_E$ are not connected to any wiring or the like.

The insulating film 230 has a substantially closed-bottomed cylindrical shape that covers the outer peripheral surface of the semiconductor layer 220. The insulating film 230 includes, for example, the tunnel insulating film 131, the electric charge accumulating film 132, and the block insulating film 133, which are laminated between the semiconductor layer 220 and the insulating layers 110A, similarly to the gate insulating film 130 described with reference to FIG. 12.

As described above, the gate insulating film 130 may include, for example, a floating gate of polycrystalline silicon containing N type or P type impurities or the like. In such a case, the insulating film 230 may include a configuration, such as polycrystalline silicon, corresponding to the floating gate.

[Structures of Wiring Layers M0, M1, M2]

For example, as illustrated in FIG. 7, the plurality of wirings included in the wiring layers M0, M1, M2 are electrically connected to, for example, at least one of the configurations in the memory cell arrays $L_{MCA1}$, $L_{MCA2}$ and the configurations in the transistor layer $L_{TR}$.

The wiring layer M0 includes the plurality of wirings m0. For example, the plurality of wirings m0 may include a laminated film of a barrier conducting film, such as titanium nitride (TiN), and a metal film, such as copper (Cu), or the like. Note that a part of the plurality of wirings m0 function as the bit lines BL (FIG. 5). For example, as illustrated in FIG. 9, the bit lines BL are arranged in the X direction and extend in the Y direction. The plurality of bit lines BL are each connected to one semiconductor layer 120 included in each string unit SU. For example, as illustrated in FIG. 17 and FIG. 18, the plurality of bit lines BL are each connected to the contacts $C4_{BL}$.

The wiring layer M1 includes the plurality of wirings m1. For example, the plurality of wirings m1 may include a laminated film of a barrier conducting film, such as titanium nitride (TiN), and a metal film, such as copper (Cu), or the like.

For example, as illustrated in FIG. 7, the wiring layer M2 includes the plurality of wirings m2. For example, the plurality of wirings m2 may include a laminated film of a barrier conducting film, such as titanium nitride (TiN), and a metal film, such as aluminum (Al), or the like. Note that a part of the plurality of wirings m2 function as the pad electrodes P (FIG. 2, FIG. 3).

[Manufacturing Method]

Figure 44:
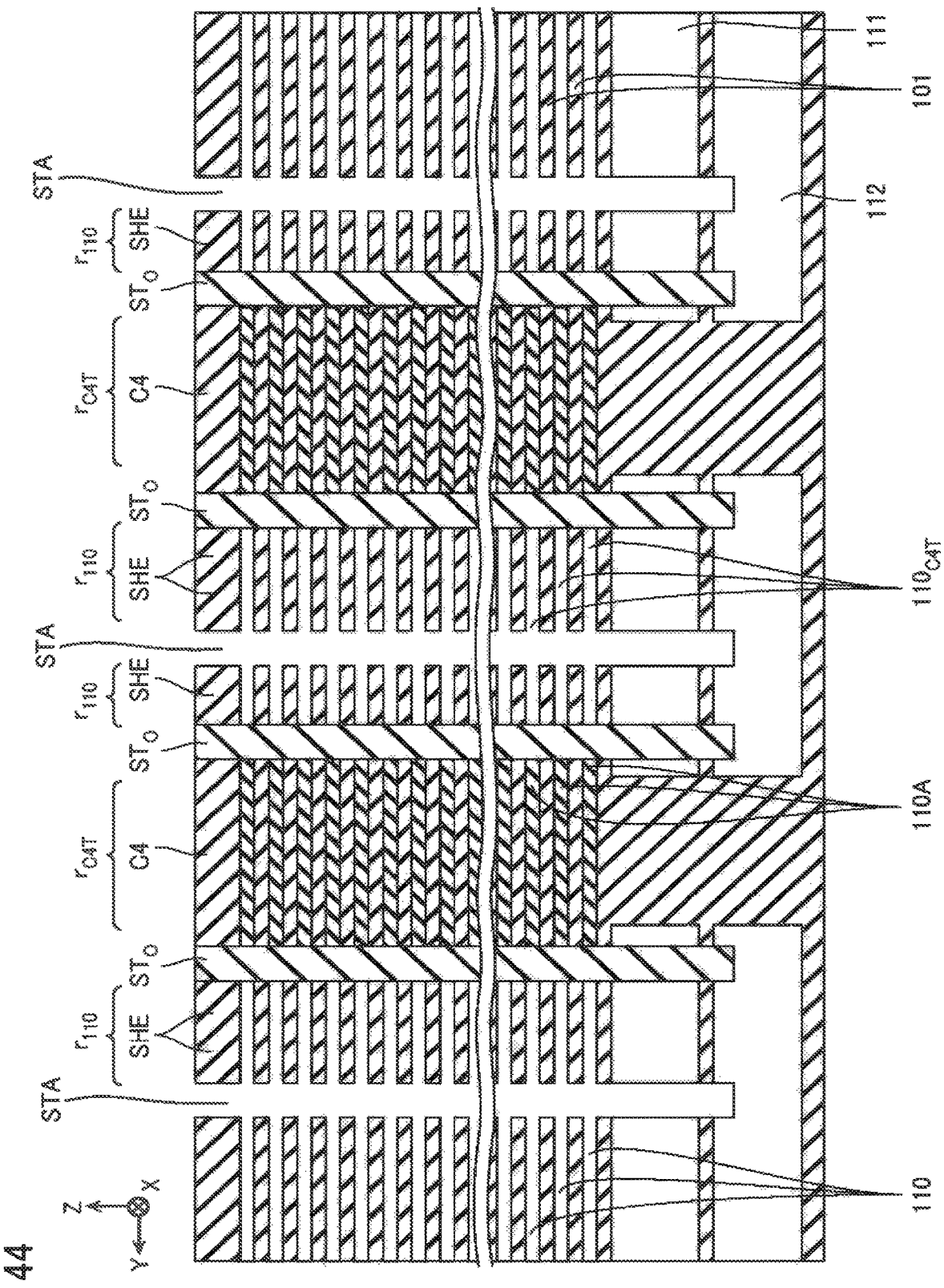
FIG. 44 is a schematic cross-sectional view illustrating the manufacturing method.
Figure 45:
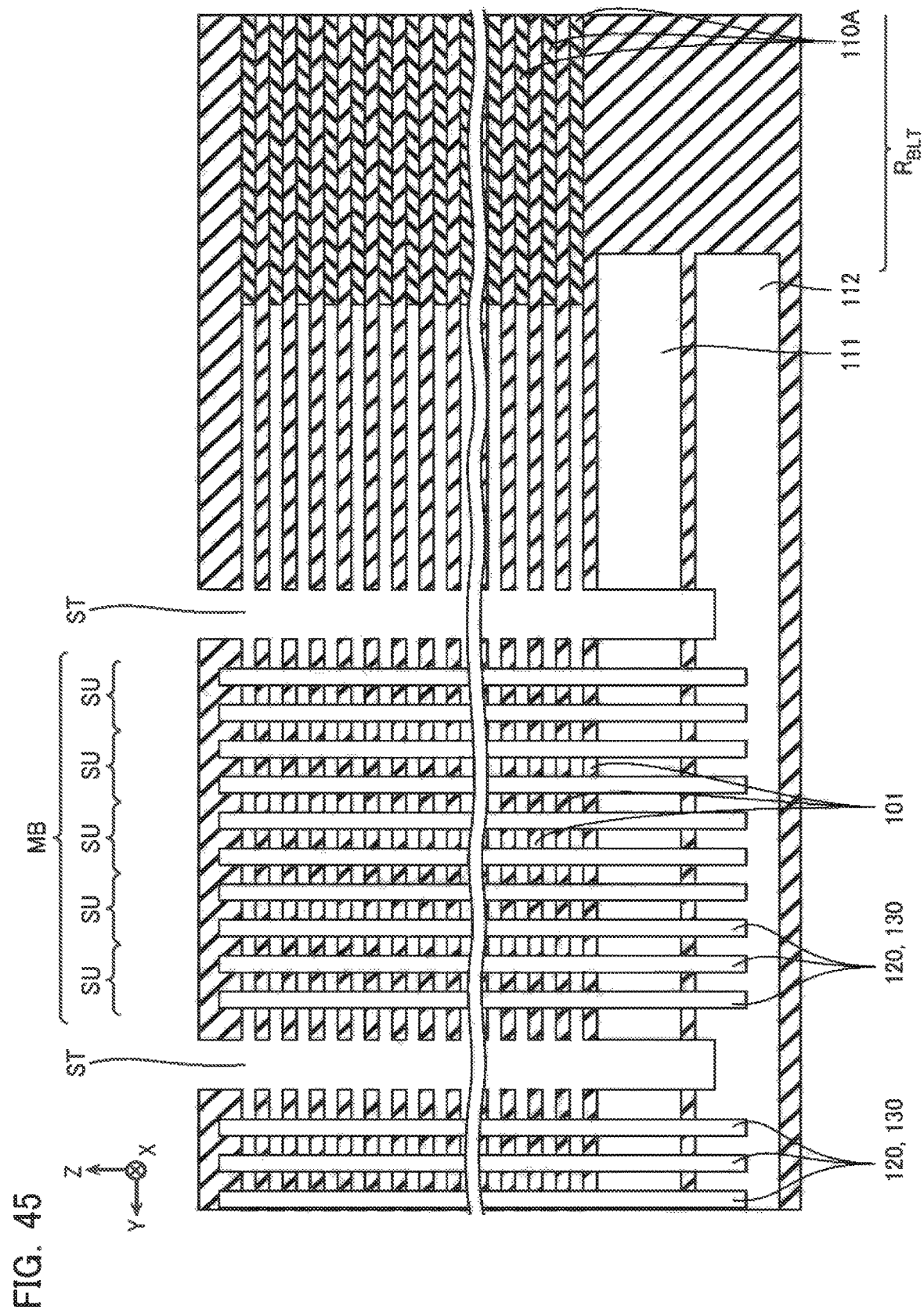
FIG. 45 is a schematic cross-sectional view illustrating the manufacturing method.

Next, with reference to FIG. 20 to FIG. 47, the method for manufacturing the memory die MD will be described. FIG. 20 to FIG. 29, FIG. 31, FIG. 33 to FIG. 36, FIG. 38 to FIG. 43, FIG. 46, and FIG. 47 are schematic cross-sectional views to describe the manufacturing method and illustrate cross-sectional surfaces corresponding to FIG. 10. FIG. 30 and FIG. 32 are schematic cross-sectional views to describe the manufacturing method and illustrate cross-sectional surfaces corresponding to FIG. 19. FIG. 37 and FIG. 44 are schematic cross-sectional views to describe the manufacturing method and illustrate cross-sectional surfaces corresponding to FIG. 15. FIG. 45 is a schematic cross-sectional view to describe the manufacturing method and illustrate a cross-sectional surface corresponding to FIG. 18.

To manufacture the memory die MD according to the embodiment, first, the transistor layer $L_{TR}$, the wiring layer D0, the wiring layer D1, and the wiring layer D2 (FIG. 7) are formed on the semiconductor substrate 100. The insulating layer 101 is formed on the upper surface of the wiring layer D2.

Figure 20:
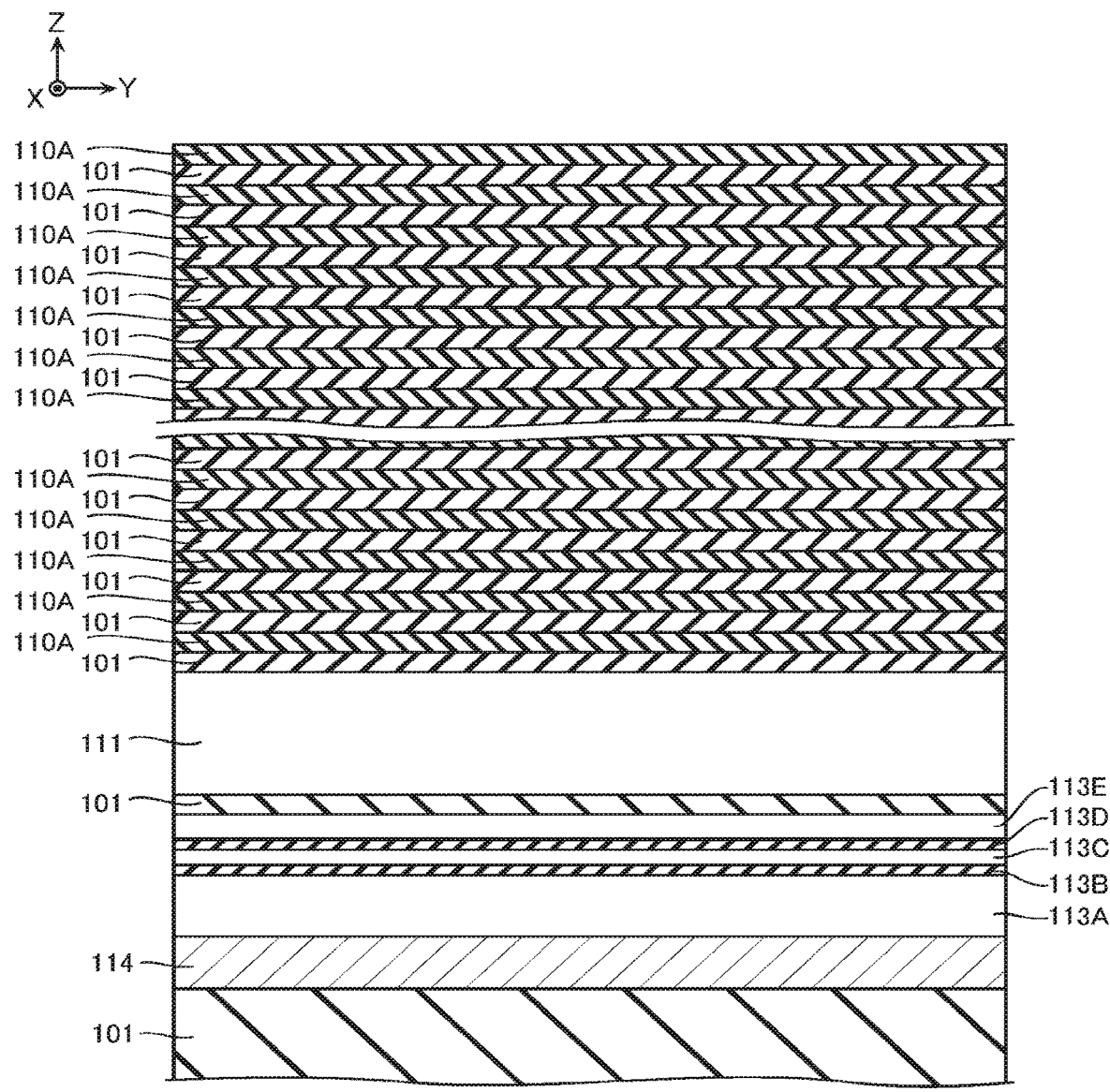
FIG. 20 is a schematic cross-sectional view illustrating a method for manufacturing the memory die MD according to the first embodiment.

Next, for example, as illustrated in FIG. 20, on the insulating layer 101, the conducting layer 114, the semiconductor layer 113A, the insulating layer 113B, the semiconductor layer 113C, the insulating layer 113D, the semiconductor layer 113E, the insulating layer 101, and the conducting layer 111 are formed. The plurality of insulating layers 101 and the plurality of insulating layers 110A are formed in alternation. This process is, for example, performed by a method, such as Chemical Vapor Deposition (CVD).

Next, the plurality of insulating layers 101 and the plurality of insulating layers 110A are processed to form a configuration of the substantially staircase pattern as described with reference to FIG. 7 and the like.

Figure 21:
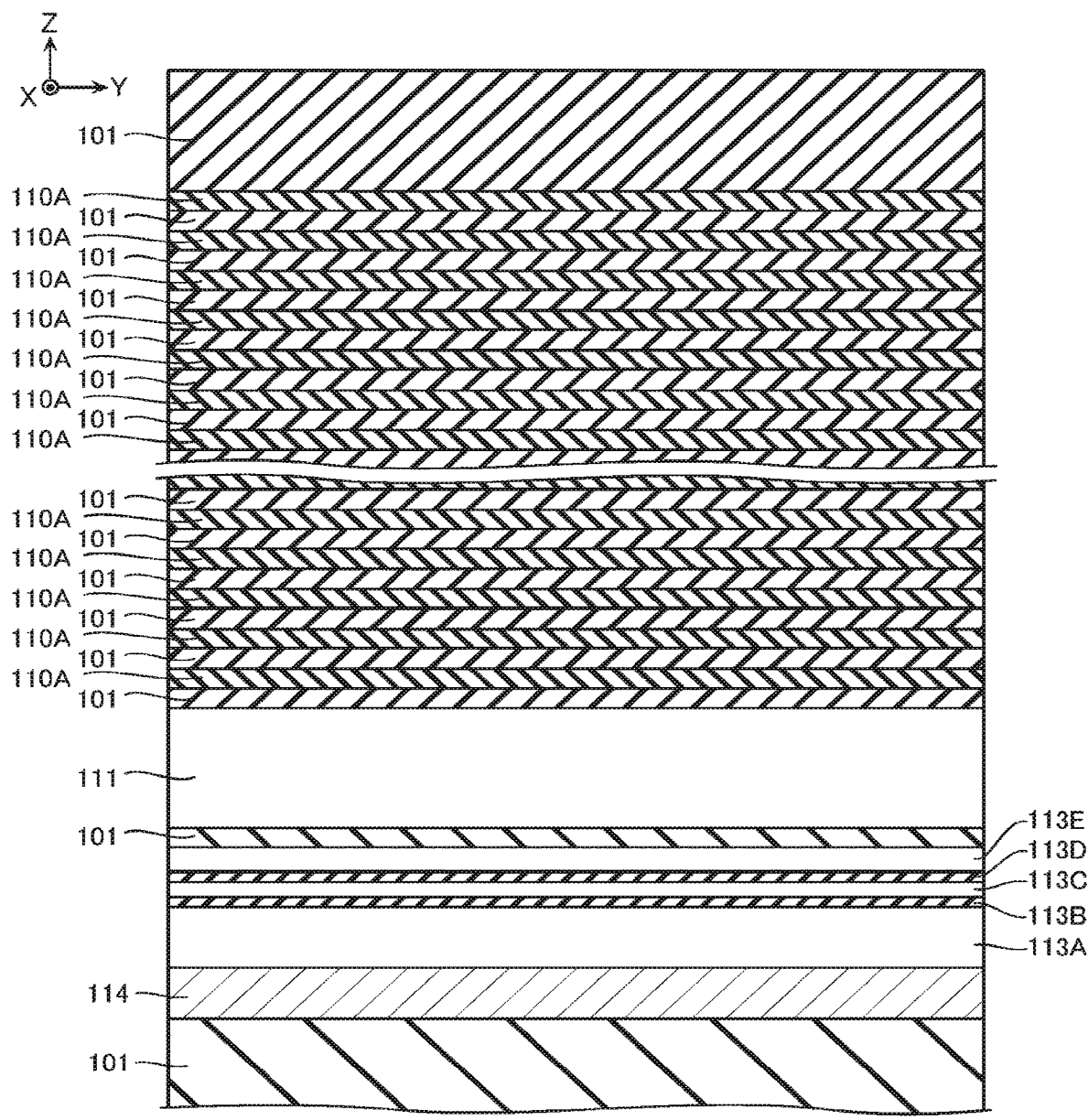
FIG. 21 is a schematic cross-sectional view illustrating the manufacturing method.

Next, for example, as illustrated in FIG. 21, the insulating layer 101 is formed on the upper surface of the structure illustrated in FIG. 20.

Figure 22:
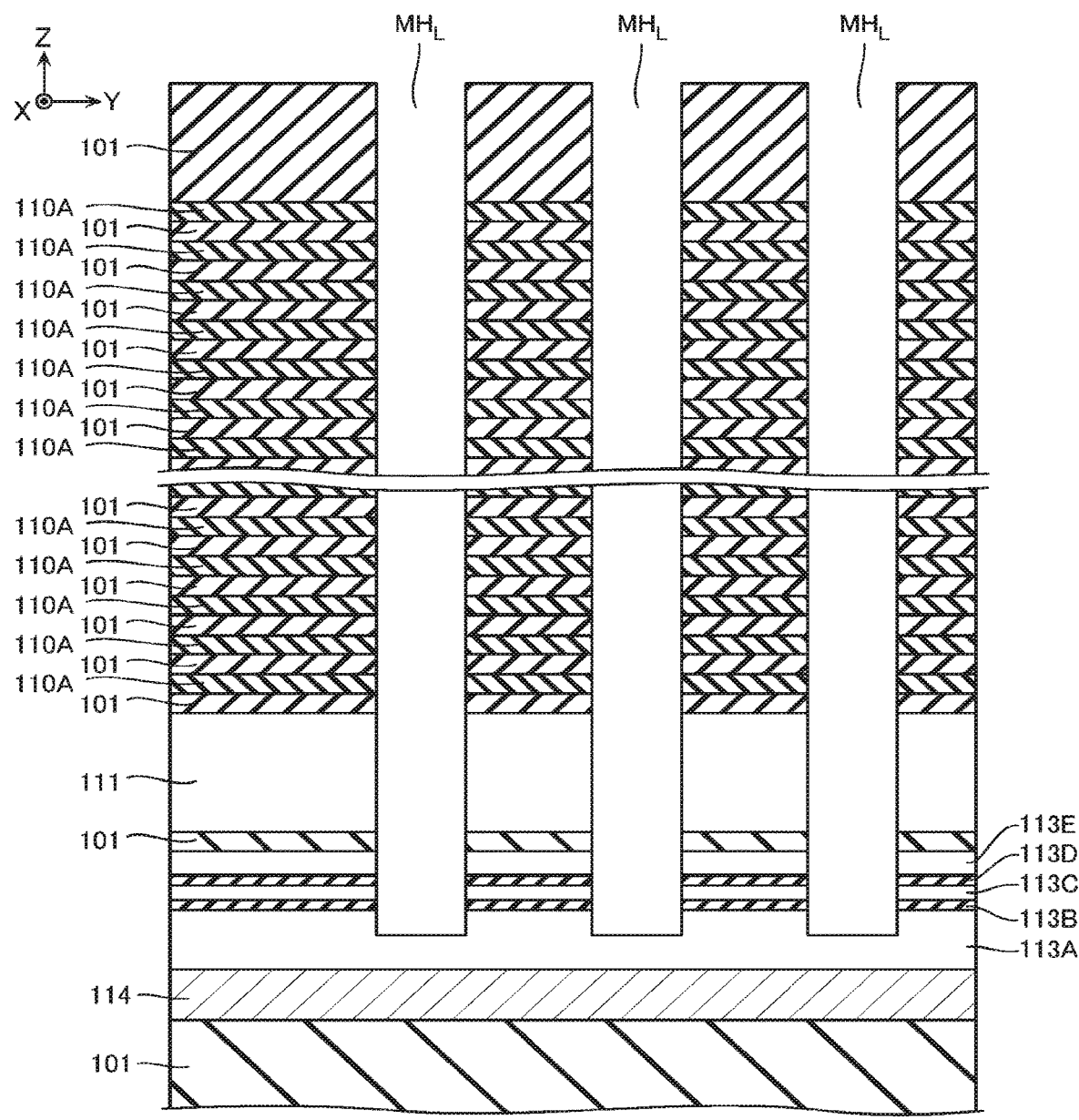
FIG. 22 is a schematic cross-sectional view illustrating the manufacturing method.

Next, for example, as illustrated in FIG. 22, a plurality of memory holes $MH_L$ are formed at positions corresponding to the semiconductor layers 120 and the semiconductor layers 220. The memory holes $MH_L$ are formed not only in the memory hole regions $R_{MH}$ (FIG. 6, FIG. 13) but also in the inspection regions $R_E$ (FIG. 13). The memory hole $MH_L$ is a through-hole that extends in the Z direction, penetrates the insulating layers 101 and the insulating layers 110A, the conducting layer 111, the semiconductor layer 113E, the insulating layer 113D, the semiconductor layer 113C, and the insulating layer 113B to expose the upper surface of the semiconductor layer 113A. This process is, for example, performed by a method, such as RIE.

Figure 23:
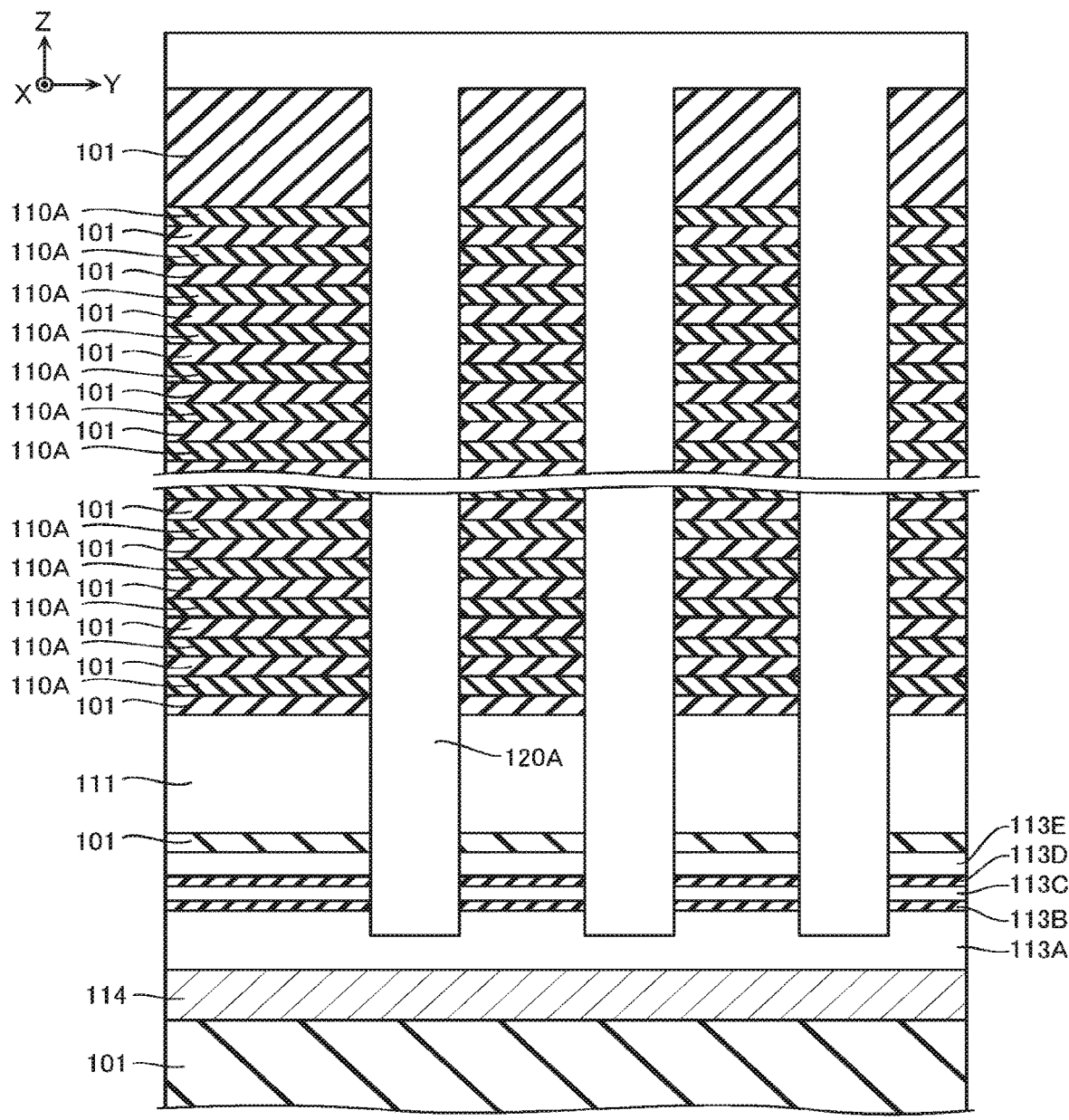
FIG. 23 is a schematic cross-sectional view illustrating the manufacturing method.

Next, for example, as illustrated in FIG. 23, amorphous silicon films 120A are formed on the upper surface of the uppermost insulating layer 101 and inner circumferential surfaces of the memory holes $MH_L$. This process is, for example, performed by a method, such as CVD. In this process, before the amorphous silicon films 120A are formed, an insulating film, such as silicon oxide ($SiO_2$) and silicon nitride (SiN), may be formed.

Figure 24:
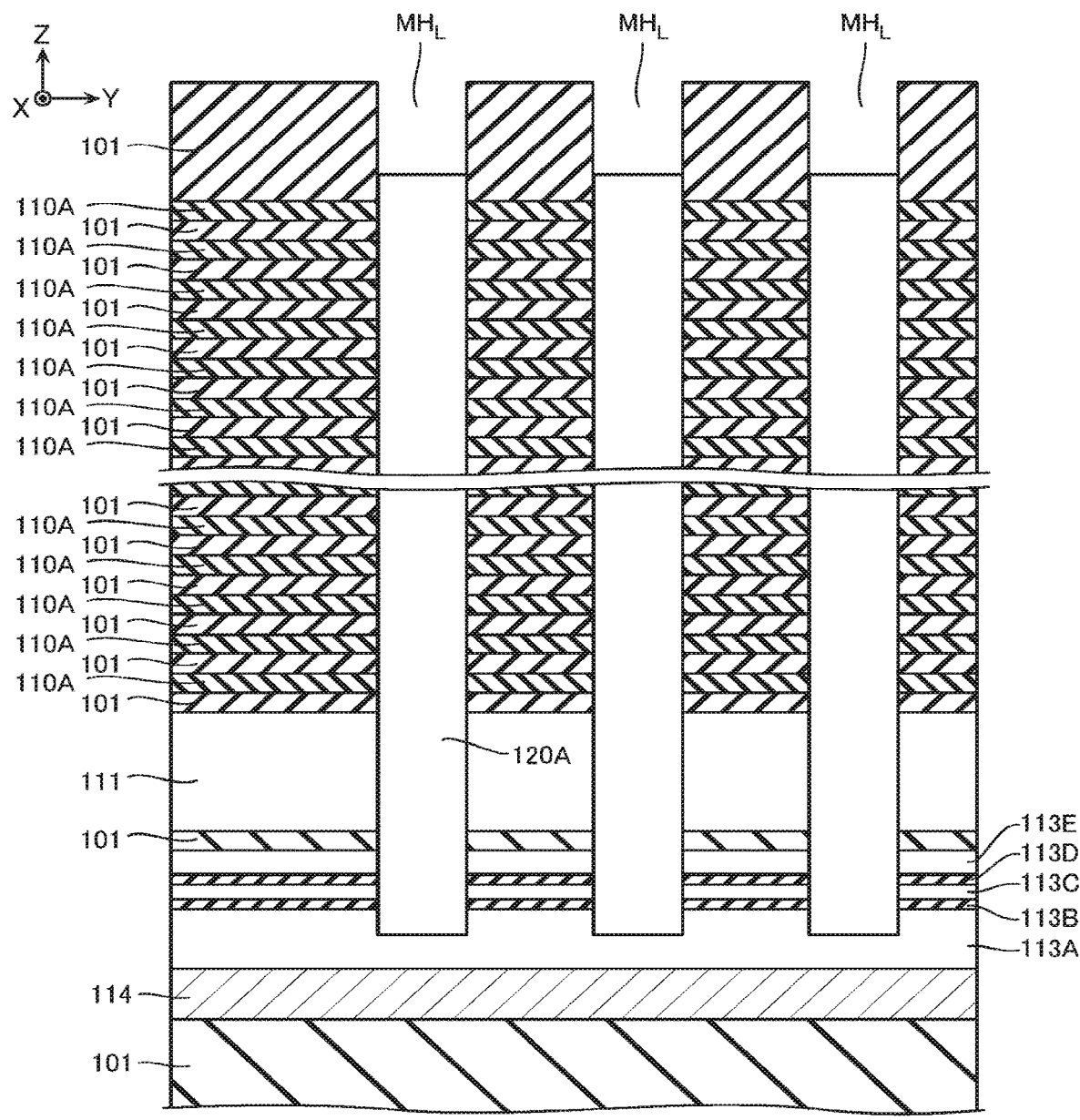
FIG. 24 is a schematic cross-sectional view illustrating the manufacturing method.

Next, for example, as illustrated in FIG. 24, a part of the amorphous silicon film 120A disposed on the upper surface of the uppermost insulating layer 101 is removed. This process is, for example, performed by a method, such as RIE.

Figure 25:
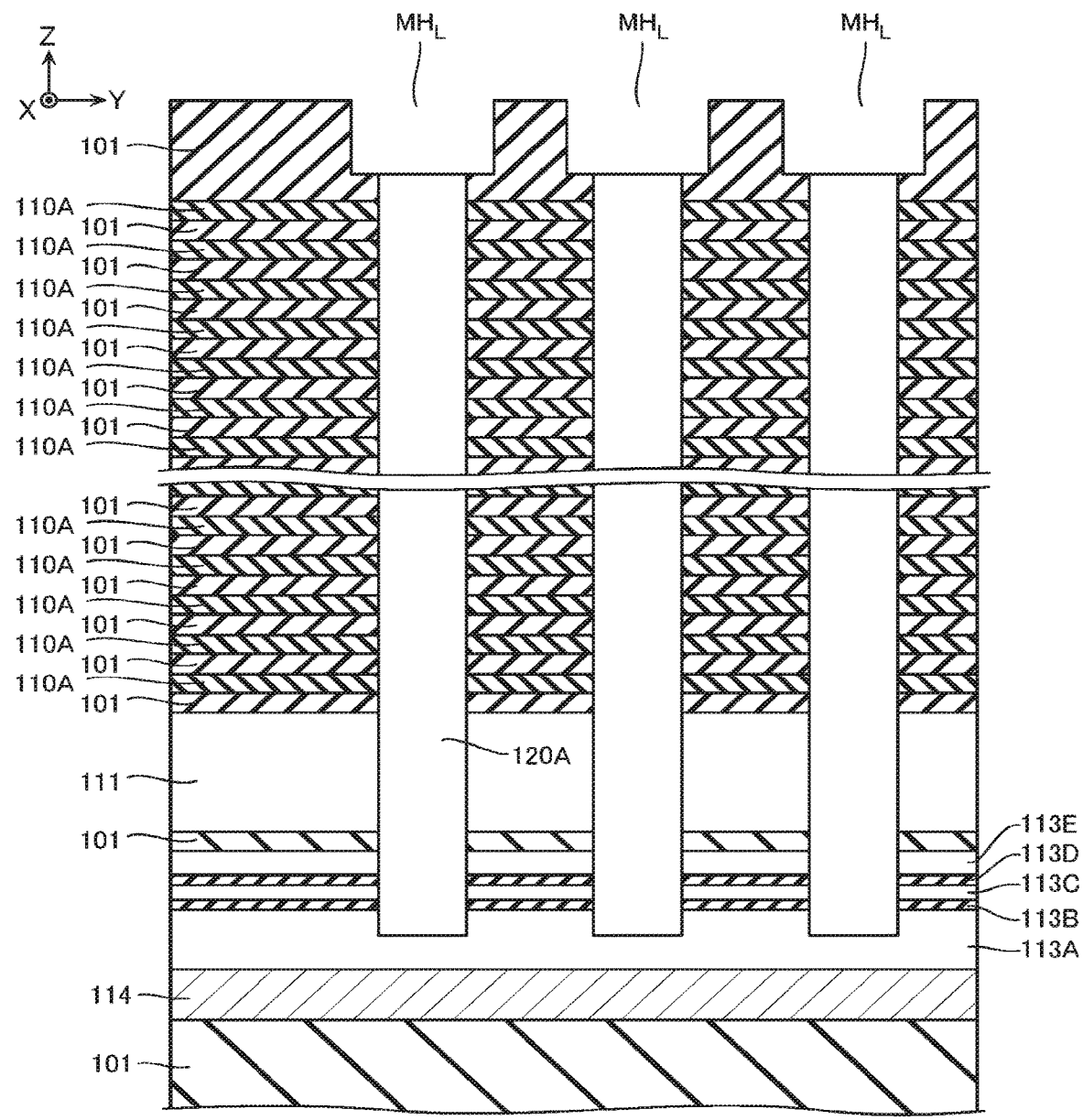
FIG. 25 is a schematic cross-sectional view illustrating the manufacturing method.

Next, for example, as illustrated in FIG. 25, a part of the uppermost insulating layers 101 are removed to expand radii of the upper ends of the memory holes $MH_L$. This process is, for example, performed by wet etching or the like.

Figure 26:
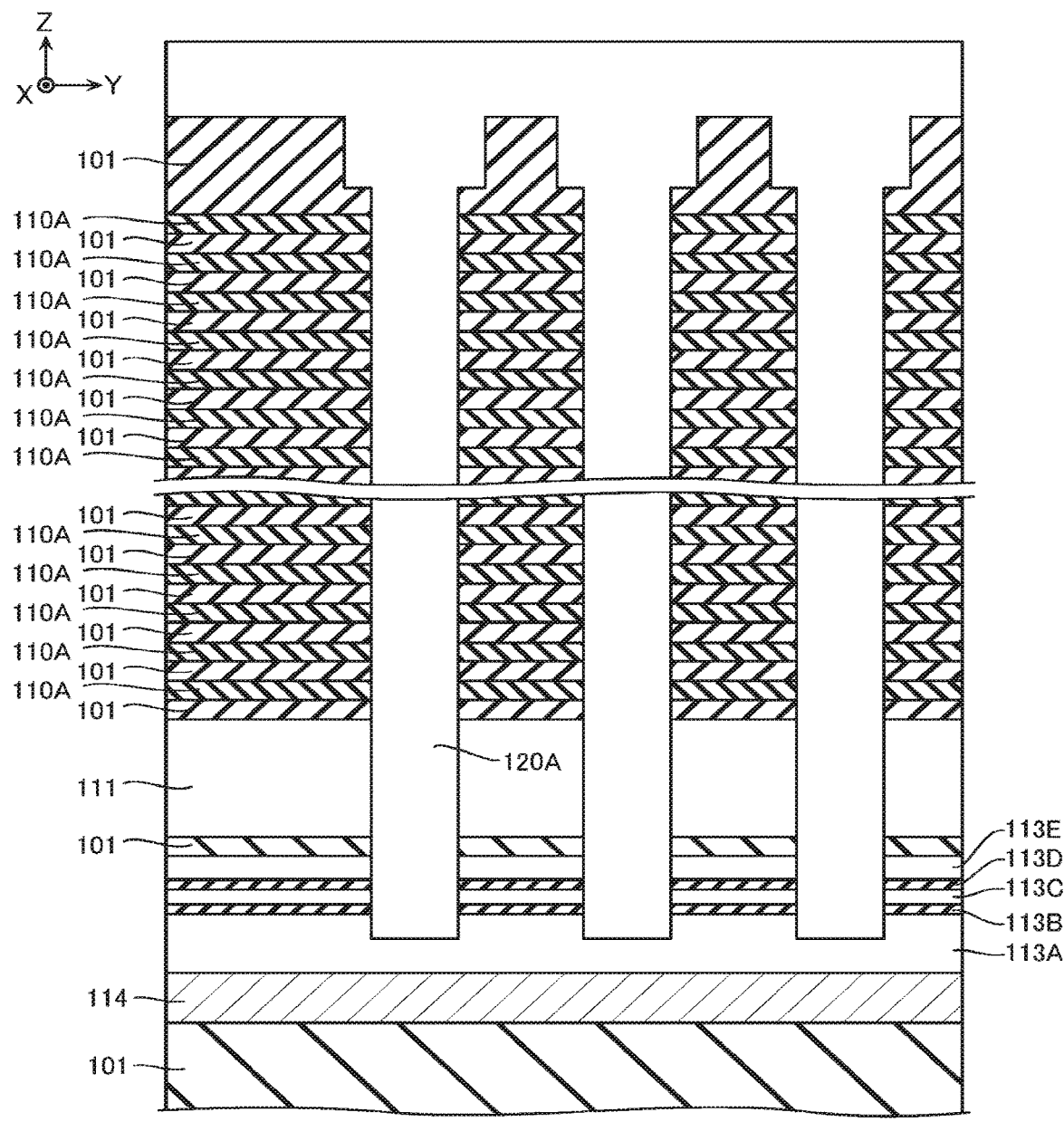
FIG. 26 is a schematic cross-sectional view illustrating the manufacturing method.

Next, for example, as illustrated in FIG. 26, the amorphous silicon films 120A are further formed on the upper surface of the uppermost insulating layer 101 and the inner circumferential surfaces of the memory holes $MH_L$. This process is, for example, performed by a method, such as CVD.

Figure 27:
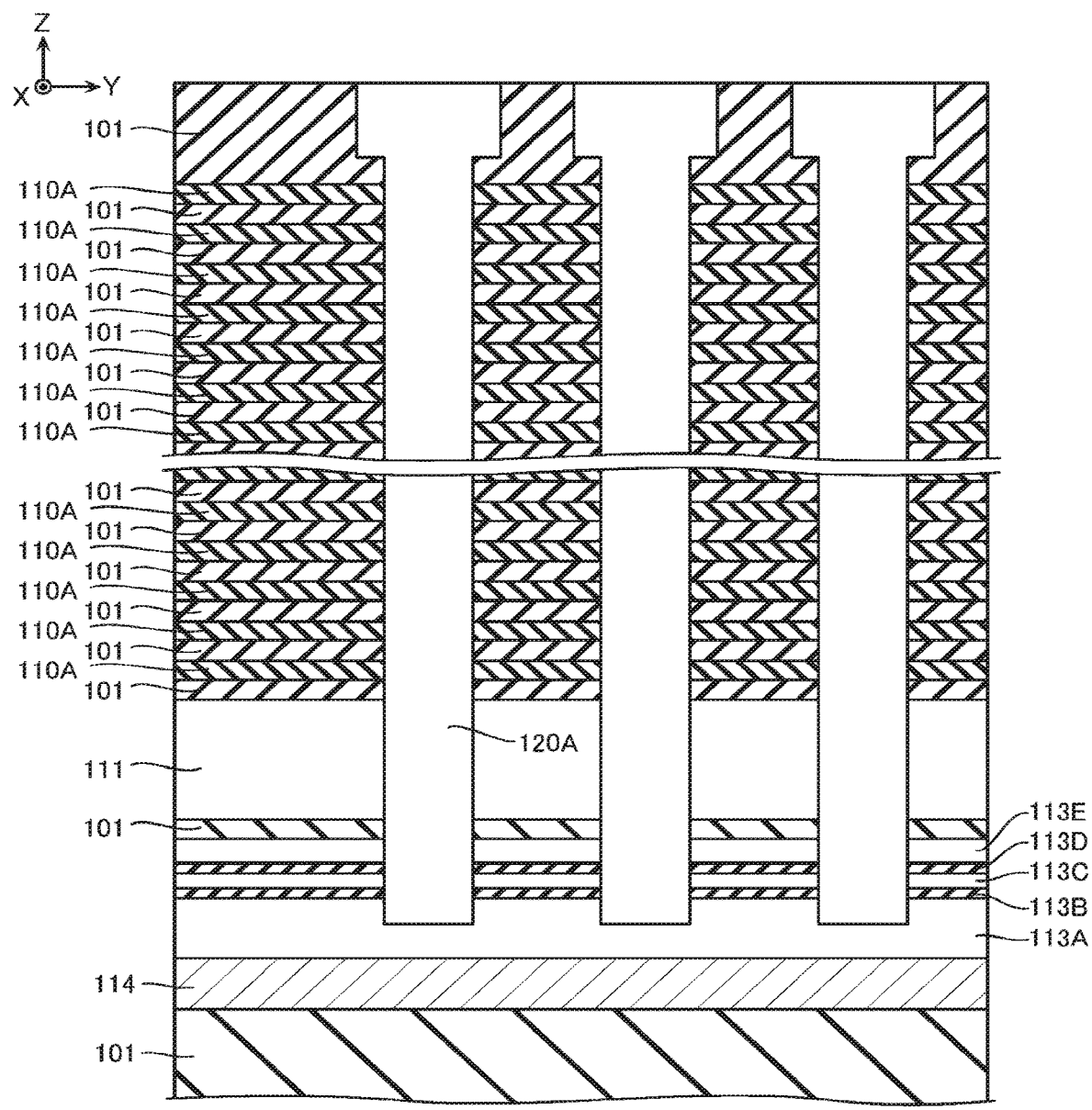
FIG. 27 is a schematic cross-sectional view illustrating the manufacturing method.

Next, for example, as illustrated in FIG. 27, a part of the amorphous silicon film 120A disposed on the upper surface of the uppermost insulating layer 101 is removed. This process is, for example, performed by a method, such as RIE.

Figure 28:
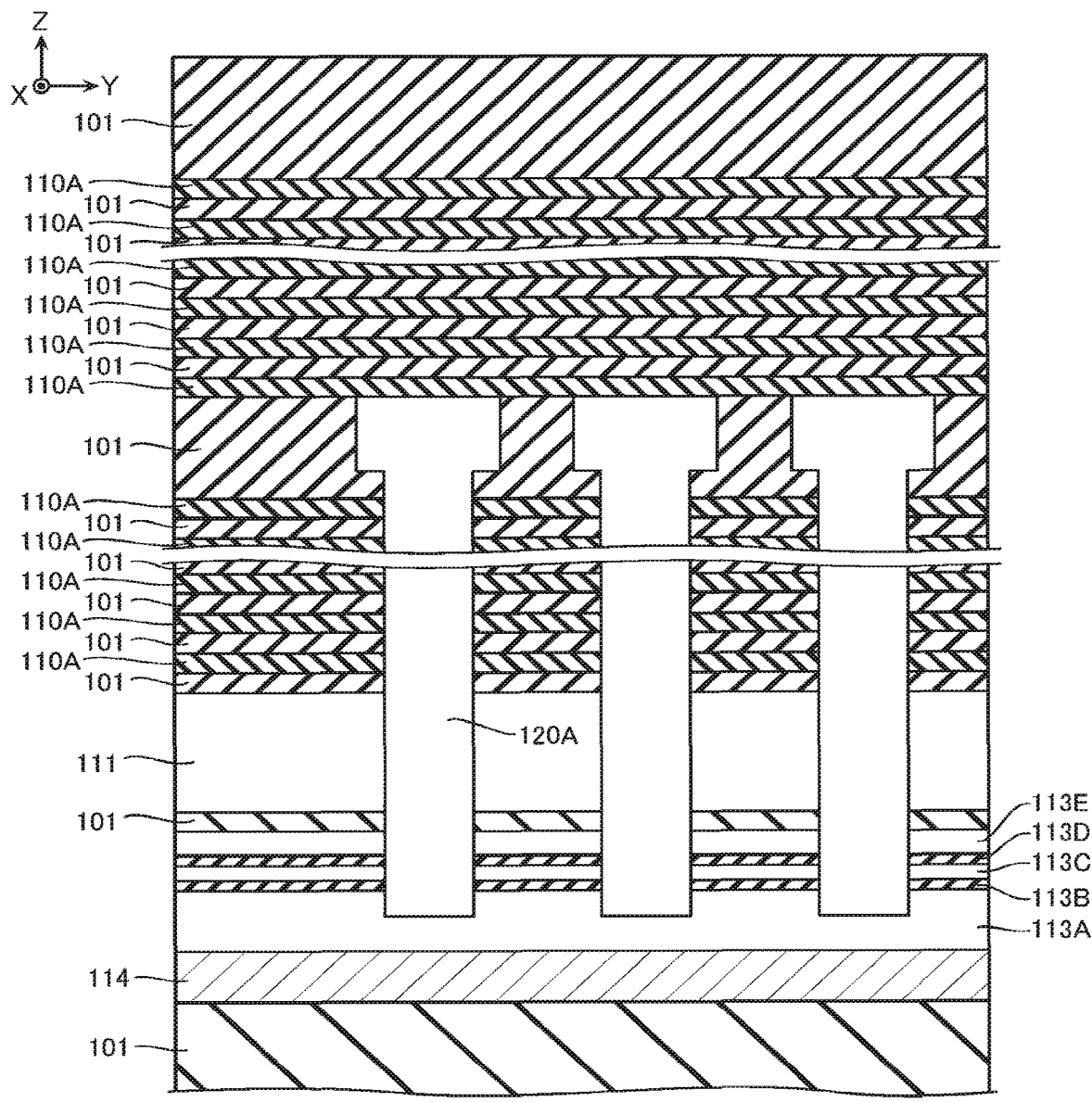
FIG. 28 is a schematic cross-sectional view illustrating the manufacturing method.

Next, for example, as illustrated in FIG. 28, on the upper surface of the structure described with reference to FIG. 27, the plurality of insulating layers 101 and the plurality of insulating layers 110A are formed in alternation. This process is, for example, performed by a method, such as CVD.

Next, the plurality of insulating layers 101 and the plurality of insulating layers 110A are processed to form a configuration of the substantially staircase pattern as described with reference to FIG. 7 and the like.

Figure 29:
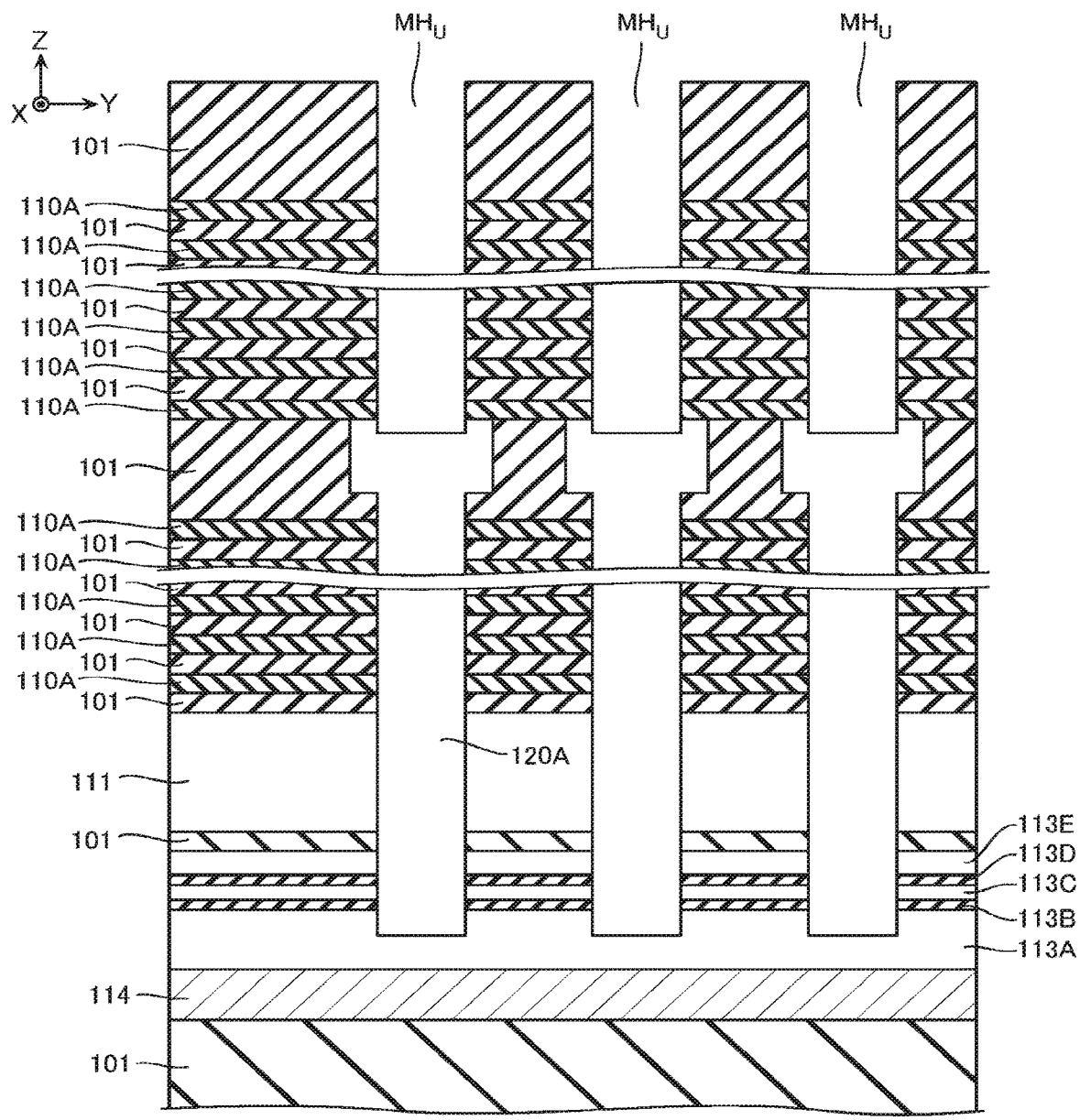
FIG. 29 is a schematic cross-sectional view illustrating the manufacturing method.
Figure 30:
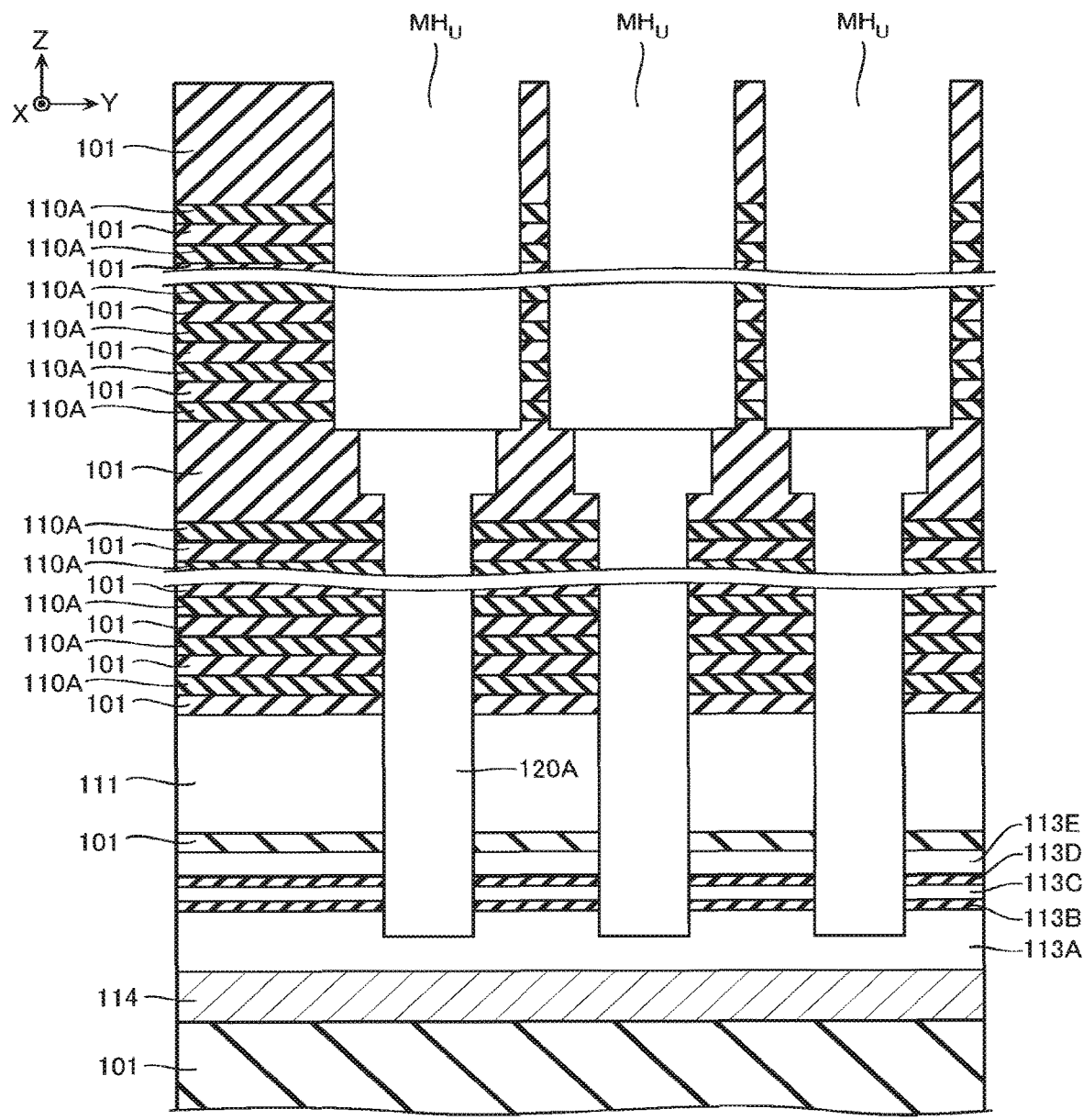
FIG. 30 is a schematic cross-sectional view illustrating the manufacturing method.

Next, for example, as illustrated in FIG. 29 and FIG. 30, a plurality of memory holes $MH_U$ are formed at positions corresponding to the semiconductor layers 120 and the semiconductor layers 220. The memory holes $MH_U$ are formed not only in the memory hole regions $R_{MH}$ (FIG. 6, FIG. 13) but also in the inspection regions $R_E$ (FIG. 13). The memory hole $MH_U$ is a through-hole that extends in the Z direction, penetrates the insulating layers 101 and the insulating layers 110A to expose the upper surface of the amorphous silicon film 120A. This process is, for example, performed by a method, such as RIE.

Note that, in this process, the entire upper surface of the amorphous silicon film 120A embedded into the memory hole $MH_L$ on the lower side formed in the inspection region $R_E$ and a part of the insulating layer 101 disposed on the outer peripheral surface of the amorphous silicon film 120A are exposed in the bottom surface of the memory hole $MH_U$ on the upper side formed in the inspection region $R_E$.

Figure 31:
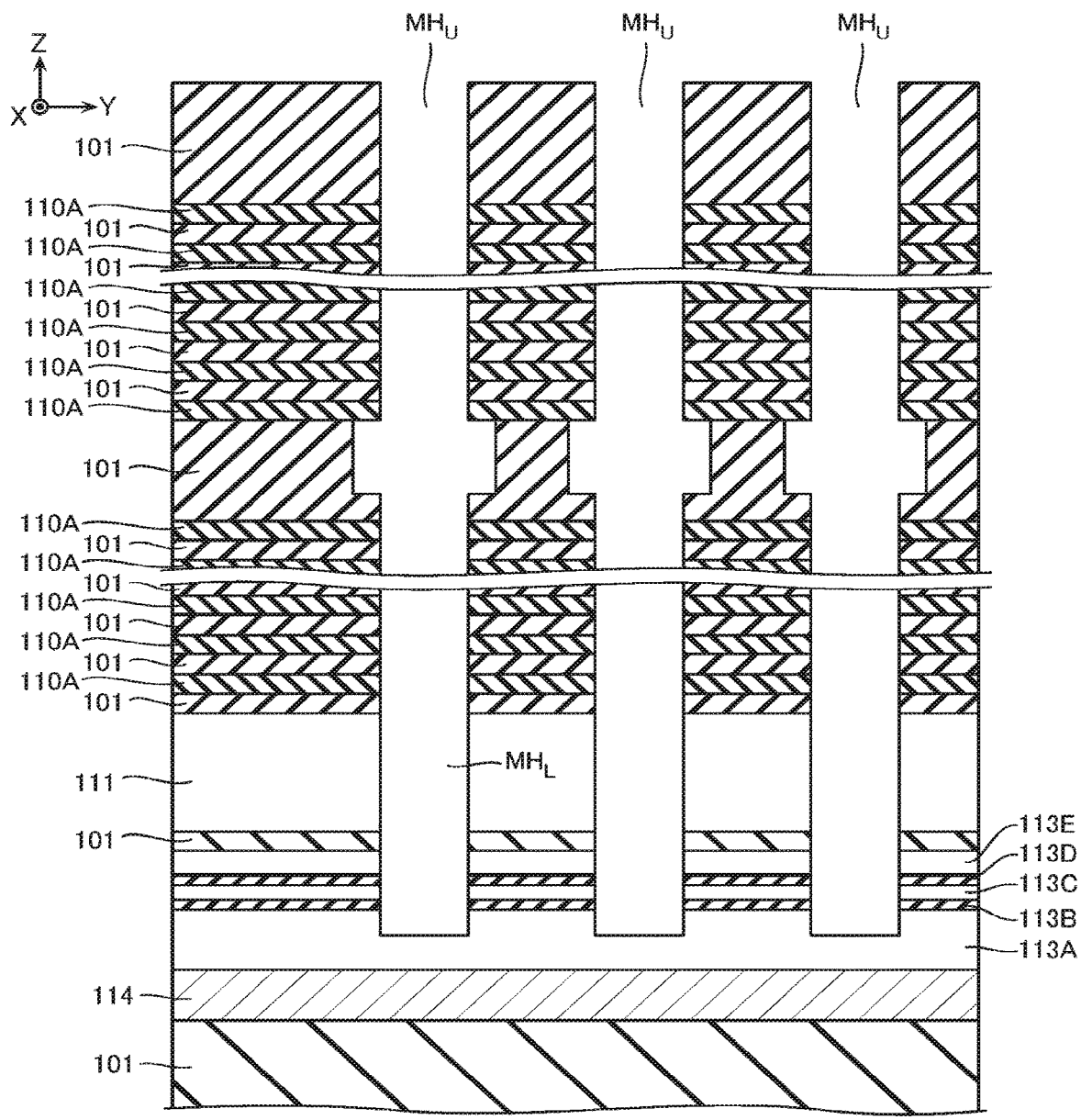
FIG. 31 is a schematic cross-sectional view illustrating the manufacturing method.
Figure 32:
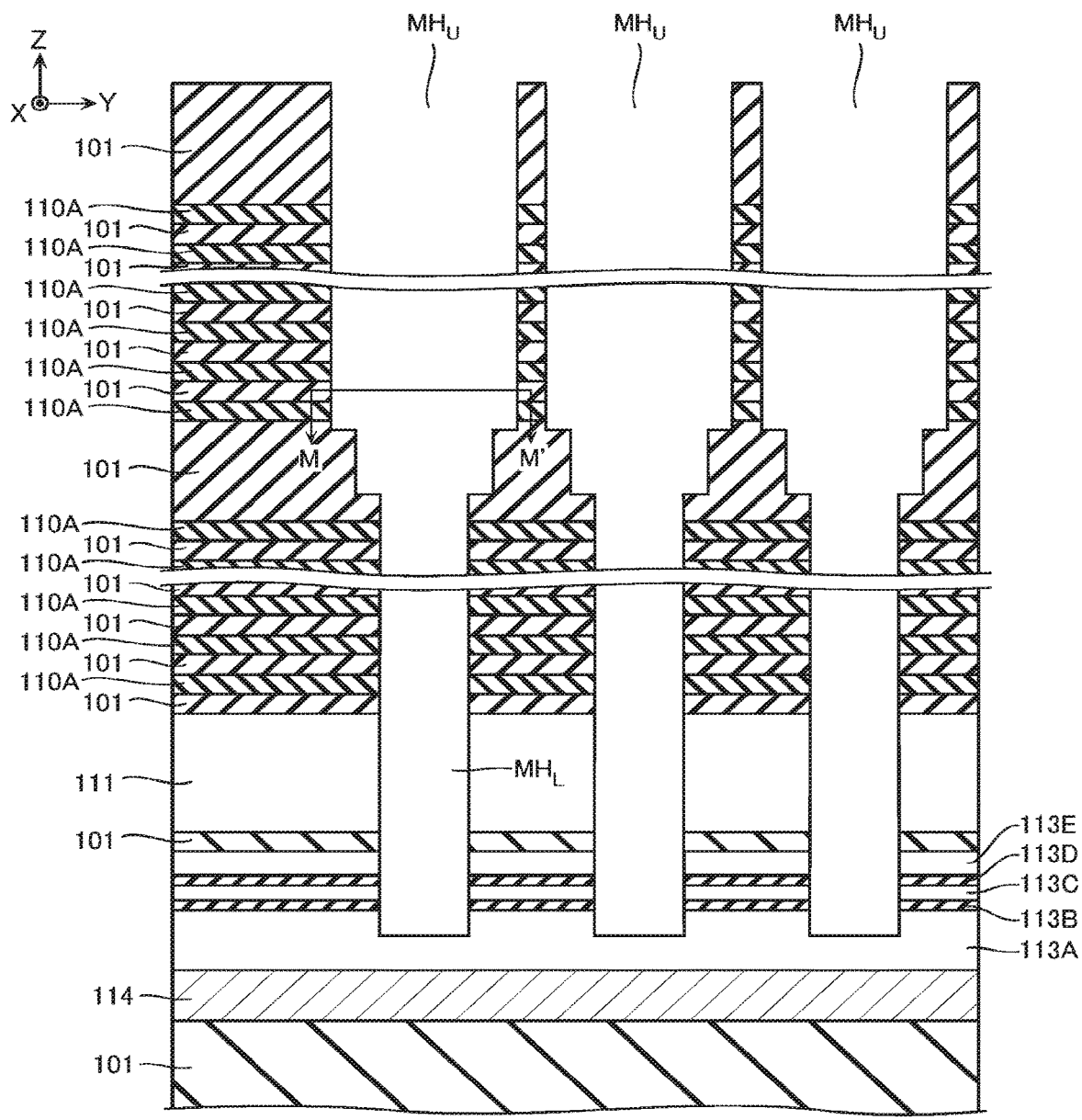
FIG. 32 is a schematic cross-sectional view illustrating the manufacturing method.

Next, for example, as illustrated in FIG. 31 and FIG. 32, the amorphous silicon films 120A are removed. This process is, for example, performed by wet etching or the like.

Figure 33:
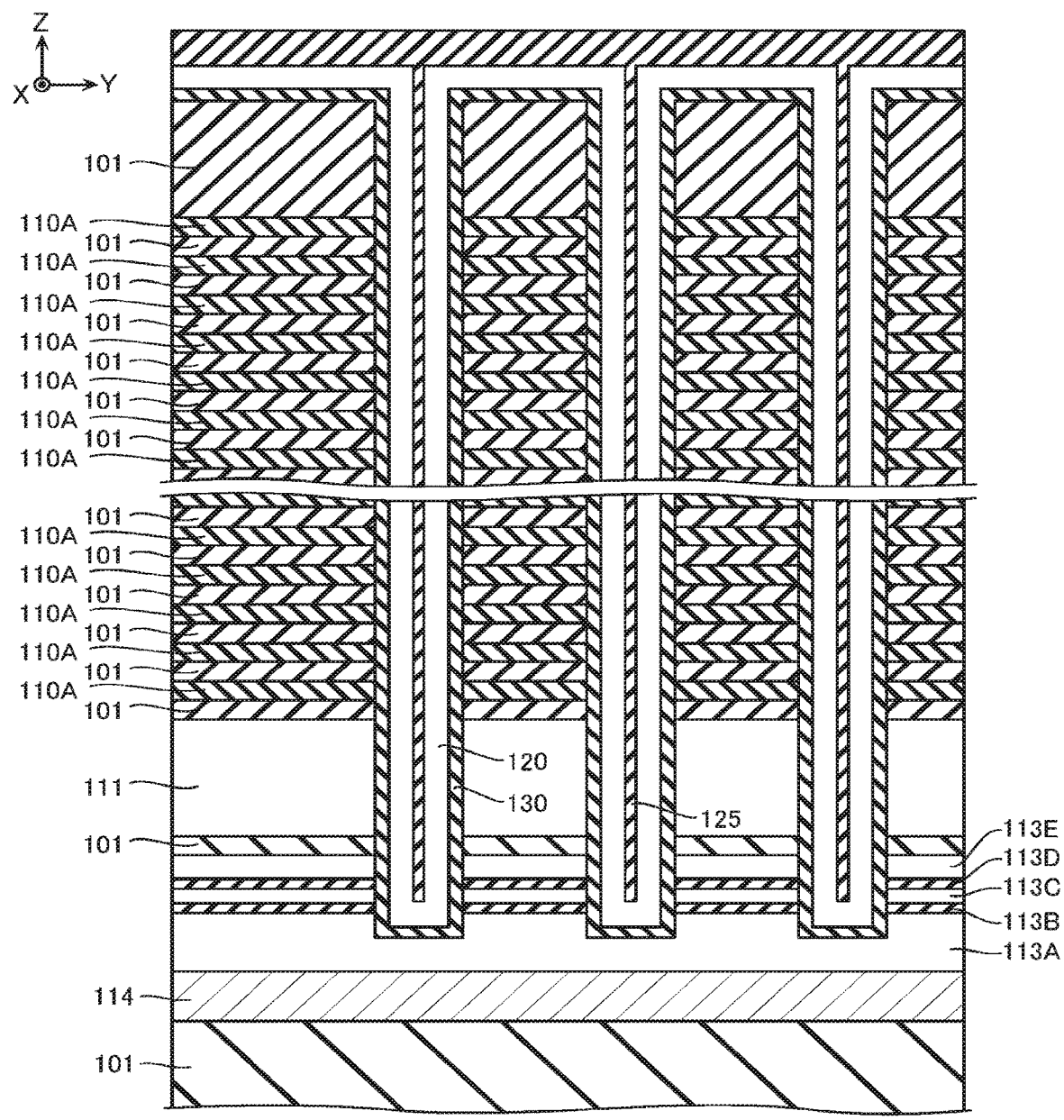
FIG. 33 is a schematic cross-sectional view illustrating the manufacturing method.

Next, for example, as illustrated in FIG. 33, the gate insulating film 130, the semiconductor layer 120, and the insulating layer 125 are formed on the upper surface of the uppermost insulating layers 101 and the inner circumferential surfaces of the memory holes $MH_L$, $MH_U$. In this process, for example, film formation by CVD or the like is performed, and an amorphous silicon film is formed inside the memory hole $MH_L$, $MH_U$. For example, by annealing process or the like, a crystalline structure of this amorphous silicon film is modified.

Figure 34:
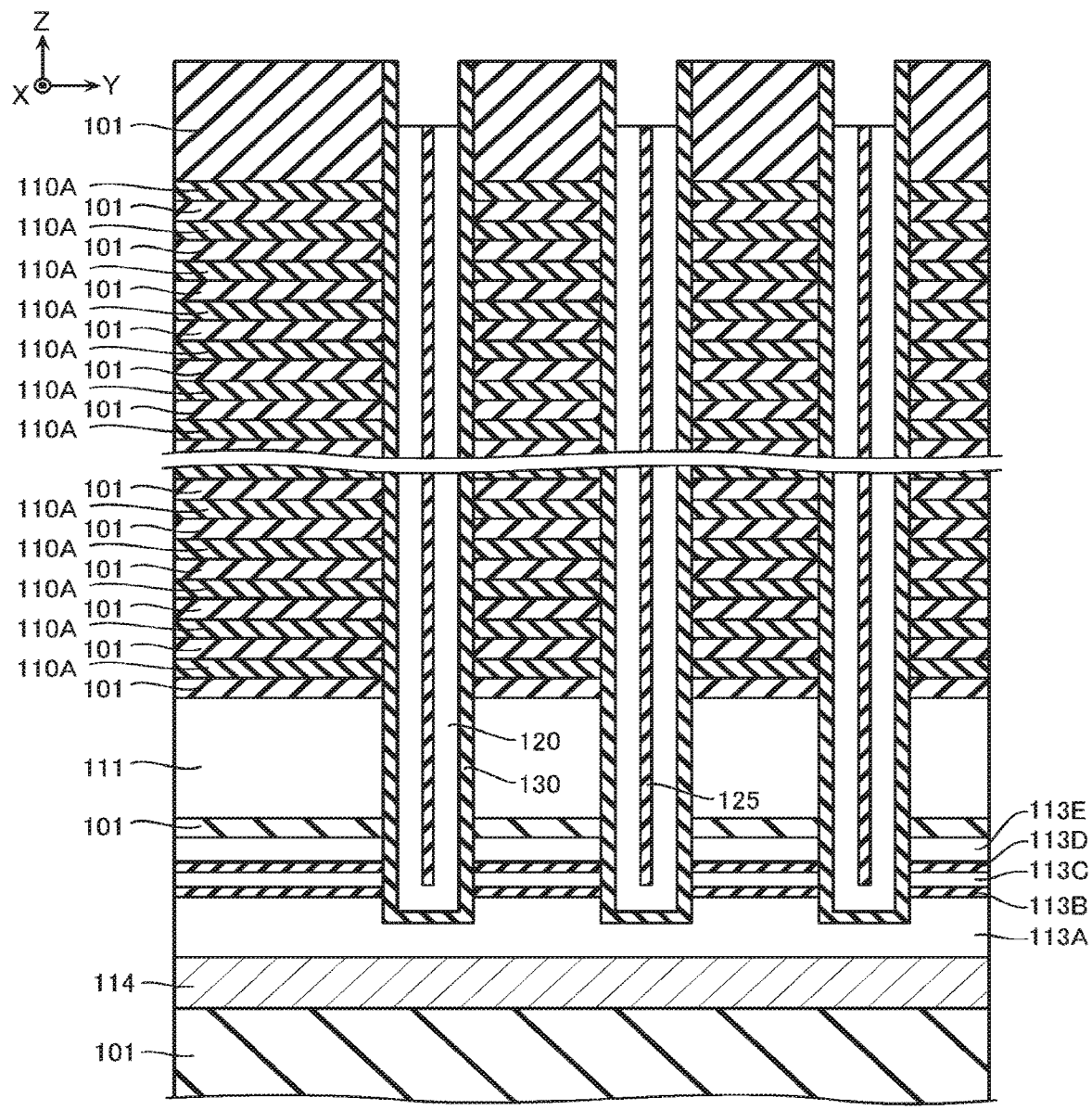
FIG. 34 is a schematic cross-sectional view illustrating the manufacturing method.

Next, for example, as illustrated in FIG. 34, a part of the insulating layer 125, the semiconductor layer 120, and the gate insulating film 130 are removed to expose the insulating layer 101 positioned at the uppermost. This process is, for example, performed by a method, such as RIE.

Figure 35:
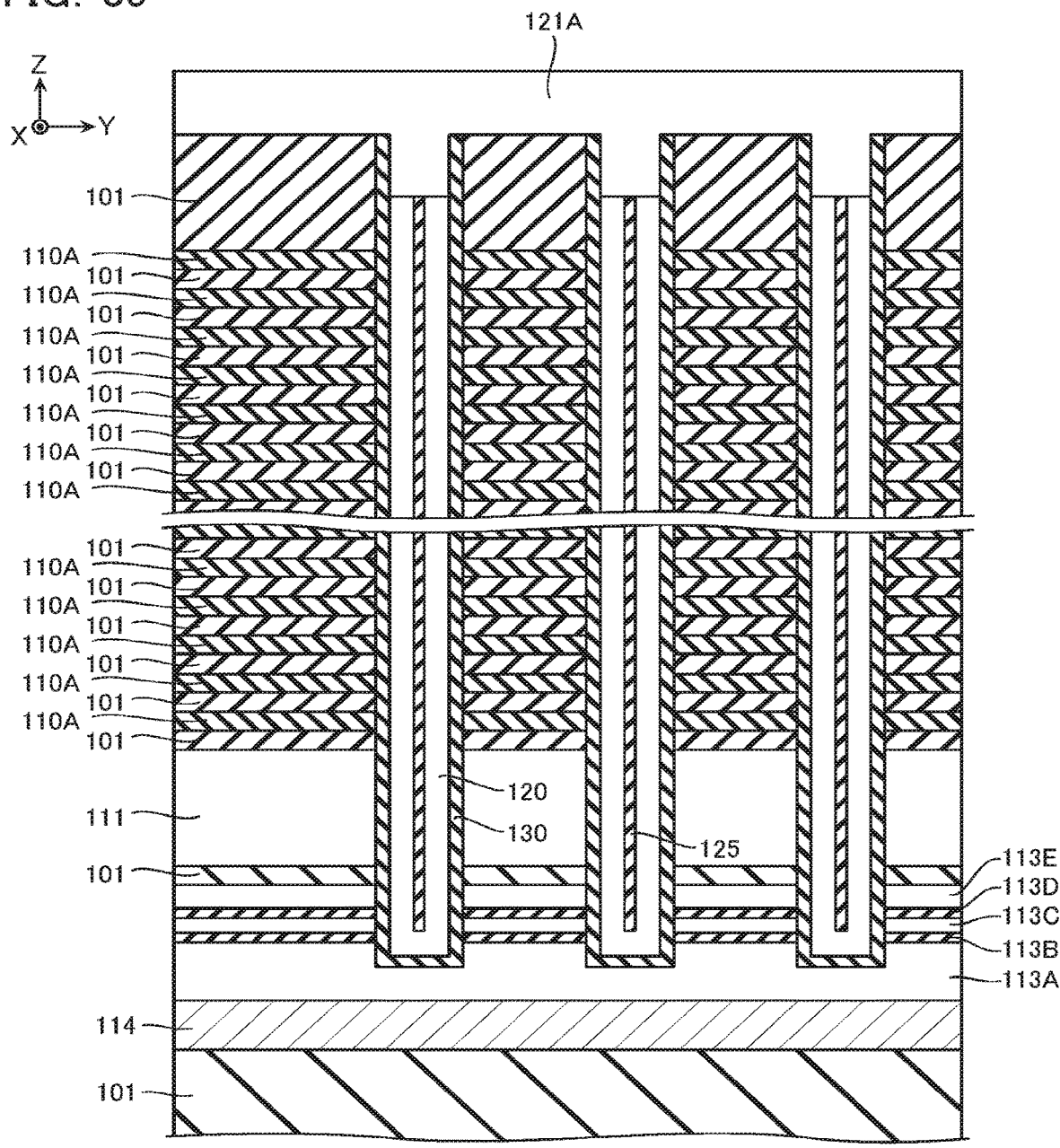
FIG. 35 is a schematic cross-sectional view illustrating the manufacturing method.

Next, for example, as illustrated in FIG. 35, a semiconductor layer 121A is formed near the upper ends of the memory holes $MH_U$. The semiconductor layer 121A contains, for example, amorphous silicon containing N type impurities, such as phosphorus (P). This process is, for example, performed by a method, such as CVD.

Figure 36:
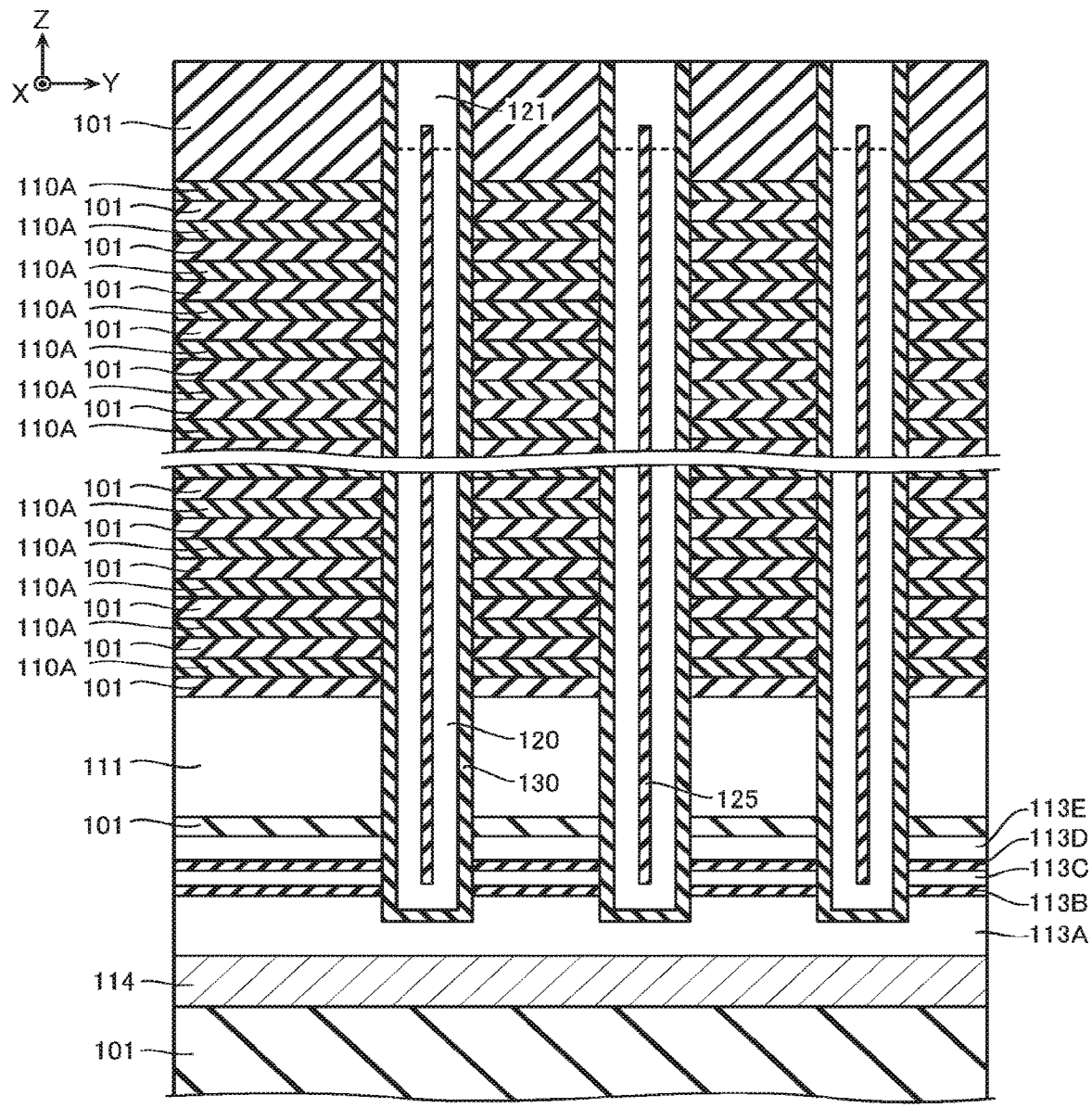
FIG. 36 is a schematic cross-sectional view illustrating the manufacturing method.
Figure 37:
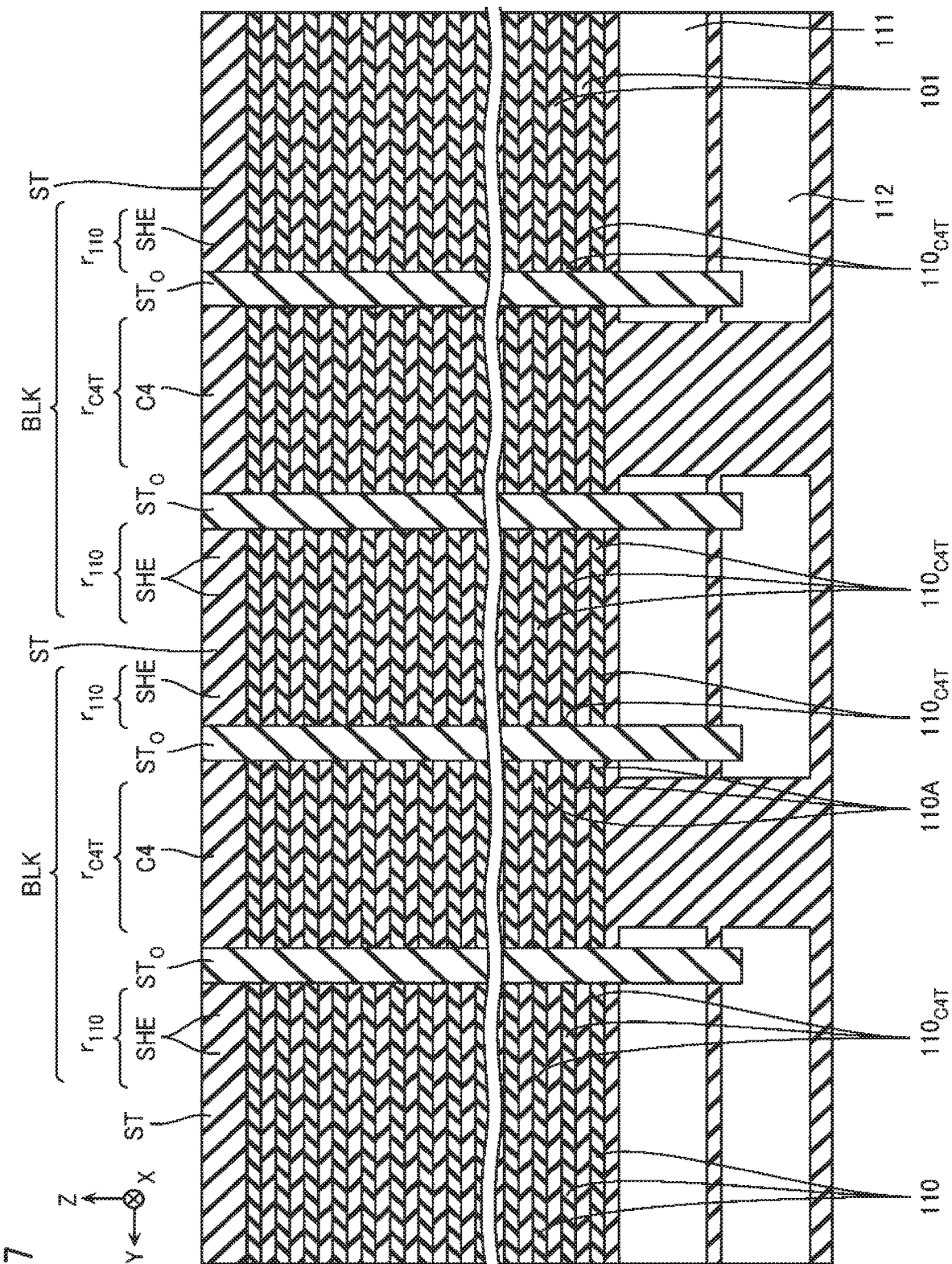
FIG. 37 is a schematic cross-sectional view illustrating the manufacturing method.

Next, for example, as illustrated in FIG. 36, impurity regions 121 of the semiconductor layers 120 are formed near the upper ends of the memory holes $MH_U$. In this process, for example, a part of the semiconductor layer 121A is removed by a method, such as RIE, to expose the insulating layers 101 positioned at the uppermost.

Next, for example, as illustrated in FIG. 37, the insulating layers $ST_O$ are formed. In this process, for example, grooves are formed at positions corresponding to the insulating layers $ST_O$, by a method, such as RIE. The insulating layers $ST_O$ are formed inside the grooves by a method, such as CVD.

Figure 38:
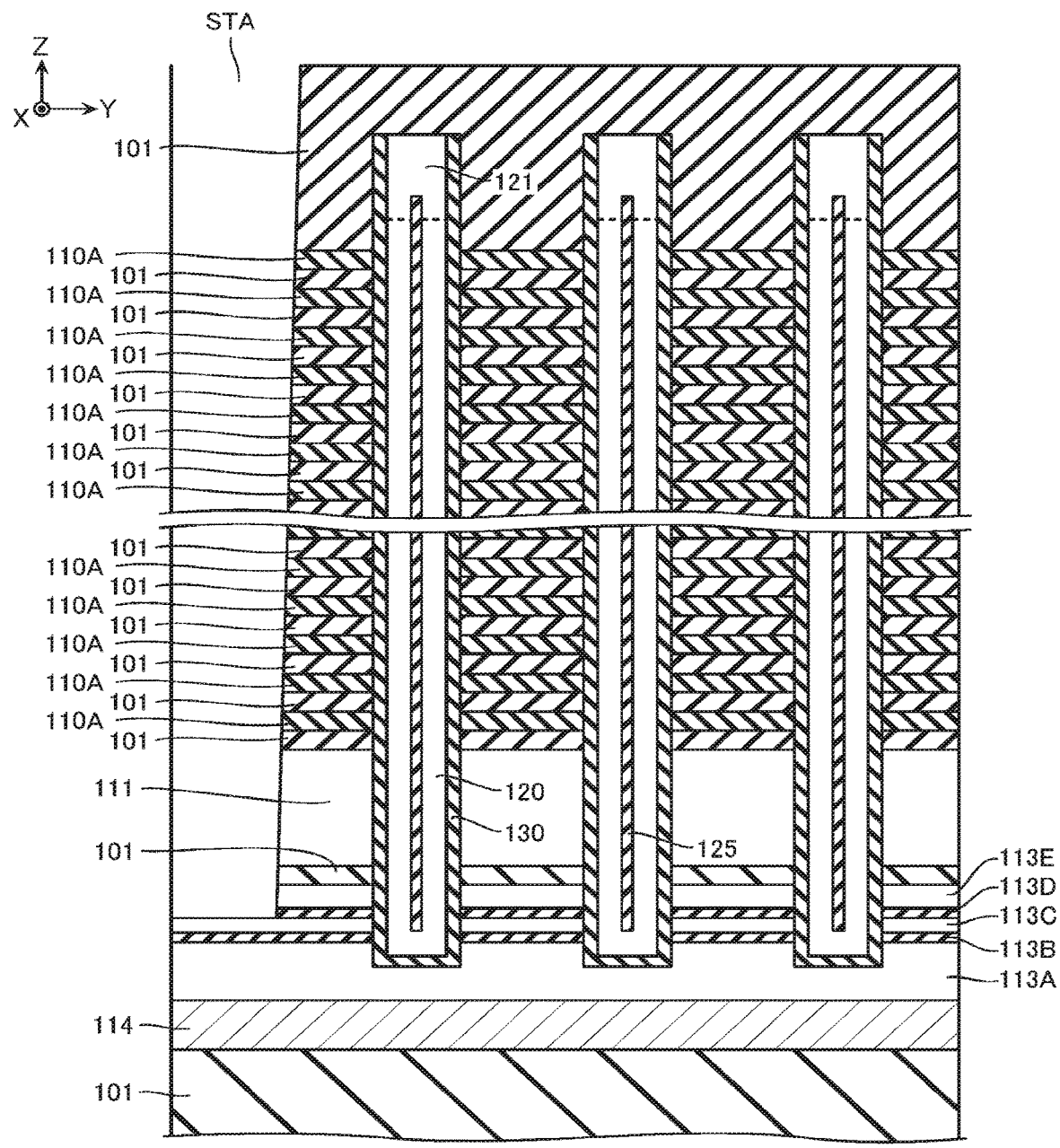
FIG. 38 is a schematic cross-sectional view illustrating the manufacturing method.

Next, for example, as illustrated in FIG. 38, a groove STA is formed. The groove STA is a groove that extends in the Z direction and the direction, separates the insulating layers 101 and the insulating layers 110A, the conducting layer 111, the semiconductor layer 113E, and the insulating layer 113D in the Y direction to expose the upper surface of the semiconductor layer 113C. This process is, for example, performed by a method, such as RIE. In this embodiment, the groove STA is not formed in the inspection region $R_E$.

Figure 39:
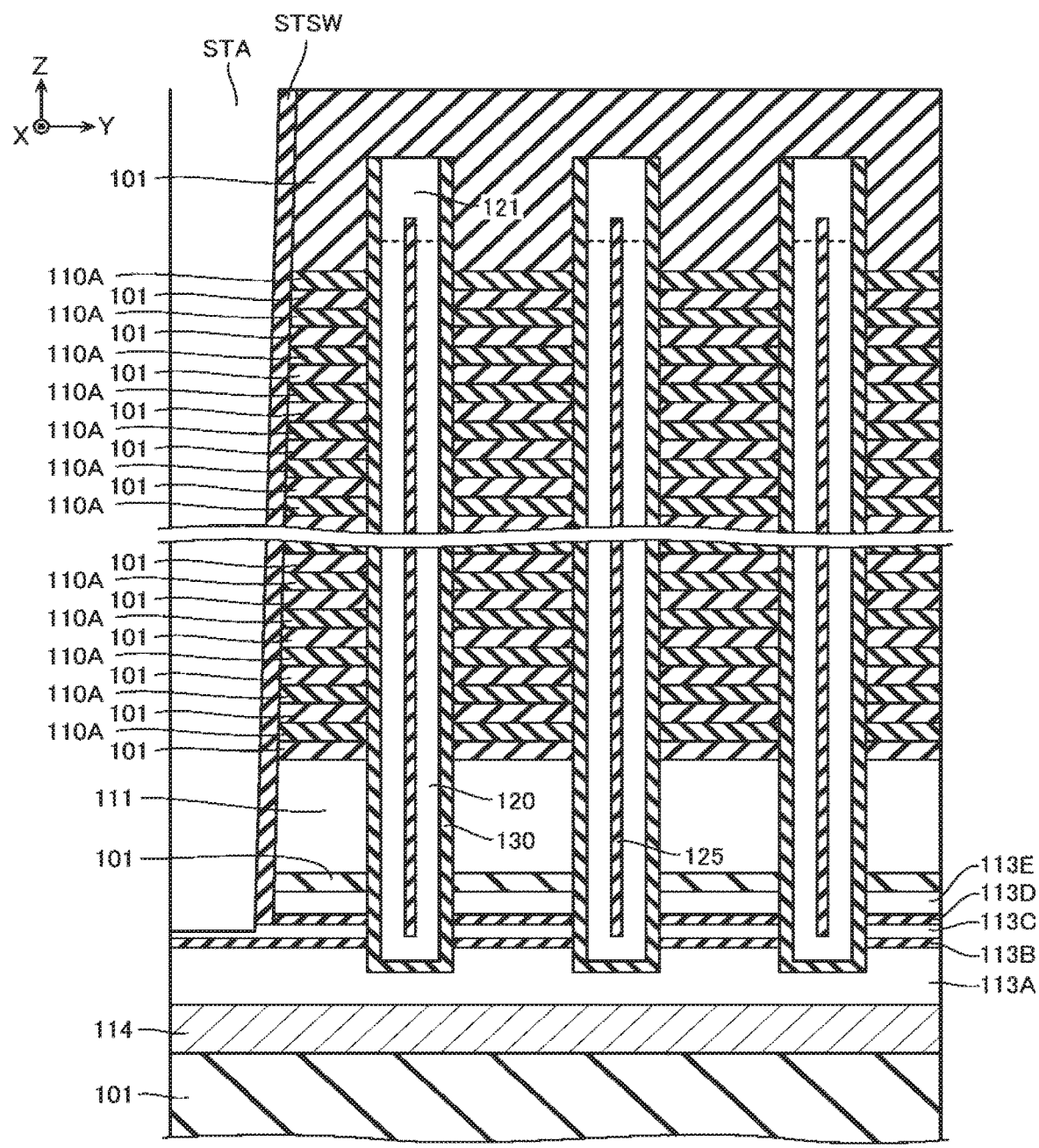
FIG. 39 is a schematic cross-sectional view illustrating the manufacturing method.

Next, for example, as illustrated in FIG. 39, a protective film STSW, such as silicon nitride, is formed on a side surface in the Y direction of the groove STA. In this process, for example, an insulating film, such as silicon nitride, is formed on the side surface in the Y direction and the bottom surface of the groove STA by a method, such as CVD. By a method, such as RIE, a part of this insulating film that covers the bottom surface of the groove STA is removed.

Figure 40:
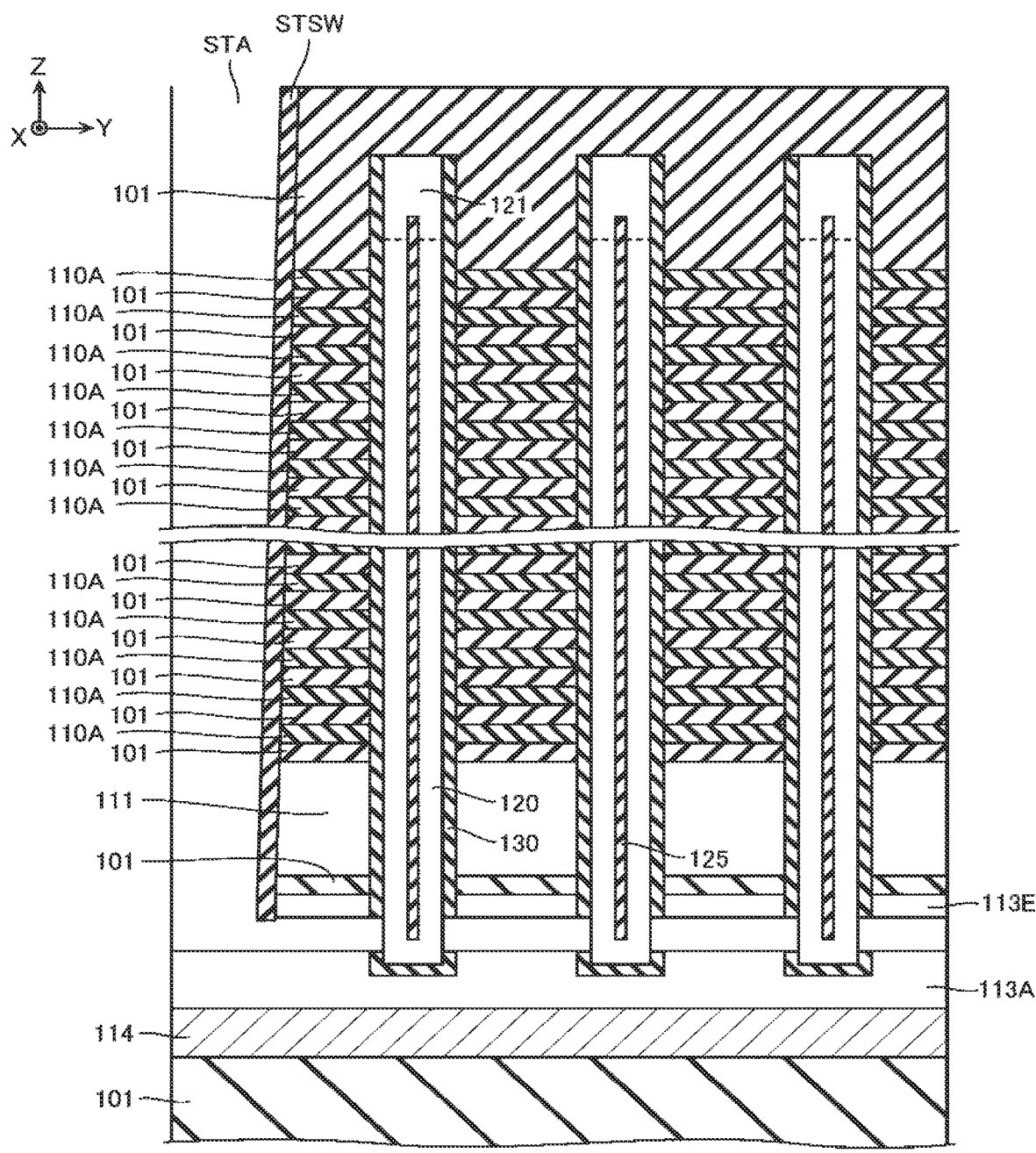
FIG. 40 is a schematic cross-sectional view illustrating the manufacturing method.

Next, for example, as illustrated in FIG. 40, a part of the insulating layers 113B, the semiconductor layers 113C, and the insulating layers 113D and the gate insulating films 130 are removed to expose a part of the semiconductor layers 120. This process is, for example, performed by a method, such as wet etching.

Figure 41:
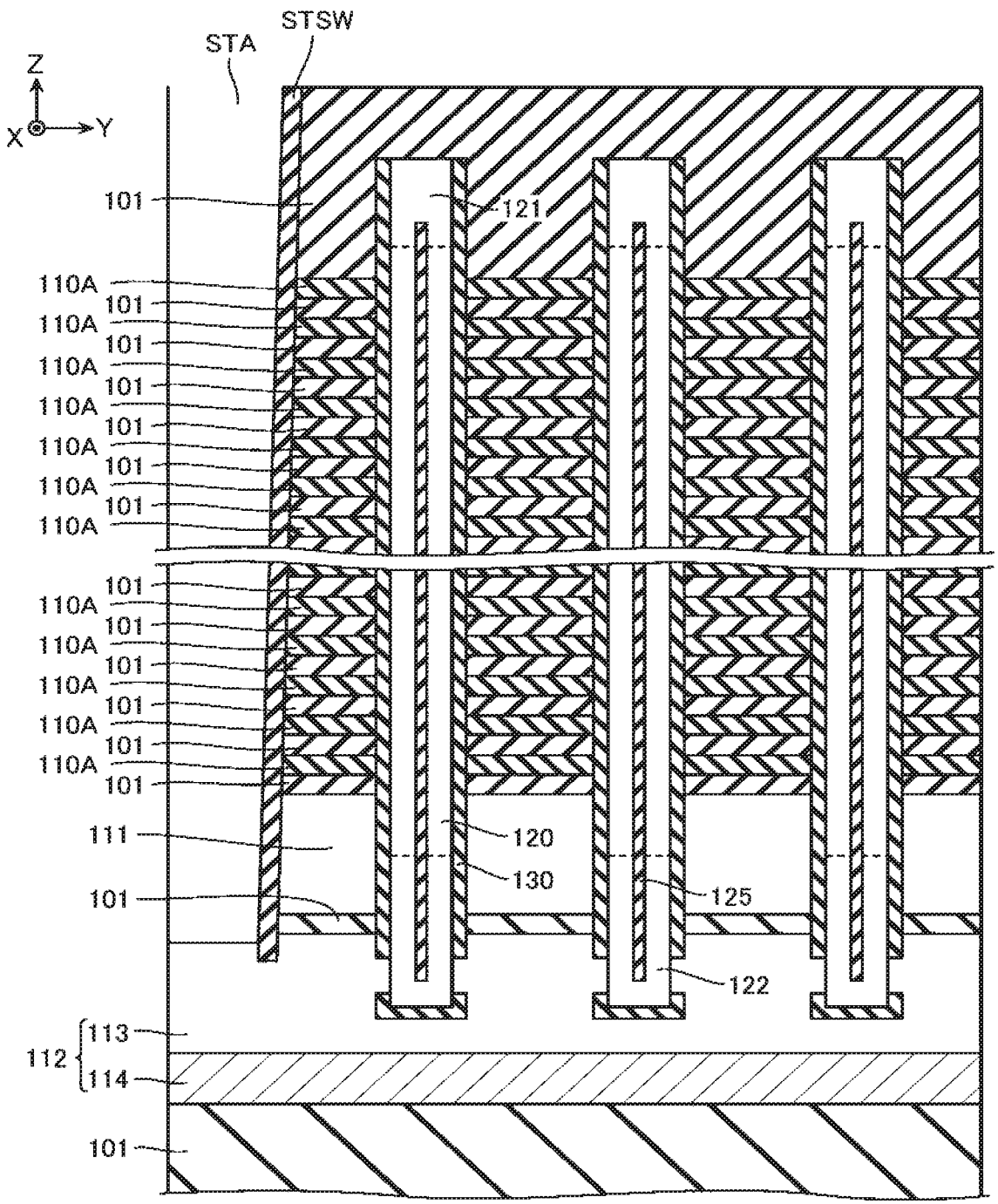
FIG. 41 is a schematic cross-sectional view illustrating the manufacturing method.

Next, for example, as illustrated in FIG. 41, the semiconductor layer 113 is formed. The process is, for example, performed by a method, such as epitaxial growth.

Figure 42:
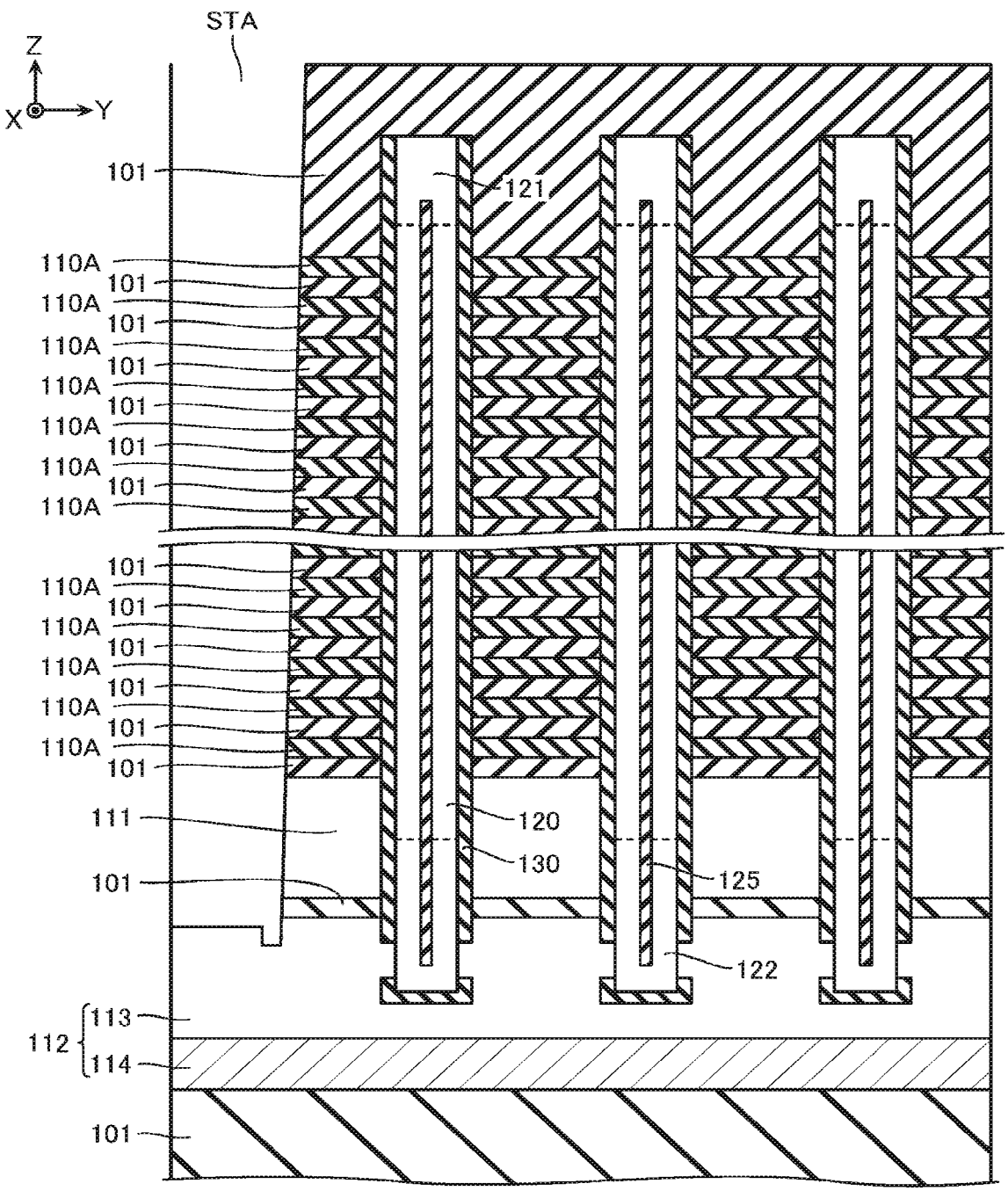
FIG. 42 is a schematic cross-sectional view illustrating the manufacturing method.

Next, for example, as illustrated in FIG. 42, the protective film STSW is removed. This process is, for example, performed by a method, such as wet etching.

Figure 43:
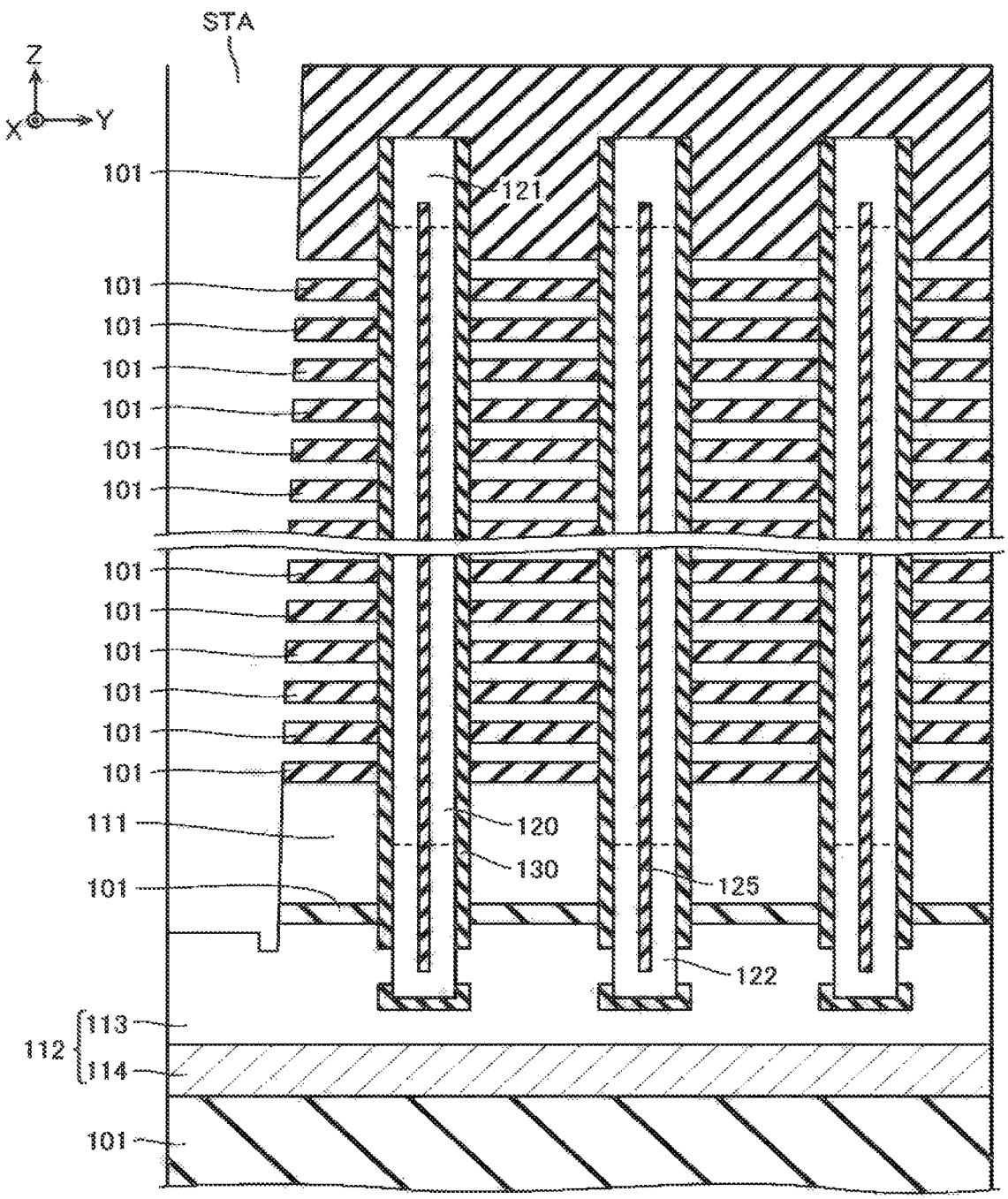
FIG. 43 is a schematic cross-sectional view illustrating the manufacturing method.

Next, for example, as illustrated in FIG. 43, the insulating layers 110A are removed via the groove STA. Thus, the hollow structure including the plurality of insulating layers 101 arranged in the Z direction and the structures in the memory holes $MH_L$, $MH_U$ to support the insulating layers 101 (the semiconductor layers 120, the gate insulating films 130, and the insulating layers 125) is formed. This process is, for example, performed by a method, such as wet etching.

As illustrated in FIG. 44, in this process, the insulating layers 110A remain in the contact connection sub-region $r_{C4T}$. As illustrated in FIG. 45, the insulating layers 110A remain in the contact connection region $R_{BLT}$. As illustrated in FIG. 19, the insulating layers 110A remain in the inspection region $R_E$.

Figure 46:
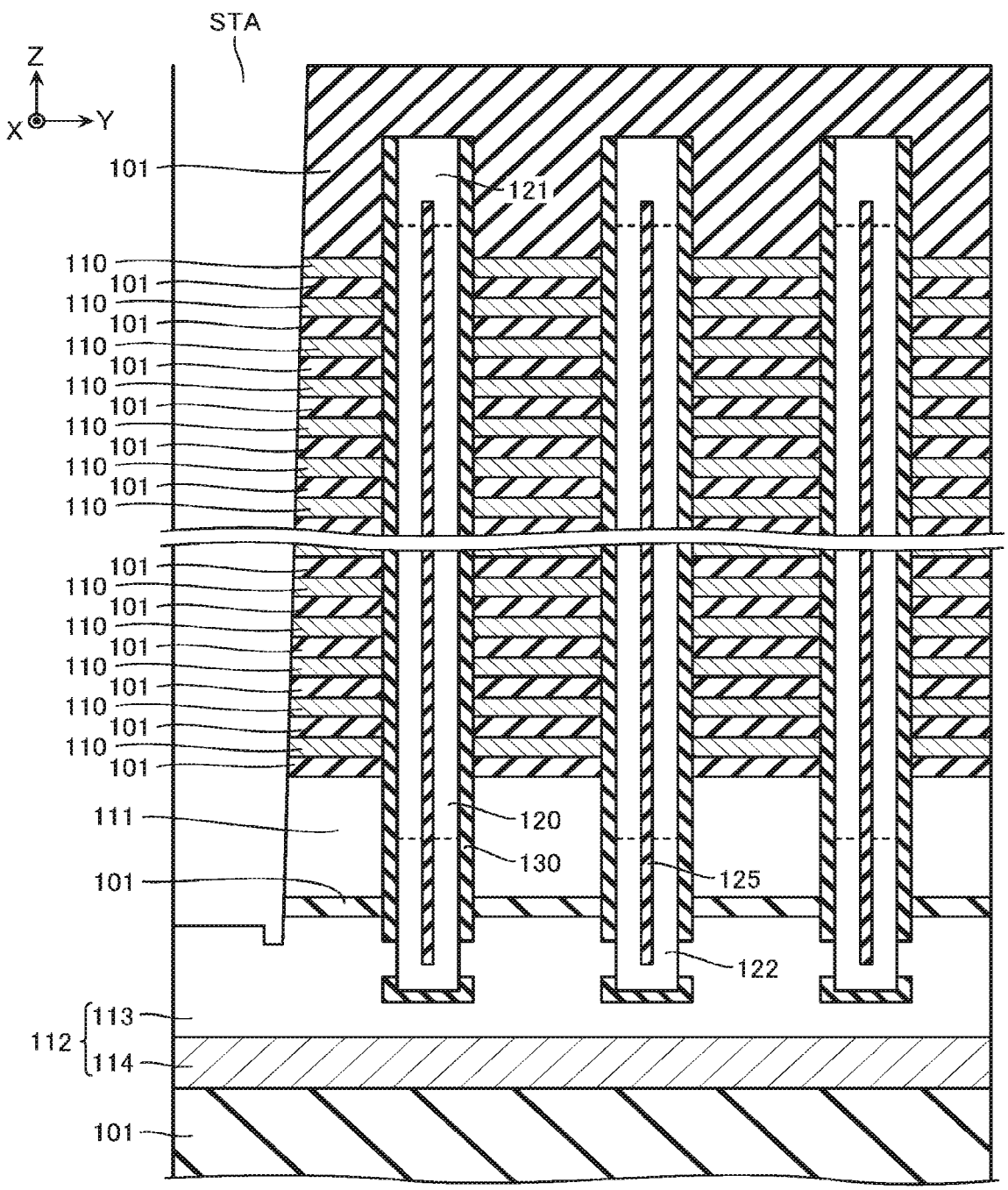
FIG. 46 is a schematic cross-sectional view illustrating the manufacturing method.

Next, for example, as illustrated in FIG. 46, the conducting layers 110 are formed. This process is, for example, performed by a method, such as CVD.

Figure 47:
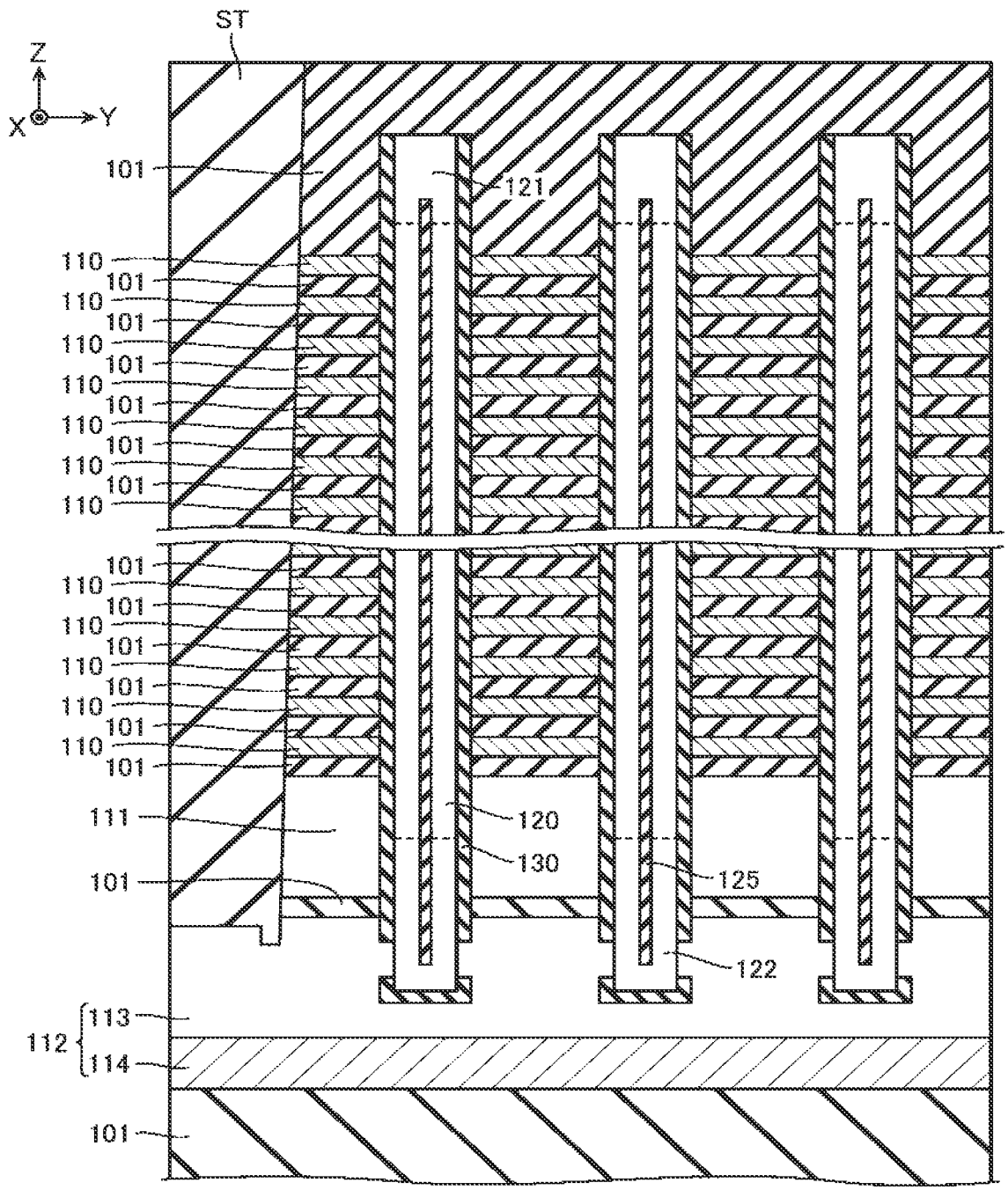
FIG. 47 is a schematic cross-sectional view illustrating the manufacturing method.

Next, for example, as illustrated in FIG. 47, the inter-block insulating layer ST is formed in the groove STA. This process is performed, for example, by a method, such as CVD and RIE.

Afterwards, for example, the inter-string unit insulating layer SHE described with reference to FIG. 10 and the like, the contacts CC described with reference to FIG. 7, and the like, the wirings and the like described with reference to FIG. 7 are formed and the wafer is divided by dicing to form the memory die MD.

[Effects of First Embodiment]

Figure 48:
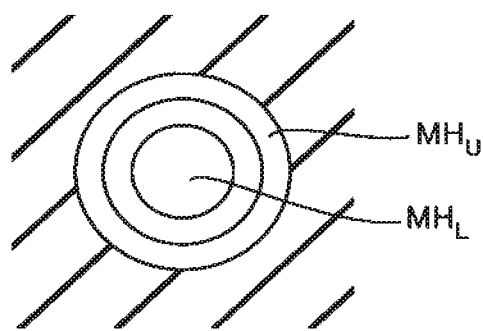
FIG. 48 is a schematic cross-sectional view taking the structure illustrated in FIG. 32 along the line M-M' and viewed along the arrow direction.
Figure 49:
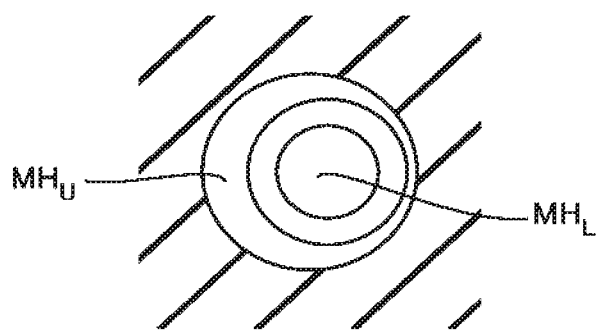
FIG. 49 is a schematic cross-sectional view taking the structure illustrated in FIG. 32 along the line M-M' and viewed along the arrow direction.

FIG. 48 and FIG. 49 are schematic cross-sectional views taking the structure illustrated in FIG. 32 along the line M-M' and viewed along the arrow direction.

In the manufacturing method according to the embodiment, in the process described with reference to FIG. 22, the memory holes $MH_L$ on the lower side are batch-formed in the memory hole regions $R_{MH}$ and the inspection regions $R_E$. In the process described with reference to FIG. 29 and FIG. 30, the memory holes $MH_U$ on the upper side are batch-formed in the memory hole regions $R_{MH}$ and the inspection regions $R_E$. Therefore, when the positions of the memory holes $MH_L$ on the lower side are displaced from the memory holes $MH_U$ on the upper side, an amount and a direction of the positional displacement are considered to be the similar amounts and directions between the memory hole region $R_{MH}$ and the inspection region $R_E$.

In the manufacturing method according to the embodiment, for example, as described with reference to FIG. 30, the entire upper surface of the amorphous silicon film 120A embedded into the memory hole $MH_L$ on the lower side formed in the inspection region $R_E$ and a part of the insulating layer 101 disposed on the outer peripheral surface of the amorphous silicon film 120A are exposed in the bottom surface of the memory hole $MH_U$ on the upper side formed in the inspection region $R_E$.

When the amorphous silicon films 120A embedded in the memory holes $MH_L$ on the lower side are removed in the state, as illustrated in FIG. 32, the memory holes $MH_U$ on the upper side are connected to the memory holes $MH_L$ on the lower side. When the memory hole $MH_L$ on the lower side is observed from the upper end opening of the memory hole $MH_U$ on the upper side in the state, a state illustrated in FIG. 48 or FIG. 49 can be confirmed.

Here, for example, as illustrated in FIG. 48, as long as the center axis of the memory hole $MH_U$ on the upper side matches the center axis of the memory hole $MH_L$ on the lower side in the inspection region $R_E$, it can be determined that, not only in the inspection region $R_E$, but also the center axis of the memory hole $MH_U$ on the upper side matches the center axis of the memory hole $MH_L$ on the lower side in the memory hole region $R_{MH}$.

On the other hand, for example, as illustrated in FIG. 49, when the center axis of the memory hole $MH_U$ on the upper side is displaced from the center axis of the memory hole $MH_L$ on the lower side in the inspection region $R_E$, it can be determined that the center axis of the memory hole $MH_U$ on the upper side is displaced from the center axis of the memory hole $MH_L$ on the lower side by the displaced amount to the extent similar to that in inspection region $R_E$ also in the memory hole region $R_{MH}$.

Thus, since the displaced amount between the center axis of the memory hole $MH_U$ on the upper side and the center axis of the memory hole $MH_L$ on the lower side in the memory hole region $R_{MH}$ can be confirmed in the middle of the manufacturing process, quality inspection can be performed in the middle of the manufacturing process, and the high-quality semiconductor memory device can be manufactured.

Moreover, the inspection region $R_E$ is formed in the region that has been conventionally a dead space. Therefore, the high-quality product can be manufactured without an increase in area of the memory die MD.

Second Embodiment

Next, the second embodiment will be described. A structure and a manufacturing method of the second embodiment are basically similarly to the structure and the manufacturing method of the first embodiment, and therefore distinctive parts of the second embodiment will be mainly described in the following. In the second embodiment, regarding the drawing illustrating the structure or the manufacturing process same as that of the first embodiment, the drawing used in the first embodiment is quoted.

A memory die according to the second embodiment is basically configured similarly to the memory die MD according to the first embodiment. However, the memory die according to the second embodiment differs from the memory die MD according to the first embodiment in the configuration in an inspection region $R_E'$.

Figure 50:
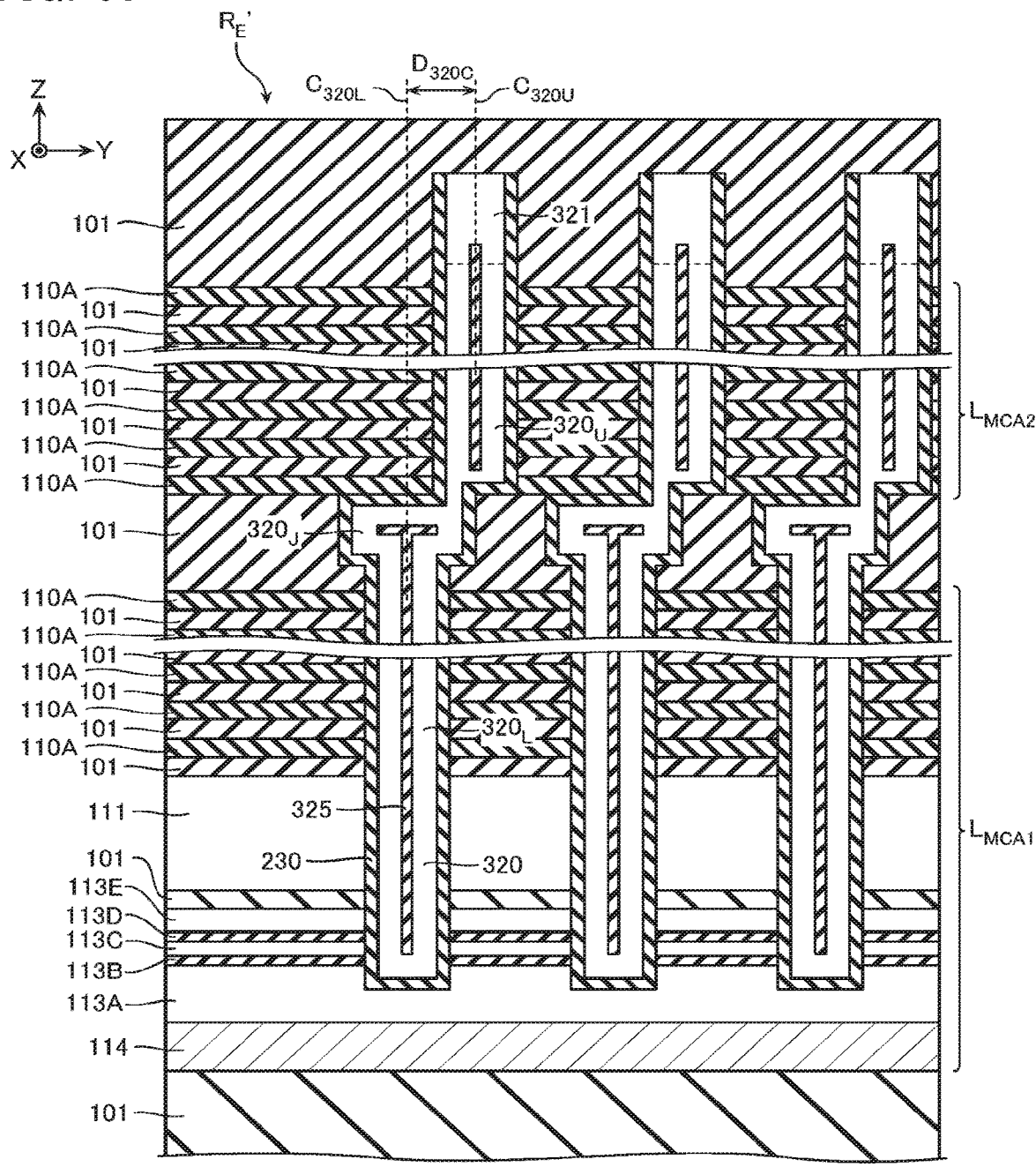
FIG. 50 is a schematic cross-sectional view to describe a configuration in an inspection region $R_E'$ of a memory die according to a second embodiment.

FIG. 50 is a schematic cross-sectional view to describe the configuration in the inspection region $R_E'$ of the memory die according to the second embodiment.

For example, as illustrated in FIG. 50, the inspection region $R_E'$ includes the plurality of insulating layers 110A arranged in the Z direction, a plurality of semiconductor layers 320 extending in the Z direction, and a plurality of respective insulating films 230 disposed between the plurality of insulating layers 110A and the plurality of semiconductor layers 320.

Similarly to the semiconductor layers 220, the semiconductor layers 320 are arranged in the predetermined pattern in the X direction and the Y direction (see FIG. 13). The semiconductor layer 320 is, for example, a semiconductor layer, such as polycrystalline silicon (Si). For example, as illustrated in FIG. 50, the semiconductor layer 320 has a substantially closed-bottomed cylindrical shape and includes an insulating layer 325, such as silicon oxide, in the center part.

The semiconductor layer 320 includes a semiconductor region $320_L$ included in the memory cell array layer $L_{MCA1}$ and a semiconductor region $320_U$ included in the memory cell array layer $L_{MCA2}$. The semiconductor layer 320 includes a semiconductor region $320_J$ disposed between the semiconductor region $320_L$ and the semiconductor region $320_U$, and an impurity region 321 disposed above the semiconductor region $320_U$.

The semiconductor region $320_L$ is a substantially cylindrically-shaped region extending in the Z direction. Outer peripheral surfaces of the semiconductor regions $320_L$ are each surrounded by the plurality of insulating layers 110A, the conducting layer 111, and the semiconductor layers 113A, 113C, 113E included in the memory cell array layer $L_{MCA1}$ and opposed to the plurality of insulating layers 110A, the conducting layer 111, and the semiconductor layers 113A, 113C, 113E. Note that a width in the X direction and a width in the Y direction of the semiconductor region $320_L$ are same extent as the width in the X direction and the width in the Y direction of the semiconductor region $120_L$ of the semiconductor layer 120 described with reference to FIG. 10.

The semiconductor region $320_U$ is a substantially cylindrically-shaped region extending in the Z direction. Outer peripheral surfaces of the semiconductor regions $320_U$ are each surrounded by the plurality of insulating layers 110A included in the memory cell array layer $L_{MCA2}$ and opposed to the plurality of insulating layers 110A. Note that a width in the X direction and a width in the Y direction of the semiconductor region $320_U$ are same extent as the width in the X direction and the width in the Y direction of the semiconductor region $120_U$ of the semiconductor layer 120 described with reference to FIG. 10.

The respective semiconductor regions $320_J$ are disposed above the plurality of insulating layers 110A included in the memory cell array layer $L_{MCA1}$ and disposed below the plurality of insulating layers 110A included in the memory cell array layer $L_{MCA2}$. A width in the X direction and a width in the Y direction of the semiconductor region $320_J$ are same extent as the width in the X direction and the width in the Y direction of the semiconductor region $120_J$ of the semiconductor layer 120 described with reference to FIG. 10.

Note that, different from the semiconductor layers 120 disposed in the memory hole region $R_{MH}$, the semiconductor layers 320 disposed in the inspection region $R_E'$ are not connected to any wiring or the like.

Here, for example, as illustrated in FIG. 10, the center axis of the semiconductor region $120_L$ is denoted as $C_{120L}$, the center axis of the semiconductor region $120_U$ is denoted as $C_{120U}$, and a distance between the center axes $C_{120L}$ and $C_{120U}$ in the X direction or the Y direction is denoted as $D_{120C}$. For example, as illustrated in FIG. 50, the center axis of the semiconductor region $320_L$ is denoted as $C_{320L}$, the center axis of the semiconductor region $320_U$ is denoted as $C_{320U}$, and a distance between the center axes $C_{320L}$, $C_{320U}$ in the X direction or the Y direction is denoted as $D_{320C}$. In such a case, the distance $D_{320C}$ corresponding to the plurality of semiconductor layers 320 disposed in the inspection region $R_E'$ is larger than the distance $D_{120C}$ corresponding to any of the semiconductor layers 120 disposed in the memory hole region $R_{MH}$.

[Manufacturing Method]

Figure 51:
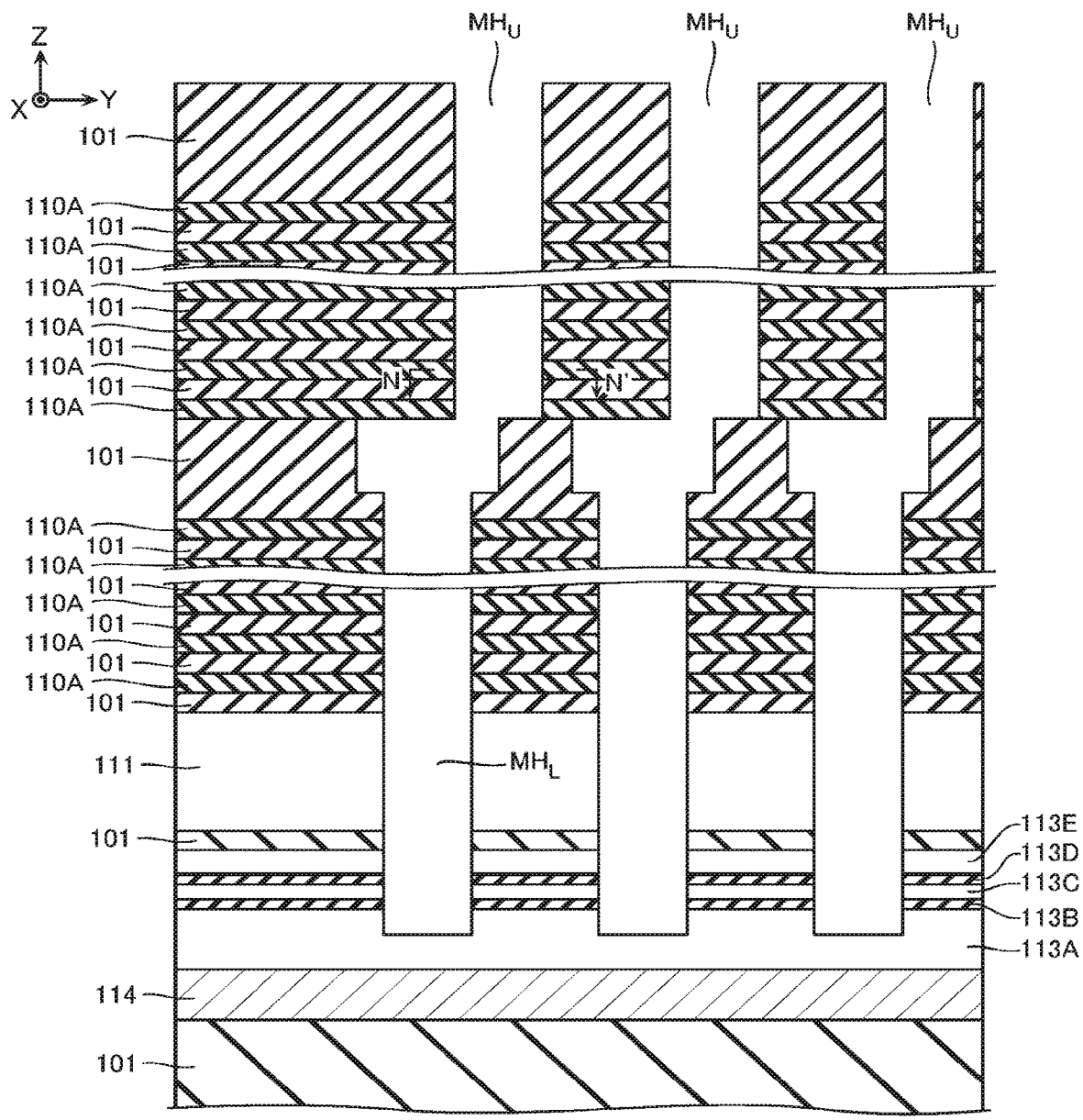
FIG. 51 is a schematic cross-sectional view illustrating a method for manufacturing the memory die MD according to the second embodiment.

Next, with reference to FIG. 51, the method for manufacturing the memory die according to the embodiment will be described. FIG. 51 is a schematic cross-sectional view to describe the manufacturing method and illustrates a cross-sectional surface corresponding to FIG. 50.

The memory die according to the embodiment is manufactured basically similarly to the memory die MD according to the first embodiment. However, in the above-described first embodiment, in the process illustrated in FIG. 29 and FIG. 30, the memory holes $MH_U$ on the upper side are formed such that the center axis positions of the memory holes $MH_L$ on the lower side match the center axis positions of the memory holes $MH_U$ on the upper side included in the memory hole region $R_{MH}$ and the inspection region $R_E$.

In contrast to this, in the second embodiment, in the process illustrated in FIG. 29 and FIG. 30, the memory hole $MH_U$ on the upper side is formed such that the center axis position of the memory hole $MH_L$ on the lower side matches the center axis position of the memory hole $MH_U$ on the upper side in the memory hole region $R_{MH}$. On the other hand, in the inspection region $R_E$, as illustrated in FIG. 51, the memory hole $MH_U$ on the upper side is formed such that the center axis position of the memory hole $MH_U$ on the upper side is displaced from the center axis position of the memory hole $MH_L$ on the lower side by a predetermined distance, and, for example, matches the peripheral edge portion of the memory hole $MH_L$ on the lower side.

Note that, in the first embodiment, the memory hole $MH_U$ on the upper side has the diameter larger than the diameter of the memory hole $MH_L$ on the lower side formed in the inspection region $R_E$. On the other hand, in the second embodiment, the memory hole $MH_U$ on the upper side has the diameter with the same dimensions as that of the memory hole $MH_L$ on the lower side formed in the inspection region $R_E'$.

[Effects of Second Embodiment]

Figure 52:
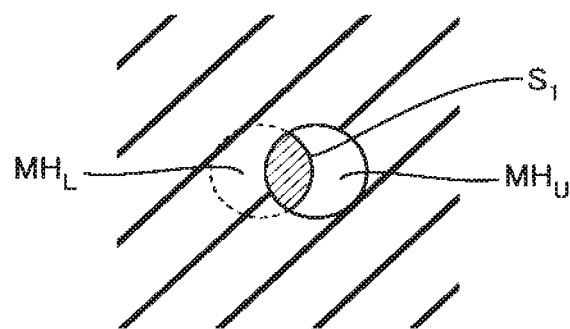
FIG. 52 is a schematic cross-sectional view taking the structure illustrated in FIG. 51 along the line N-N' and viewed along the arrow direction.
Figure 53:
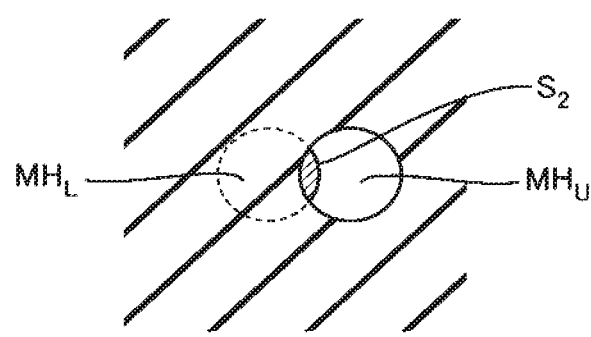
FIG. 53 is a schematic cross-sectional view taking the structure illustrated in FIG. 51 along the line N-N' and viewed along the arrow direction.
Figure 54:
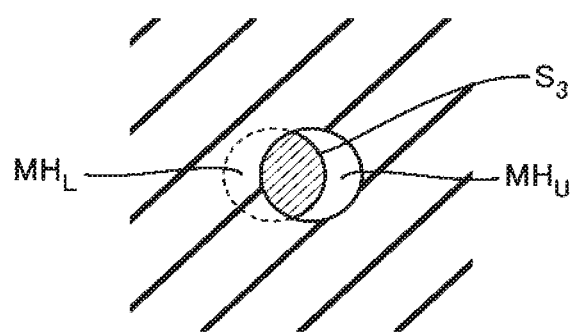
FIG. 54 is a schematic cross-sectional view taking the structure illustrated in FIG. 51 along the line N-N' and viewed along the arrow direction.

FIG. 52 to FIG. 54 are schematic cross-sectional views taking the structure illustrated in FIG. 51 along the line N-N' and viewed along the arrow direction.

In the manufacturing method according to the embodiment, for example, in the state as described with reference to FIG. 51, when the memory hole $MH_L$ on the lower side is observed from the upper end opening of the memory hole $MH_U$ on the upper side, a state illustrated as in FIG. 52 to FIG. 54 can be confirmed.

Here, for example, as illustrated in FIG. 52, when an area of the overlapping part between the memory hole $MH_U$ on the upper side and the memory hole $MH_L$ on the lower side in the inspection region $R_E$ is a predetermined area $S_1$, it can be determined that the center axis of the memory hole $MH_U$ on the upper side matches the center axis of the memory hole $MH_L$ on the lower side in the memory hole region $R_{MH}$.

On the other hand, for example, as illustrated in FIG. 53, when the area of the overlapping part between the memory hole $MH_U$ on the upper side and the memory hole $MH_L$ on the lower side is an area $S_2$ smaller than the predetermined area $S_1$ in the inspection region $R_E$, it can be determined that the center axis of the memory hole $MH_U$ on the upper side is displaced from the center axis of the memory hole $MH_L$ on the lower side in the memory hole region $R_{MH}$.

Similarly, for example, as illustrated in FIG. 54, when the area of the overlapping part between the memory hole $MH_U$ on the upper side and the memory hole $MH_L$ on the lower side is an area $S_3$ larger than the predetermined area $S_1$ in the inspection region $R_E$, it can be determined that the center axis of the memory hole $MH_U$ on the upper side is displaced from the center axis of the memory hole $MH_L$ on the lower side in the memory hole region $R_{MH}$.

Thus, since the displaced amount between the center axis of the memory hole $MH_U$ on the upper side and the center axis of the memory hole $MH_L$ on the lower side in the memory hole region $R_{MH}$ can be confirmed in the middle of the manufacturing process, quality inspection can be performed in the middle of the manufacturing process, and the high-quality semiconductor memory device can be manufactured.

In the above description, the example in which the positional relationship between the memory hole $MH_L$ on the lower side and the memory hole $MH_U$ on the upper side in the inspection region $R_E$ has one pattern has been described. However, the method is merely an example, and the specific configuration is appropriately adjustable.

Figure 55:
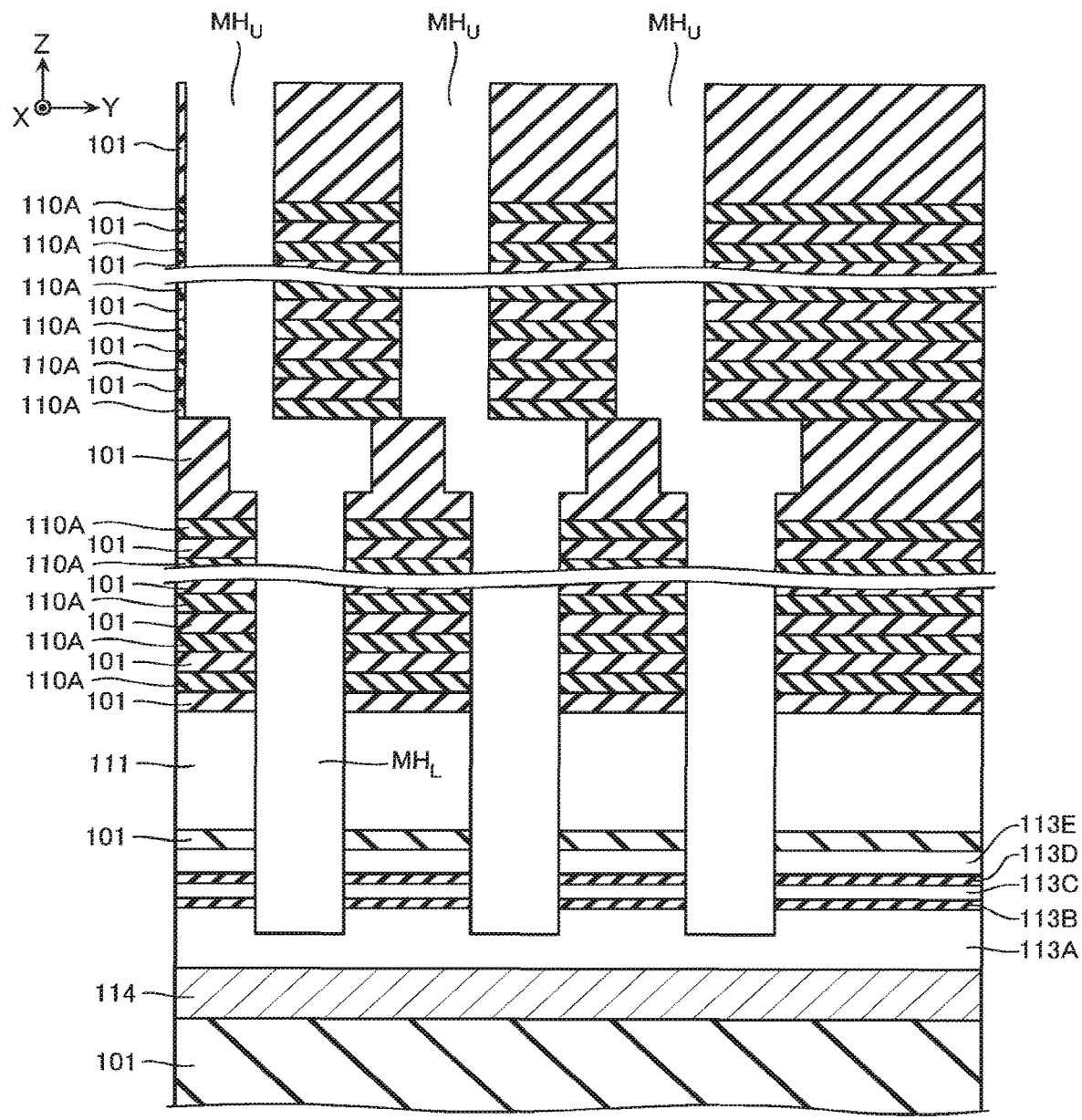
FIG. 55 is a schematic cross-sectional view to describe another configuration example of the second embodiment.
Figure 56:
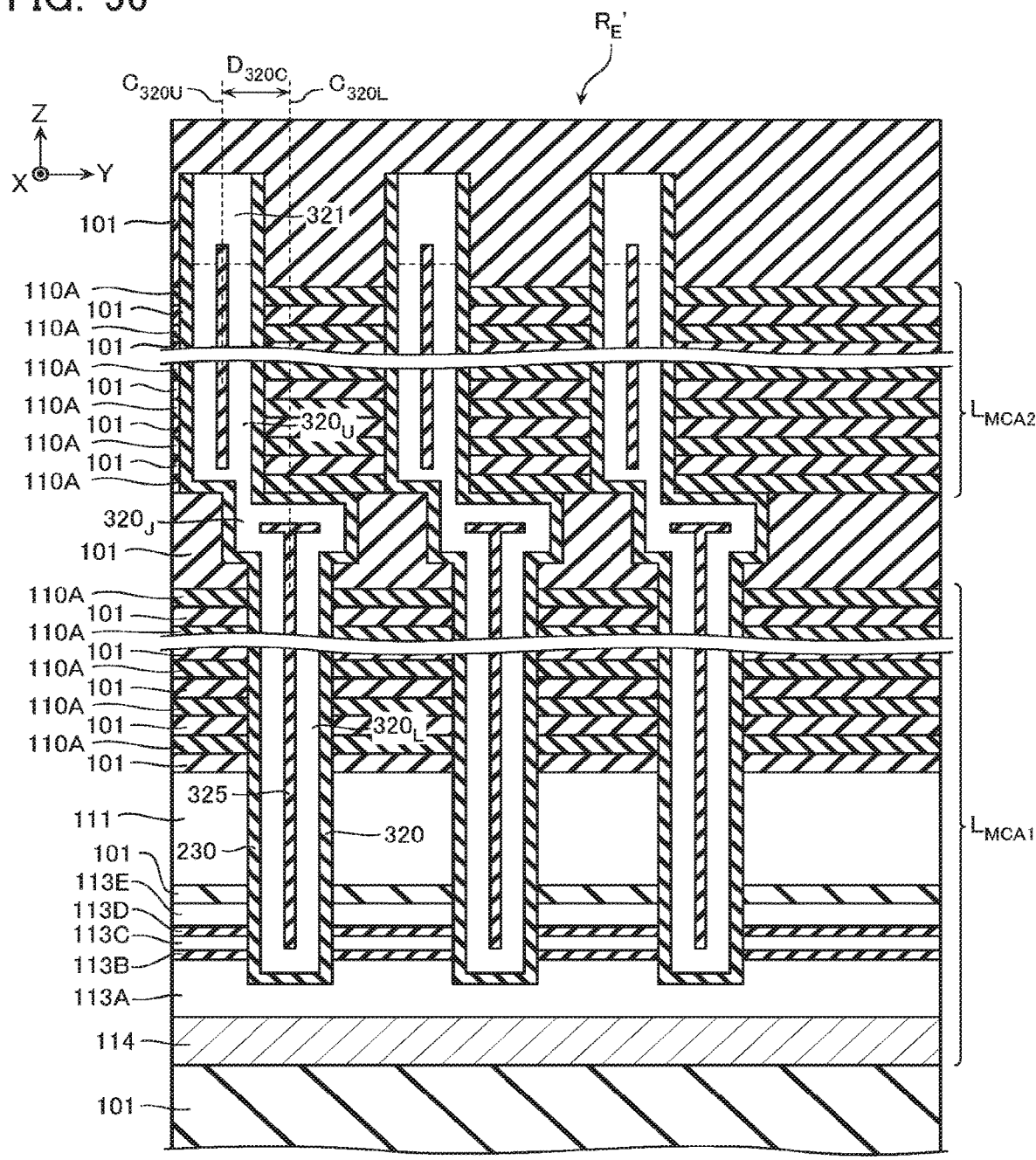
FIG. 56 is a schematic cross-sectional view to describe another configuration example of the second embodiment.

For example, it is possible to, as exemplified in FIG. 51, configure a pattern in which the memory hole $MH_U$ is displaced from the memory hole $MH_L$ to one side (for example, the right direction in FIG. 51) in a predetermined direction (for example, the Y direction) as a first pattern, and as exemplified in FIG. 55, configure a pattern in which the memory hole $MH_U$ is displaced from the memory hole $MH_L$ to the other side (for example, the left direction in FIG. 55) in the predetermined direction (for example, the Y direction) as a second pattern. In such a case, in addition to the configuration in which the semiconductor region $320_U$ is displaced from the semiconductor region $320_L$ to the one side in the predetermined direction as exemplified in FIG. 50, the memory die according to the second embodiment has the configuration in which the semiconductor region $320_U$ is displaced from the semiconductor region $320_L$ to the other side in the predetermined direction as exemplified in FIG. 56.

For example, in addition to the two patterns described with reference to FIG. 51 and FIG. 55, it is possible to provide a third pattern in which the memory hole $MH_U$ is displaced to one side in a direction (for example, the X direction) intersecting with the memory hole $MH_L$ in the predetermined direction and a fourth pattern in which the memory hole $MH_U$ is displaced to the other side in this direction. In such a case, in addition to the configurations exemplified in FIG. 50 and FIG. 56, the memory die according to the second embodiment has the configurations corresponding to the third and fourth patterns.

Third Embodiment

Next, the third embodiment will be described. A structure and a manufacturing method of the third embodiment are basically similarly to the structure and the manufacturing method of the first embodiment, and therefore distinctive parts of the third embodiment will be mainly described in the following. In the third embodiment, regarding the drawing illustrating the structure or the manufacturing process same as that of the first embodiment, the drawing used in the first embodiment is quoted.

A memory die according to the third embodiment is basically configured similarly to the memory die MD according to the first embodiment. However, the memory die according to the third embodiment differs from the memory die MD according to the first embodiment in a configuration in an inspection region $R_E''$.

Figure 57:
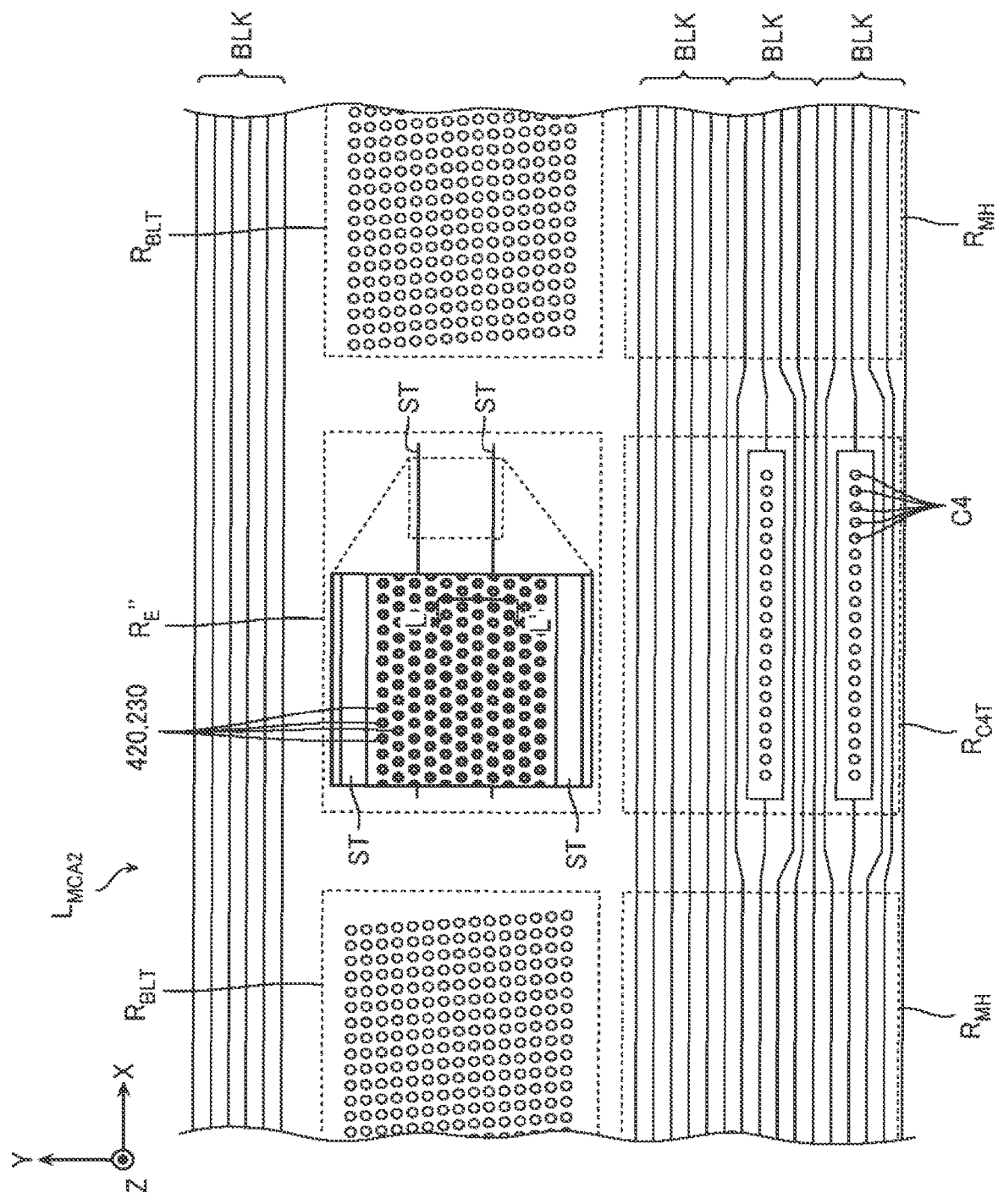
FIG. 57 is a schematic cross-sectional view to describe a configuration in an inspection region $R_E''$ of a memory die according to a third embodiment.
Figure 58:
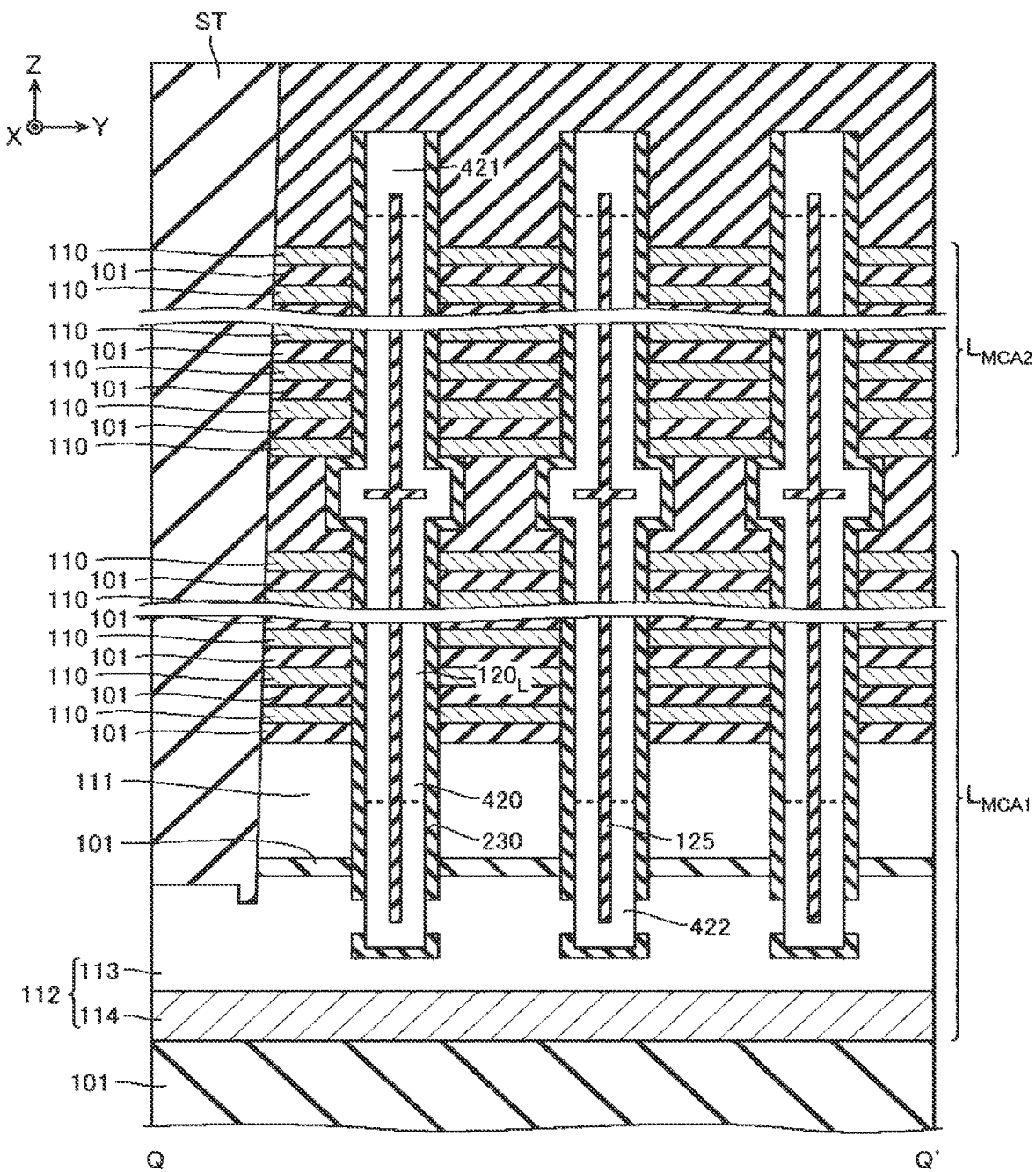
FIG. 58 is a schematic cross-sectional view taking the structure illustrated in FIG. 57 along the line L-L' and viewed along the arrow direction.
Figure 59:
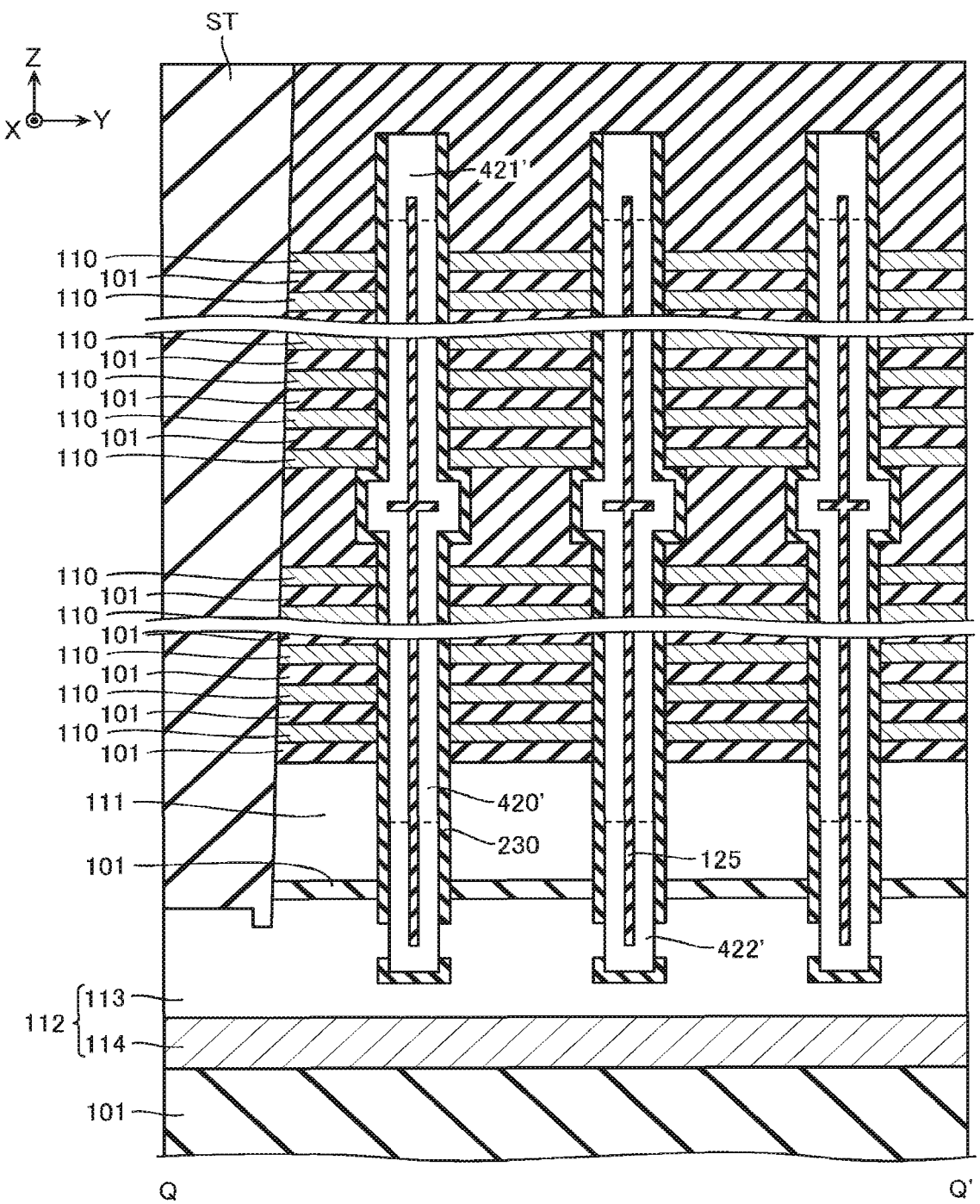
FIG. 59 is a schematic cross-sectional view taking the structure illustrated in FIG. 57 along the line L-L' and viewed along the arrow direction.
Figure 60:
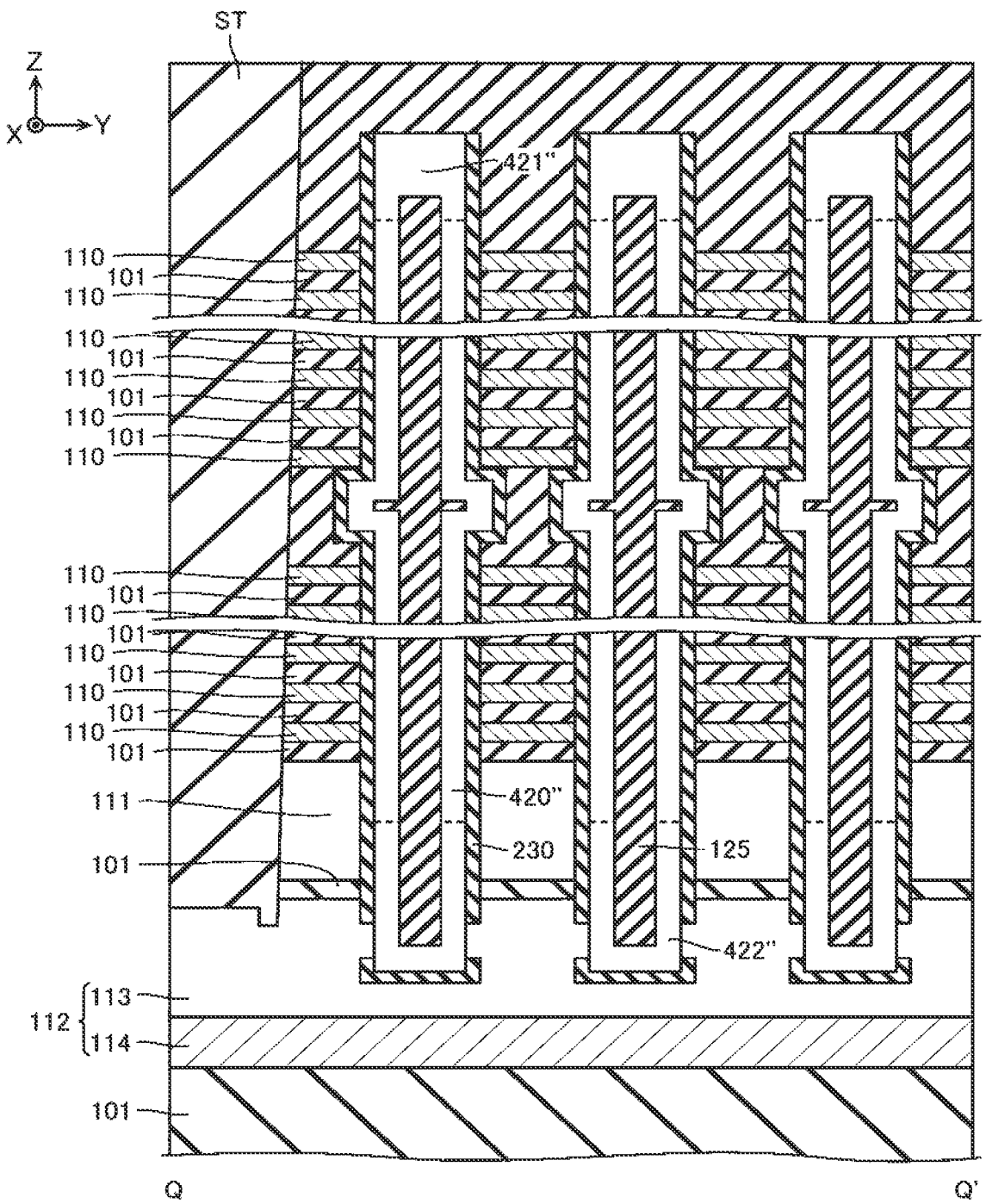
FIG. 60 is a schematic cross-sectional view taking the structure illustrated in FIG. 57 along the line L-L' and viewed along the arrow direction.

FIG. 57 is a schematic cross-sectional view to describe a configuration in the inspection region $R_E''$ of the memory die according to the third embodiment. FIG. 58 to FIG. 60 are schematic cross-sectional view taking the structure illustrated in FIG. 57 along the line L-L' and viewed along the arrow direction. Note that FIG. 58 to FIG. 60 may be a configuration in the same inspection region $R_E''$ or may be a configuration in another inspection region $R_E''$.

As illustrated in FIG. 57, the inspection region $R_E''$ according to the third embodiment includes the inter-block insulating layers ST arranged in the Y direction and extending in the X direction. For example, as illustrated in FIG. 57 and FIG. 58, between the inter-block insulating layers ST, the plurality of conducting layers 110 arranged in the Z direction, a plurality of semiconductor layers 420 extending in the Z direction, and the plurality of respective insulating films 230 disposed between the plurality of conducting layers 110 and the plurality of semiconductor layers 420 are disposed.

For example, as illustrated in FIG. 57, the semiconductor layers 420 are arranged in the X direction and in the Y direction in the predetermined pattern similarly to the semiconductor layers 120. The semiconductor layer 420 is basically configured similarly to the semiconductor layer 120 described with reference to FIG. 10 and the like. However, different from the semiconductor layers 120, the semiconductor layers 420 are not connected to any wiring or the like.

For example, as illustrated in FIG. 59, instead of the semiconductor layers 420, semiconductor layers 420' are disposed in the parts different from the parts exemplified in FIG. 58. The semiconductor layer 420' is basically configured similarly to the semiconductor layer 420. Note that widths in the X direction and widths in the Y direction of the plurality of semiconductor layers 420' are smaller than widths in the X direction and widths in the Y direction of the semiconductor layers 420.

For example, as illustrated in FIG. 60, instead of the semiconductor layers 420, semiconductor layers 420'' are disposed in parts different from the parts exemplified in FIG. 58 and FIG. 59. The semiconductor layer 420'' is basically configured similarly to the semiconductor layer 420. However, widths in the X direction and widths in the Y direction of the plurality of semiconductor layers 420'' are larger than the width in the X direction and the width in the Y direction of any of the semiconductor layers 420.

[Manufacturing Method]

The memory die according to the embodiment is manufactured basically similarly to the memory die MD according to the first embodiment. However, in the third embodiment, the comparatively large memory holes $MH_L$, $MH_U$ are formed in predetermined parts in the inspection region $R_E$ in the process described with reference to FIG. 22 and the process described with reference to FIG. 29 and FIG. 30. Additionally, the memory holes $MH_L$, $MH_U$ smaller than the above-described memory holes $MH_L$, $MH_U$ are formed in the other parts in the inspection region $R_E$. Additionally, the memory holes $MH_L$, $MH_U$ further smaller than the above-described memory holes $MH_L$, $MH_U$ are formed in the other parts in the inspection region $R_E$.

Note that, in the first embodiment, the diameter of the memory hole $MH_U$ on the upper side is larger than the diameter of the memory hole $MH_L$ on the lower side formed in the inspection region $R_E$. On the other hand, in the third embodiment, the memory hole $MH_U$ on the upper side has the diameter with the dimensions same as those of the memory hole $MH_L$ on the lower side formed in the inspection region $R_E$.

[Effects of Third Embodiment]

As in this embodiment, the plurality of memory holes $MH_L$, $MH_U$ having the different diameters are formed in the process described with reference to FIG. 22 and the process described with reference to FIG. 29 and FIG. 30, the appropriate radius dimensions of the memory holes $MH_L$, $MH_U$ can be inspected.

Figure 61:
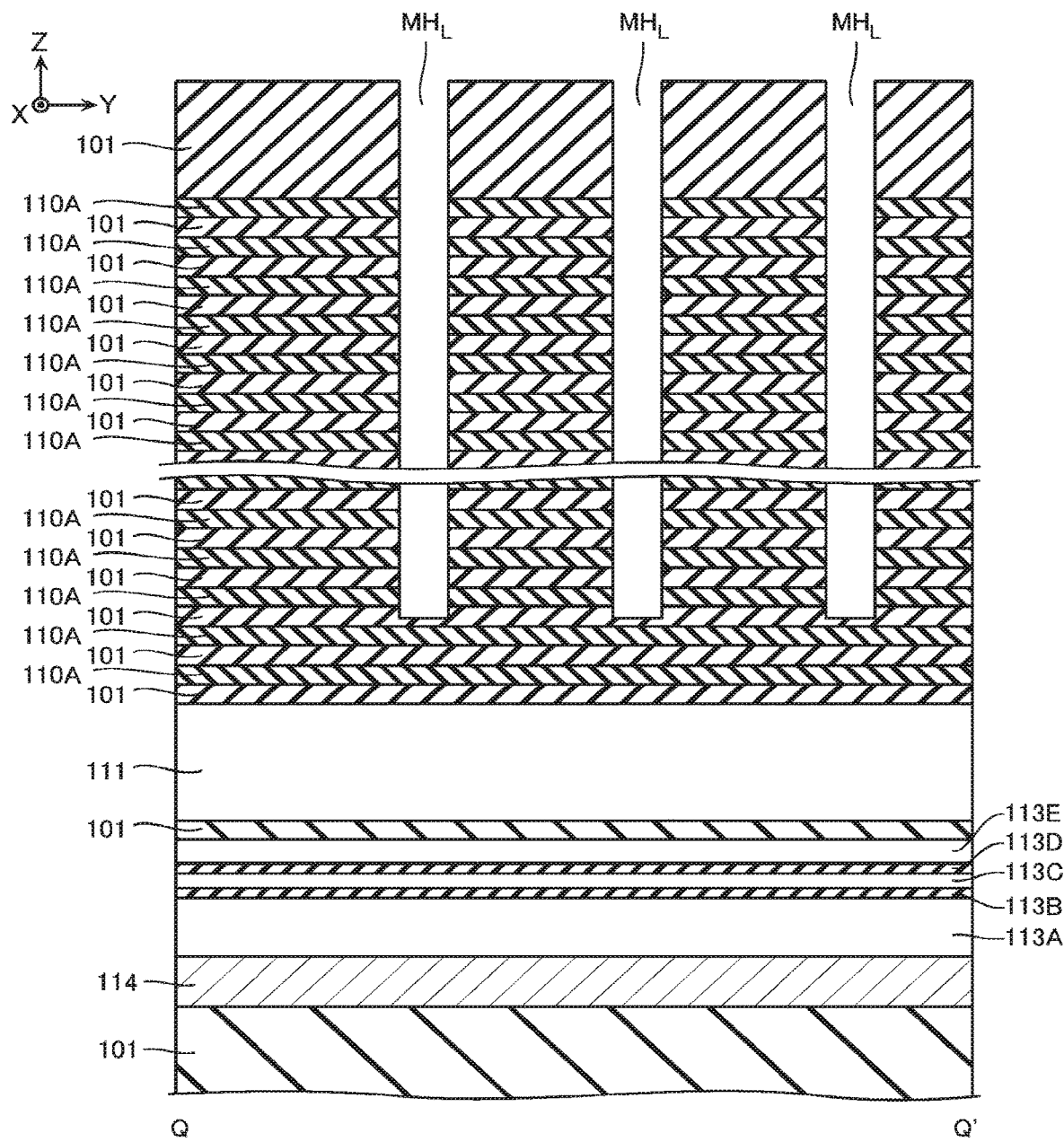
FIG. 61 is a schematic cross-sectional view to describe the third embodiment.

For example, in the case where the radius dimensions of the memory holes $MH_L$, $MH_U$ are too small, there may be a case where the memory holes $MH_L$, $MH_U$ cannot be dug up to the intended depths as exemplified in FIG. 61 in the process described with reference to FIG. 22 and the process described with reference to FIG. 29 and FIG. 30. In such a case, for example, there may be a case where the memory hole $MH_L$ on the lower side does not reach the semiconductor layer 113A. Additionally, there may be a case where the upper end of the memory hole $MH_L$ on the lower side is not joined to the lower end of the memory hole $MH_U$ on the upper side.

Figure 62:
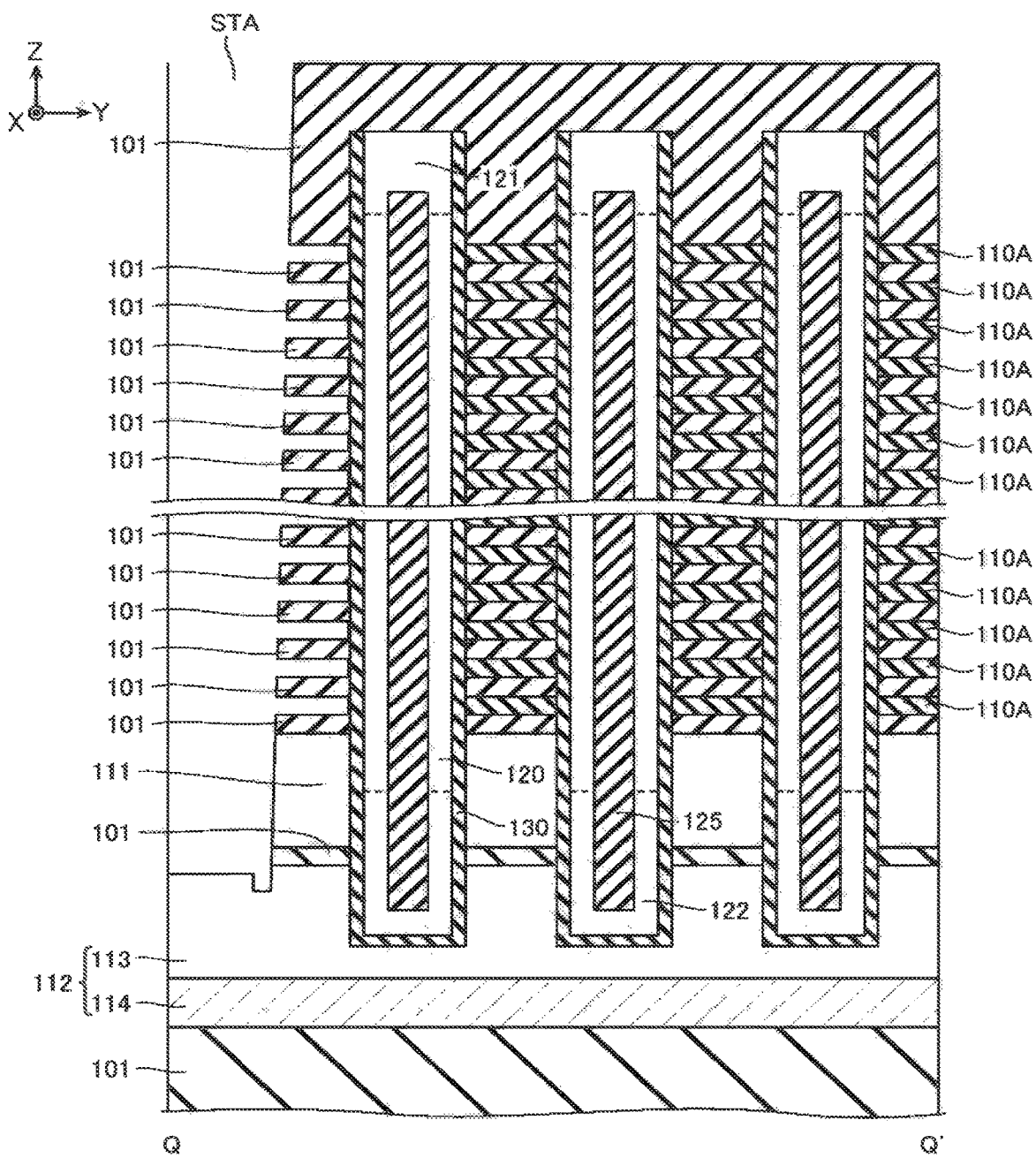
FIG. 62 is a schematic cross-sectional view to describe the third embodiment.

For example, in a case where the radius dimensions of the memory holes $MH_L$, $MH_U$ are too large, the distance between the memory holes $MH_L$, $MH_U$ decreases. Here, in the case where the distance between the memory holes $MH_L$, $MH_U$ is too small, there may be a case where the insulating layers 110A cannot be preferably removed as exemplified n FIG. 62 in the process described with reference to FIG. 43. Additionally, there may be a case where the conducting layers 110 cannot be preferably formed in the process described with reference to FIG. 46.

Therefore, in this embodiment, the plurality of memory holes $MH_L$, $MH_U$ having different diameters are formed on one wafer. By this method, the diameters of the memory holes $MH_L$, $MH_U$ can be appropriately determined by referring to the plurality of memory holes $MH_L$, $MH_U$ having the different diameters. Accordingly, the high-quality semiconductor memory device can be manufactured.

Note that, as described above, the arrangement of the configuration described with reference to FIG. 58 to FIG. 60 is appropriately adjustable. For example, four patterns of diameters may be set corresponding to the four memory cell arrays MCA described with reference to FIG. 6, and the sizes of the diameters of memory holes MH may be uniformed in the inspection region $R_E$ corresponding to each memory cell array MCA. For example, a plurality of patterns of diameters may be set corresponding to the plurality of inspection regions $R_E$ described with reference to FIG. 6, and the sizes of the diameters of the memory holes MH may be uniformed in each inspection region $R_E$. For example, the plurality of memory holes MH having different sizes may be disposed in each inspection region $R_E$.

Fourth Embodiment

Next, the fourth embodiment will be described. A structure and a manufacturing method of the fourth embodiment are basically similarly to the structure and the manufacturing method of the first embodiment, and therefore distinctive parts of the fourth embodiment will be mainly described in the following. In the fourth embodiment, regarding the drawing illustrating the structure or the manufacturing process same as that of the first embodiment, the drawing used in the first embodiment is quoted.

Figure 63:
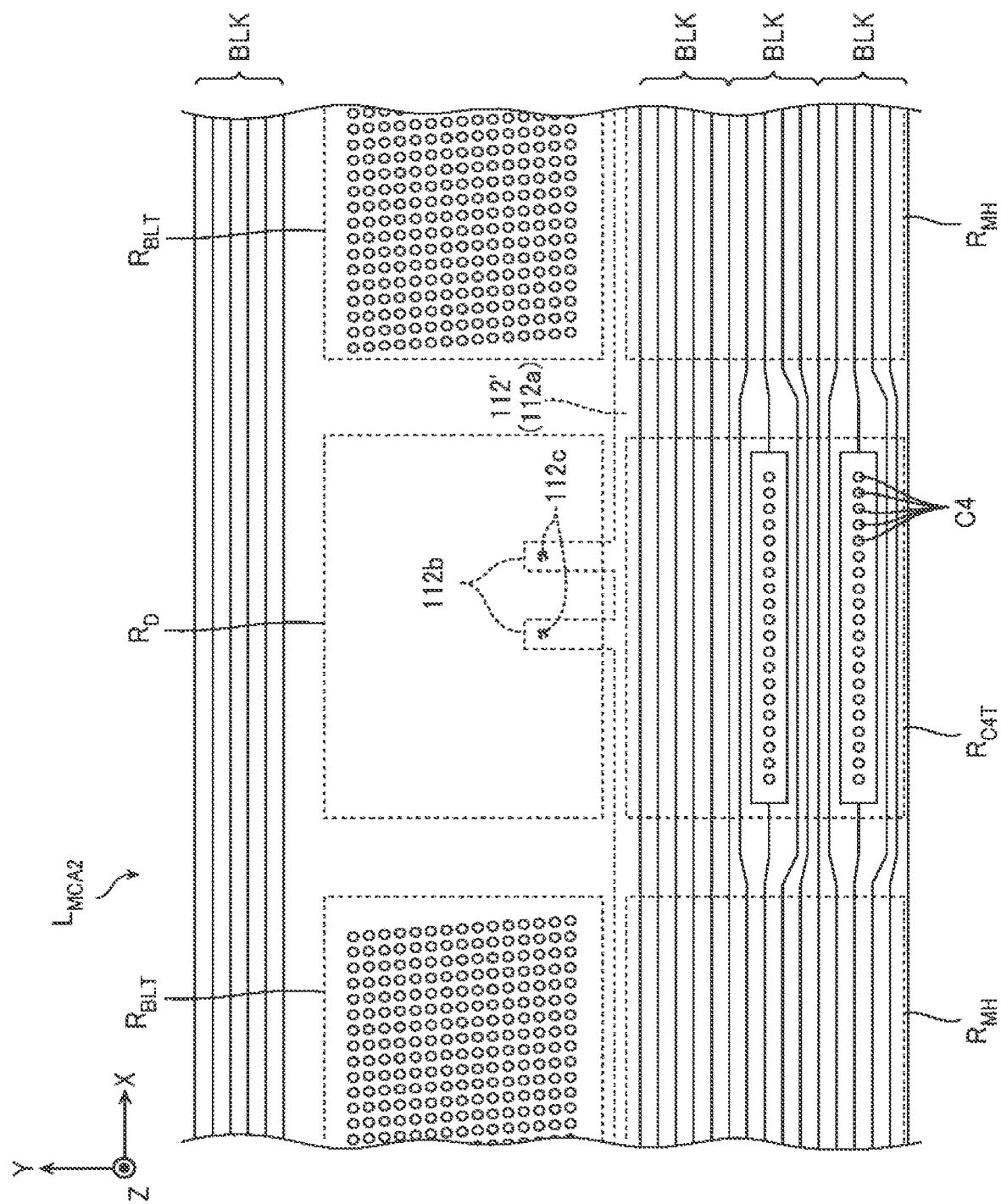
FIG. 63 is a schematic plan view to describe a configuration in a discharge region $R_D$ of a memory die according to a fourth embodiment.

A memory die according to the fourth embodiment is basically configured similarly to the memory die MD according to the first embodiment. However, the memory die MD according to the first embodiment, as described with reference to FIG. 13 and the like, includes the inspection region $R_E$ between the plurality of contact connection regions $R_{BLT}$ arranged with the interval in the X direction. On the other hand, the memory die according to the fourth embodiment, as illustrated in FIG. 63, includes a discharge region $R_D$ between the plurality of contact connection regions $R_{BLT}$ arranged with an interval in the X direction. The discharge region $R_D$ is adjacent to the contact connection region $R_{BLT}$ in the X direction and adjacent to the contact connection region $R_{C4T}$ in the Y direction.

For example, as illustrated in FIG. 63 to FIG. 66, the memory die according to the embodiment includes a conducting layer 112', instead of the conducting layer 112 described with reference to FIG. 10 and the like. The conducting layer 112' is basically configured similarly to the conducting layer 112 according to the first embodiment. However, for example, as illustrated in FIG. 63, the conducting layer 112' includes a wiring portion 112a that extends in the X direction over the plurality of memory hole regions $R_{MH}$ and the plurality of contact connection regions $R_{C4T}$ arranged in the X direction, and connection terminal portions 112b that extend from the contact connection region $R_{C4T}$ to the discharge region $R_D$.

Figure 64:
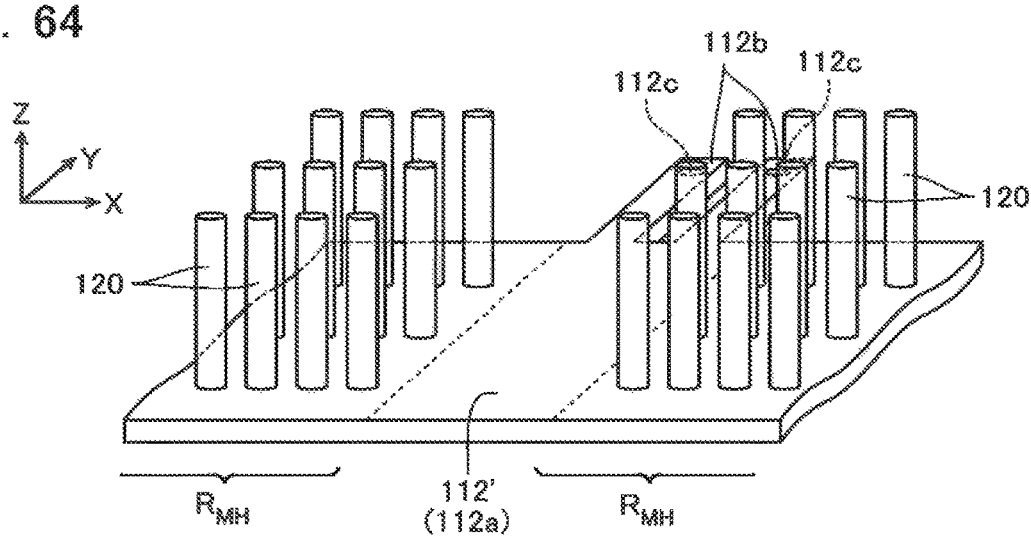
FIG. 64 is a schematic perspective view to describe a configuration of a part of the memory die.

The wiring portion 112a is configured similarly to the conducting layer 112 described with reference to FIG. 10 and the like. That is, for example, as illustrated in FIG. 64, the wiring portion 112a is connected to the lower ends of the plurality of semiconductor layers 120 in the memory hole regions $R_{MH}$.

Figure 65:
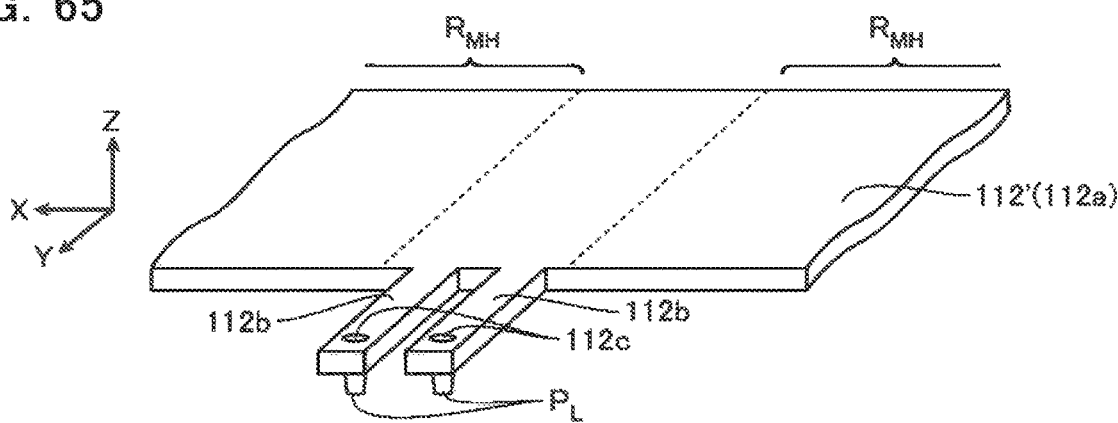
FIG. 65 is a schematic perspective view to describe a configuration of a part of the memory die.
Figure 66:
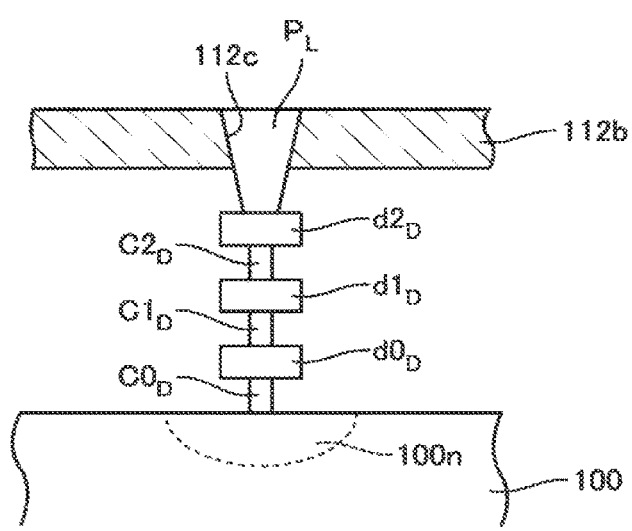
FIG. 66 is a schematic cross-sectional view to describe a configuration of a part of the memory die.

The connection terminal portions 112b each have a through-hole 112c. For example, as illustrated in FIG. 65 and FIG. 66, the through-hole 112c has an inner circumferential surface in contact with an outer peripheral surface of a conductive plug $P_L$ extending in the Z direction. For example, the plug $P_L$ may include a laminated film of a barrier conducting film, such as titanium nitride (TiN), and a metal film, such as tungsten (W), or the like. The plug $P_L$ is electrically connected to the connection terminal portion 112b. As illustrated in FIG. 66, the plug $P_L$ has a lower end in contact with a wiring $d2_D$ of the wiring layer D2. The wiring $d2_D$ of the wiring layer D2 is connected to a wiring $d1_D$ of the wiring layer D1 via a contact $C2_D$, the wiring $d1_D$ of the wiring layer D1 is connected to a wiring $d0_D$ of the wiring layer D0 via a contact $C1_D$, and a wiring $d0_D$ of the wiring layer D0 is connected to the semiconductor substrate 100 via a contact $C0_D$.

As described with reference to FIG. 7, the semiconductor substrate 100 is made of P type silicon (Si) containing P type impurities, such as boron (B). On the surface of the semiconductor substrate 100, the semiconductor substrate region 100S and the P type well region 100P containing the P type impurities, such as boron (B), are disposed. In these regions, impurity concentration of the P type impurities is larger than impurity concentration of the N type impurities. In the example of FIG. 66, an impurity region 100n is disposed in the region, and the contact $C0_D$ is in contact with the impurity region 100n. Impurity concentration of the N type impurities, such as phosphorus (P), is larger than impurity concentration of the P type impurities, such as boron (B), in the impurity region 100n. Note that, on the upper surface of the semiconductor substrate 100, instead of the impurity region 100n containing the N type impurities, such as phosphorus (P), an impurity region containing P type impurities, such as boron (B), may be disposed. The impurity region containing the P type impurities may be disposed in, for example, the N type well region 100N in the semiconductor substrate 100.

Thus, by the path: the connection terminal portion 112b→plug $P_L$→wiring $d2_D$→contact $C2_D$→wiring $d1_D$→contact $C1_D$→wiring $d0_D$→contact $C0_D$, a discharge circuit from the conducting layer 112 to the semiconductor substrate 100 is formed in the discharge region $R_D$.

[Effects of Fourth Embodiment]

To manufacture the semiconductor memory device according to the embodiment, for example, the memory holes $MH_L$ are formed in the process described with reference to FIG. 22. For example, in the process described with reference to FIG. 29, the memory holes $MH_U$ are formed.

Here, for example, when the method, such as RIE, is employed to form the memory holes $MH_L$, $MH_U$, a large amount of ions and the like from the RIE are deposited on, for example, the inner circumferential surfaces of the memory holes $MH_L$, $MH_U$, and the electric charge is possibly accumulated. When the amount of electric charge becomes a predetermined magnitude or more, arcing occurs, and this possibly results in dielectric breakdown, damage of the wafer, and the like.

Therefore, in the fourth embodiment, the discharge circuit flows the electric charge to the semiconductor substrate 100 side for diselectrification, and thus arcing is reduced. Moreover, since the discharge circuit is formed in the discharge region $R_D$, which has been conventionally a dead space, measures against arcing can be taken without an increase in area of the memory die MD, and the high-quality product can be manufactured.

The impurity region 100n in the semiconductor substrate 100 may be formed, for example, in the process of forming the source region and the drain region of the transistor Tr (FIG. 7). Additionally, the wiring $d2_D$, the contact $C2_D$, the wiring $d1_D$, the contact $C1_D$, the wiring $d0_D$, and the contact $C0_D$ serving as a part of the discharge circuit may be formed in the process of forming the wiring layers D0, D1, D2. The plug $P_L$ may be formed, for example, after forming the conducting layer 112' and before forming the conducting layer 111.

Other Embodiments

The semiconductor memory devices according to the first embodiment to the fourth embodiment have been described above. However, the semiconductor memory devices according to these embodiments are merely examples, and the specific configuration, the operation, and the like are appropriately adjustable. For example, the memory die may include two or more regions among the inspection region $R_E$ according to the first embodiment, the inspection region $R_E'$ according to the second embodiment, the inspection region $R_E''$ according to the third embodiment, and the discharge region $R_D$ according to the fourth embodiment. For example, the configuration described with reference to FIG. 7 may include the configurations included in the inspection region $R_E$ according to the first embodiment, the inspection region $R_E'$ according to the second embodiment, or the inspection region $R_E''$ according to the third embodiment upward of the conducting layer 112 (conducting layer 112') and may further include the discharge region $R_D$ according to the fourth embodiment downward of these configurations.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor substrate;
a memory cell array disposed separately from the semiconductor substrate in a first direction intersecting with a surface of the semiconductor substrate;
first and second wirings disposed in the first direction of the memory cell array, the first and second wirings having a distance from the semiconductor substrate larger than a distance of the memory cell array from the semiconductor substrate; and
a fifth wiring disposed separately from the memory cell array in the first direction, the fifth wiring having a distance from the semiconductor substrate smaller than a distance of the memory cell array from the semiconductor substrate, wherein
the semiconductor substrate includes a first region to a third region arranged in order in a second direction intersecting with the first direction and a fourth region to a sixth region arranged in order in the second direction, wherein
in a third direction intersecting with the first direction and the second direction:
the fourth region is adjacent to the first region;
the fifth region is adjacent to the second region; and
the sixth region is adjacent to the third region; wherein
the memory cell array includes:
a plurality of first conducting layers extending in the second direction over the first region, the second region, and the third region, the plurality of first conducting layers being laminated in the first direction together with a plurality of first insulating layers in alternation;
a plurality of second insulating layers extending in the second direction over the fourth region, the fifth region, and the sixth region, the plurality of second insulating layers being laminated in the first direction together with the plurality of first insulating layers in alternation;
a first semiconductor layer disposed over the first region, the first semiconductor layer extending in the first direction and being opposed to the plurality of first conducting layers;
a second semiconductor layer disposed over the third region, the second semiconductor layer extending in the first direction and being opposed to the plurality of first conducting layers;
a first contact disposed above the fourth region, the first contact extending in the first direction and being opposed to the plurality of second insulating layers;
a second contact disposed above the sixth region, the second contact extending in the first direction and being opposed to the plurality of second insulating layers; and
a second conducting layer disposed between the plurality of first conducting layers and the semiconductor substrate, the second conducting layer including a first part and a second part, wherein
the first part of the second conducting layer extends in the second direction over the first region, the second region, and the third region, and the first part is connected to the first semiconductor layer above the first region and connected to the second semiconductor layer above the third region,
the second part of the second conducting layer extends over parts of the second region and the fifth region,
the first wiring extends in the third direction over parts of the first region and the fourth region, and the first wiring is electrically connected to the first semiconductor layer and connected to the first contact,
the second wiring extends in the third direction over parts of the third region and the sixth region, and the second wiring is electrically connected to the second semiconductor layer and connected to the second contact, and
the fifth wiring electrically connects the second part of the second conducting layer to the semiconductor substrate.

2. The semiconductor memory device according to claim 1, further comprising:
an eleventh contact that connects the fifth wiring to the semiconductor substrate.

3. The semiconductor memory device according to claim 2, wherein,
the semiconductor substrate, doped with impurities of a first conductivity type, includes a tenth region containing impurities of a second conductivity type and connected to the eleventh contact.

* * * * *